United States Patent
Nakagawa et al.

(10) Patent No.: US 12,273,641 B2
(45) Date of Patent: Apr. 8, 2025

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventors: Daisuke Nakagawa, Kanagawa (JP); Takashi Moue, Kanagawa (JP); Yoshio Awatani, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 64 days.

(21) Appl. No.: 18/040,859

(22) PCT Filed: Jun. 25, 2021

(86) PCT No.: PCT/JP2021/024083
§ 371 (c)(1),
(2) Date: Feb. 7, 2023

(87) PCT Pub. No.: WO2022/038895
PCT Pub. Date: Feb. 24, 2022

(65) Prior Publication Data
US 2023/0300485 A1    Sep. 21, 2023

(30) Foreign Application Priority Data

Aug. 19, 2020 (JP) .................. 2020-138540
Apr. 26, 2021 (JP) .................. 2021-073876

(51) Int. Cl.
*H04N 25/709* (2023.01)
*H01L 27/146* (2006.01)

(52) U.S. Cl.
CPC ..... *H04N 25/709* (2023.01); *H01L 27/14634* (2013.01)

(58) Field of Classification Search
CPC ...... H04N 25/709; H04N 25/76; H04N 25/78; H04N 25/77; H01L 27/14634
See application file for complete search history.

(56) References Cited

U.S. PATENT DOCUMENTS

| 10,205,903 B2 * | 2/2019 | Koifman ............... H04N 25/78 |
| 2017/0118430 A1 * | 4/2017 | Koifman ............... H04N 25/78 |
| 2018/0103222 A1 | 4/2018 | Yan | |

FOREIGN PATENT DOCUMENTS

| JP | 2005-311487 A | 11/2005 |
| JP | 2010-187317 A | 8/2010 |

OTHER PUBLICATIONS

International Search Report and Written Opinion of PCT Application No. PCT/JP2021/024083, issued on Sep. 14, 2021, 09 pages of ISRWO.

* cited by examiner

*Primary Examiner* — Nicholas G Giles
(74) *Attorney, Agent, or Firm* — CHIP LAW GROUP

(57) ABSTRACT

In a solid-state imaging element provided with a comparator for each column, responsiveness of the comparator is improved.

An input transistor outputs, from a drain, a potential within a range from one side to the other side of a pair of output potentials on the basis of whether or not an input potential input to a source and a predetermined reference potential input to a gate substantially coincide with each other. A first current source supplies a constant current. A capacitor is inserted between the source of the input transistor and a first current source. A cutoff switch disconnects a drain of the input transistor from a connection node within a predetermined period for initializing the connection node between the capacitor and the first current source to a lower one of the pair of output potentials, and connects the connection node with the drain of the input transistor outside the predetermined period.

16 Claims, 46 Drawing Sheets

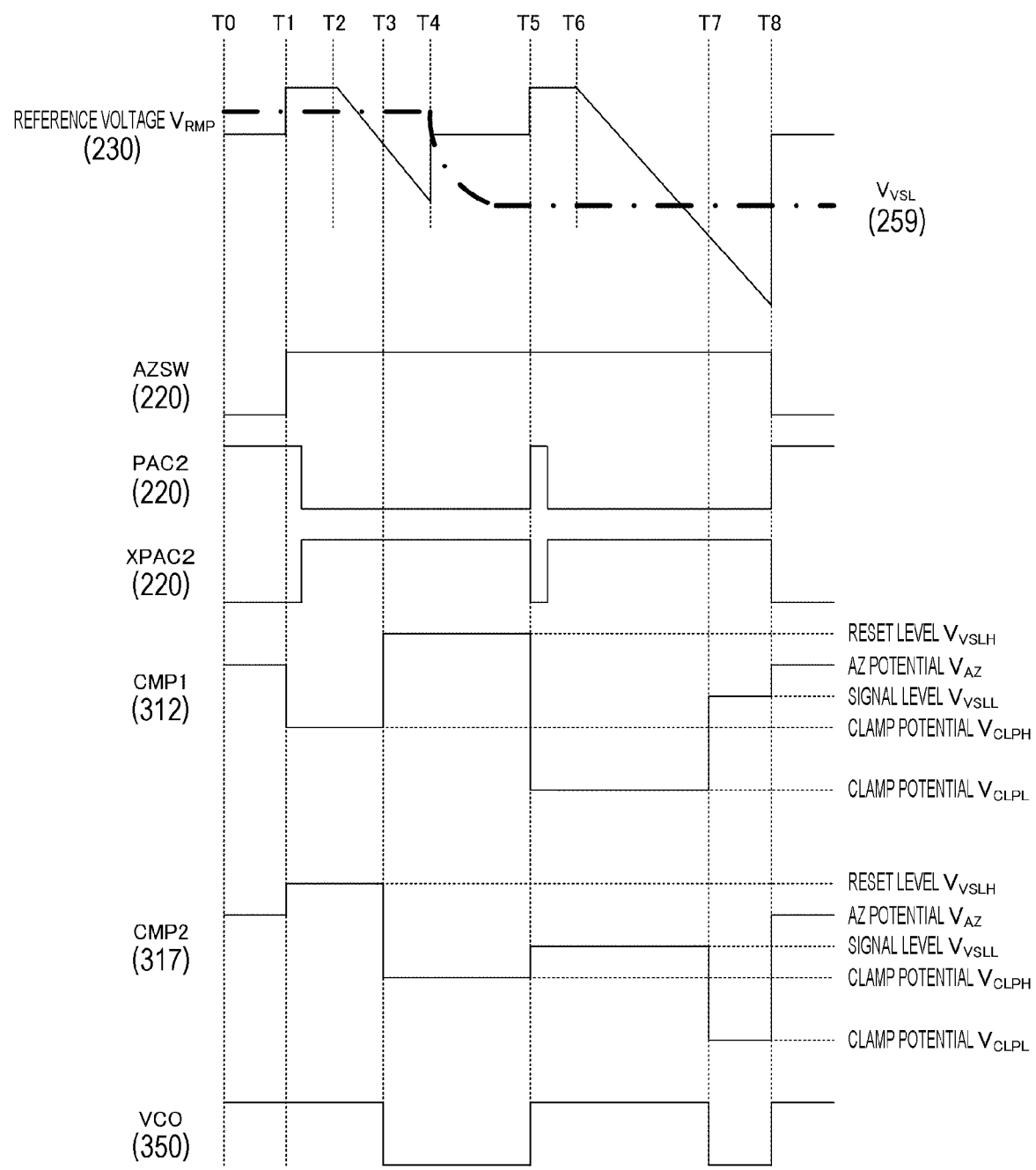

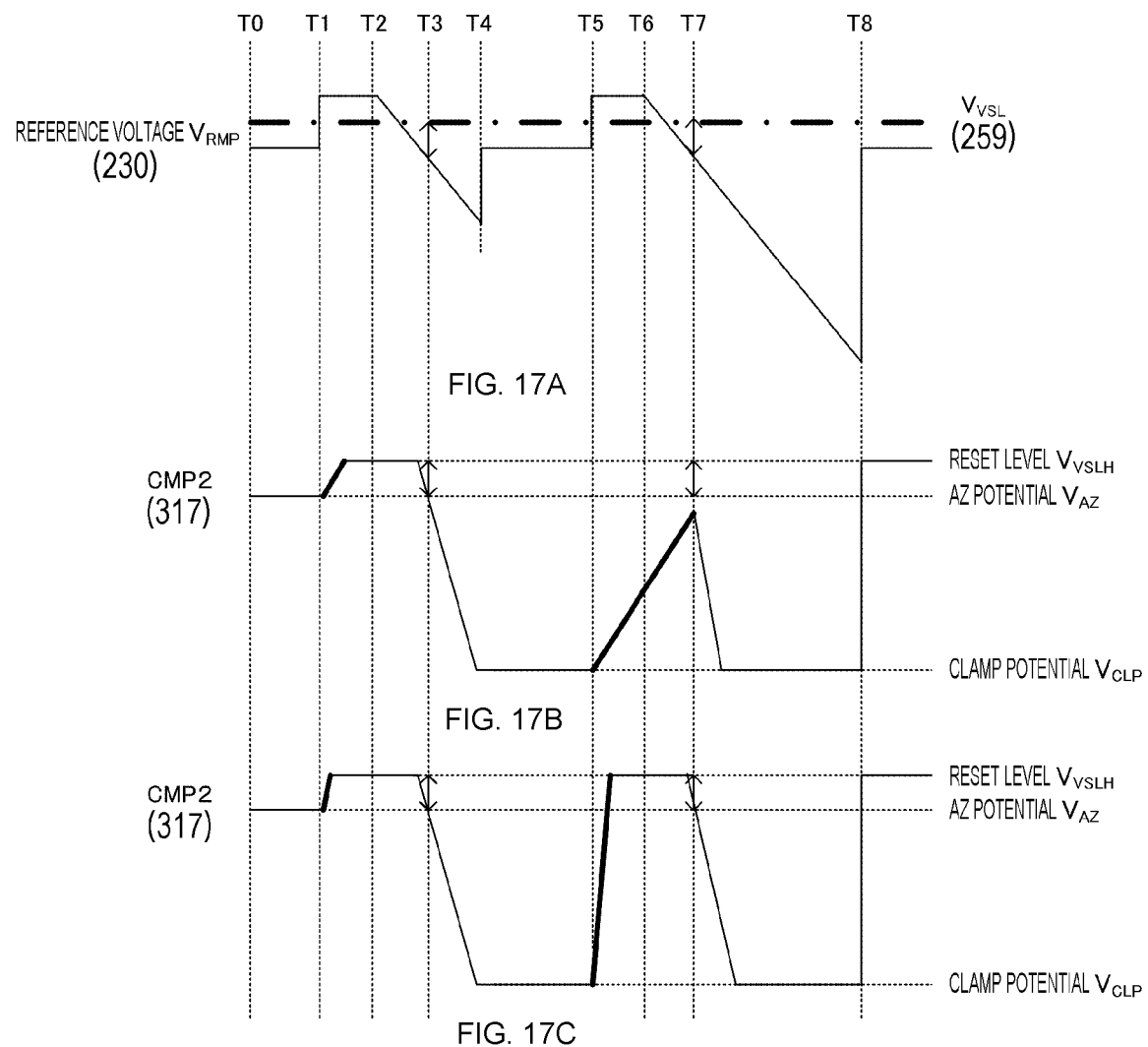

SOLID-STATE IMAGING ELEMENT AND IMAGING DEVICE

CROSS REFERENCE TO RELATED APPLICATIONS

This application is a U.S. National Phase of International Patent Application No. PCT/JP2021/024083 filed on Jun. 25, 2021, which claims priority benefit of Japanese Patent Application No. JP 2020-138540 filed in the Japan Patent Office on Aug. 19, 2020, which claims priority benefit of Japanese Patent Application No. JP 2021-073876 filed in the Japan Patent Office on Apr. 26, 2021. Each of the above-referenced applications is hereby incorporated herein by reference in its entirety.

TECHNICAL FIELD

The present technology relates to a solid-state imaging element. Specifically, the present technology relates to a solid-state imaging element provided with a comparator and a counter, and an imaging device.

BACKGROUND ART

In the related art, in a solid-state imaging element or the like, a single-slope analog-to-digital converter (ADC) is often used for analog to digital (AD) conversion since a structure is simple. The single-slope ADC generally includes a comparator and a counter that performs counting on the basis of a comparison result of the comparator. There has been proposed a solid-state imaging element in which, for example, a p-channel metal-oxide-semiconductor (pMOS) transistor, a current source, and a logic gate (such as an inverter) are disposed in the comparator (See, for example, Patent Document 1). The pMOS transistor compares a pixel signal from a pixel circuit with a reference signal, and outputs a comparison result from a drain via the inverter. The comparison result is initialized to a low level by inputting a high-level reference voltage immediately before the counter starts counting.

CITATION LIST

Patent Document

Patent Document 1: US Patent Application Laid-Open No. 2018/0103222

SUMMARY OF THE INVENTION

Problems to be Solved by the Invention

In the above-described solid-state imaging element, a current of the pixel circuit is shared by the comparator, and thus power consumption is reduced as compared with a configuration in which the current source is also provided in the comparator separately from the pixel circuit. However, in the above-described solid-state imaging element, it is difficult to increase a speed at which the output transitions from the high level to the low level at the time of the initialization (in other words, the responsiveness of the comparator is improved). When a value of a reference voltage is sufficiently increased in order to improve the responsiveness, a leakage current of the pMOS transistor in an OFF state decreases, but the power consumption increases.

The present technology has been made in view of such a situation, and an object thereof is to improve responsiveness of a comparator in a solid-state imaging element in which the comparator is provided for each column.

Solutions to Problems

The present technology has been made to solve the above-described problems, and according to a first aspect of the present technology, there is provided a solid-state imaging element including: an input transistor configured to output, from a drain, a potential within a range from one side to the other side of a pair of output potentials on the basis of whether or not an input potential input to a source and a predetermined reference potential input to a gate substantially coincide with each other; a first current source configured to supply a constant current; a capacitor that is inserted between the source of the input transistor and the first current source; and a first cutoff switch configured to disconnect the drain of the input transistor from a connection node within a predetermined period for initializing the connection node between the capacitor and the first current source to a lower one of the pair of output potentials, and connect the connection node with the drain of the input transistor outside the predetermined period. This brings about an effect of improving responsiveness.

Furthermore, in the first aspect, the first cutoff switch may include an N-type transistor and a P-type transistor which are connected in parallel between the drain of the input transistor and the first current source. Accordingly, the comparison operation can be performed without being affected by the cutoff switch.

Furthermore, in the first aspect, the first cutoff switch may include an N-type transistor. This brings about an effect that the number of transistors is reduced.

Furthermore, in the first aspect, there may be further provided a first output transistor configured to output, from a drain, a potential within a range from a predetermined potential lower than the input potential to the input potential on the basis of whether or not a difference between the input potential input to a source and a potential of the connection node input to a gate exceeds a predetermined threshold voltage; and an output-side short-circuit switch configured to short-circuit the source and the drain of the first output transistor within the predetermined period. This brings about an effect of improving responsiveness.

Furthermore, in the first aspect, there may further provided an auto-zero transistor configured to connect the gate and the drain of the input transistor within an auto-zero period before the predetermined period, and the output-side short-circuit switch may short-circuit the source and the drain of the first output transistor within the auto-zero period and the predetermined period. This brings about an effect that oscillation in the auto-zero period is suppressed.

Furthermore, in the first aspect, the output-side short-circuit switch may include an N-type transistor and a P-type transistor which are connected in parallel between the source and the drain of the first output transistor. This brings about an effect that the source and the drain of the first output transistor are short-circuited in a case where the level of the comparison result is about an intermediate value of the power supply potential.

Furthermore, in the first aspect, the output-side short-circuit switch may include an N-type transistor. This brings about an effect that the number of transistors is reduced.

Furthermore, in the first aspect, the output-side short-circuit switch may include a P-type transistor. This brings about an effect that the number of transistors is reduced.

Furthermore, in the first aspect, there may be further provided a second output transistor configured to output, from a drain, a voltage within a range from the predetermined potential to the input potential on the basis of whether or not a difference between the input potential input to a source and the drain of the first output transistor input to a gate exceeds a predetermined threshold voltage. Accordingly, a gain of the comparator increases, and thus linearity is improved.

Furthermore, in the first aspect, there may be further provided an input-side short-circuit switch configured to short-circuit the drain and the source of the input transistor within the predetermined period. This brings about an effect that deterioration in the property is suppressed.

Furthermore, in the first aspect, there may be further provided: a level-shift circuit configured to output an output signal of a pair of shift potentials having a potential difference greater than the predetermined potential and the input potential on the basis of a potential of the drain of the first output transistor; and a logic gate configured to determine whether or not the output signal is higher than a predetermined threshold between the pair of shift potentials and output a determination result. This brings about an effect of improving the degree of freedom in design.

Furthermore, in the first aspect, one of the pair of shift potentials may be a power supply potential higher than the input potential, and the other of the pair of shift potentials may be a reference potential lower than the predetermined potential, and the level-shift circuit may include: an N-type transistor having a gate connected to a vertical signal line of the input potential and a source connected to the drain of the first output transistor; a power-supply-side precharge transistor configured to initialize a potential of the drain of the N-type transistor to the power supply potential; a P-type transistor having a gate connected to the drain of the N-type transistor and a drain connected to the logic gate; and a reference-side precharge transistor configured to initialize a potential of the drain of the P-type transistor to the reference potential. This brings about an effect that the voltage circuit is expanded by four transistors.

Furthermore, in the first aspect, there may be further provided: a first output transistor configured to output, from a drain, a potential within a range from a predetermined potential lower than the input potential to the input potential on the basis of whether or not a difference between the input potential input to a source and a potential of the connection node input to a gate exceeds a predetermined threshold voltage; a second current source configured to supply a constant current; a second cutoff switch configured to disconnect the drain of the first output transistor from the second current source before a start timing of settling of the reference potential and connect the drain of the first output transistor with the second current source over a certain period from the start timing; a clamp transistor having a drain connected to the second current source; and a control switch configured to connect the source of the first output transistor with a source of the clamp transistor before the start timing and disconnect the source of the first output transistor from the source of the clamp transistor over a certain period from the start timing. This brings about an effect that kickback is suppressed.

Furthermore, in the first aspect, there may be further provided a level-shift circuit configured to output an output signal of a pair of shift potentials having a potential difference greater than the predetermined potential and the input potential on the basis of a potential of a connection node between the control switch and the clamp transistor. This brings about an effect of improving the degree of freedom in design.

Furthermore, in the first aspect, there may be further provided an input capacitor switching circuit configured to switch the number of input capacitors connected in parallel to the gate of the input transistor. This brings about an effect of reducing noise.

Furthermore, according to a second aspect of the present technology, there is provided a solid-state imaging element including: an input transistor configured to output, from a drain, a drain potential corresponding to an input potential in a case where the input potential input to a source and a predetermined reference potential input to a gate substantially coincide with each other; a first output transistor configured to output, from a drain, a potential within a range from a predetermined potential to the input potential on the basis of whether or not a difference between the input potential input to a source and the drain potential input to a gate exceeds a predetermined threshold voltage; and an output-side short-circuit switch configured to short-circuit the source and the drain of the first output transistor within a predetermined period for initializing the drain of the first output transistor to the input potential. This brings about an effect of improving responsiveness.

Furthermore, according to a third aspect of the present technology, there is provided a solid-state imaging element including: an input transistor configured to output a predetermined clamp potential from a drain in a case where an input potential input to a source and a predetermined reference potential input to a gate substantially coincide with each other; and an input-side short-circuit switch configured to short-circuit the source and the drain of the input transistor within a predetermined period for initializing the potential of the drain to a high level higher than the clamp potential. This brings about an effect of improving responsiveness.

Furthermore, according to a fourth aspect of the present technology, there is provided an imaging device including: an input transistor configured to output, from a drain, a potential within a range from one side to the other side of a pair of output potentials on the basis of whether or not an input potential input to a source and a predetermined reference potential input to a gate substantially coincide with each other; a current source configured to supply a constant current; a capacitor that is inserted between the source of the input transistor and the current source; a cutoff switch configured to disconnect the drain of the input transistor from a connection node within a predetermined period for initializing the connection node between the capacitor and the current source to a lower one of the pair of output potentials, and connect the connection node with the drain of the input transistor outside the predetermined period; and a counter configured to count a count value over a period until a potential of the connection node is inverted. This brings about an effect of improving responsiveness.

Furthermore, according to a fifth aspect of the present technology, there is provided a solid-state imaging element including: a vertical signal line that is connected to a pixel; a transistor including a source connected to the vertical signal line and a gate receiving a signal based on a predetermined reference potential; a current source configured to supply a constant current; a capacitor that is inserted between the source of the transistor and the current source;

and a switch that is connected to a connection node between the capacitor and the current source and a drain of the transistor.

Furthermore, according to a sixth aspect of the present technology, there is provided a solid-state imaging element including: a vertical signal line that is connected to a pixel; a first transistor including a source connected to the vertical signal line and a gate receiving a signal based on a predetermined reference potential; a current source configured to supply a constant current; a second transistor including a source connected to the vertical signal line and a gate connected to the current source; and a switch that is connected to the source and the drain of the second transistor.

BRIEF DESCRIPTION OF DRAWINGS

FIG. 16 is a timing chart illustrating an example of an operation of a solid-state imaging element according to the second embodiment of the present technology.

FIGS. 17A, 17B, and 17C are examples of a timing chart in a case where a black level is input within a signal level conversion period according to the second embodiment of the present technology.

MODE FOR CARRYING OUT THE INVENTION

Hereinafter, modes for carrying out the present technology (hereinafter, referred to as embodiments) will be described. A description will be given in the following order.
1. First embodiment (Example of increasing response speed by cutoff switch)
2. Second embodiment (Example of increasing response speed by short-circuit switch)
3. Third embodiment (Example of increasing response speed by cutoff switch and output-side short-circuit switch)
4. Fourth embodiment (Example of adding transistor of third stage and increasing response speed by cutoff switch and output-side short-circuit switch)
5. Fifth embodiment (Example of adding input-side short-circuit switch and increasing response speed by cutoff switch and output-side short-circuit switch)
6. Sixth embodiment (Example of providing level-shift circuit and increasing response speed by cutoff switch and output-side short-circuit switch)
7. Seventh embodiment (Example of corresponding to ramp signal having different waveform and increasing response speed by short-circuit switch)
8. Eighth embodiment (Example of suppressing kickback by cutoff switch, clamp transistor, and control switch)
9. Application example to mobile body

1. First Embodiment

[Configuration of Imaging Device]

Figure 1:
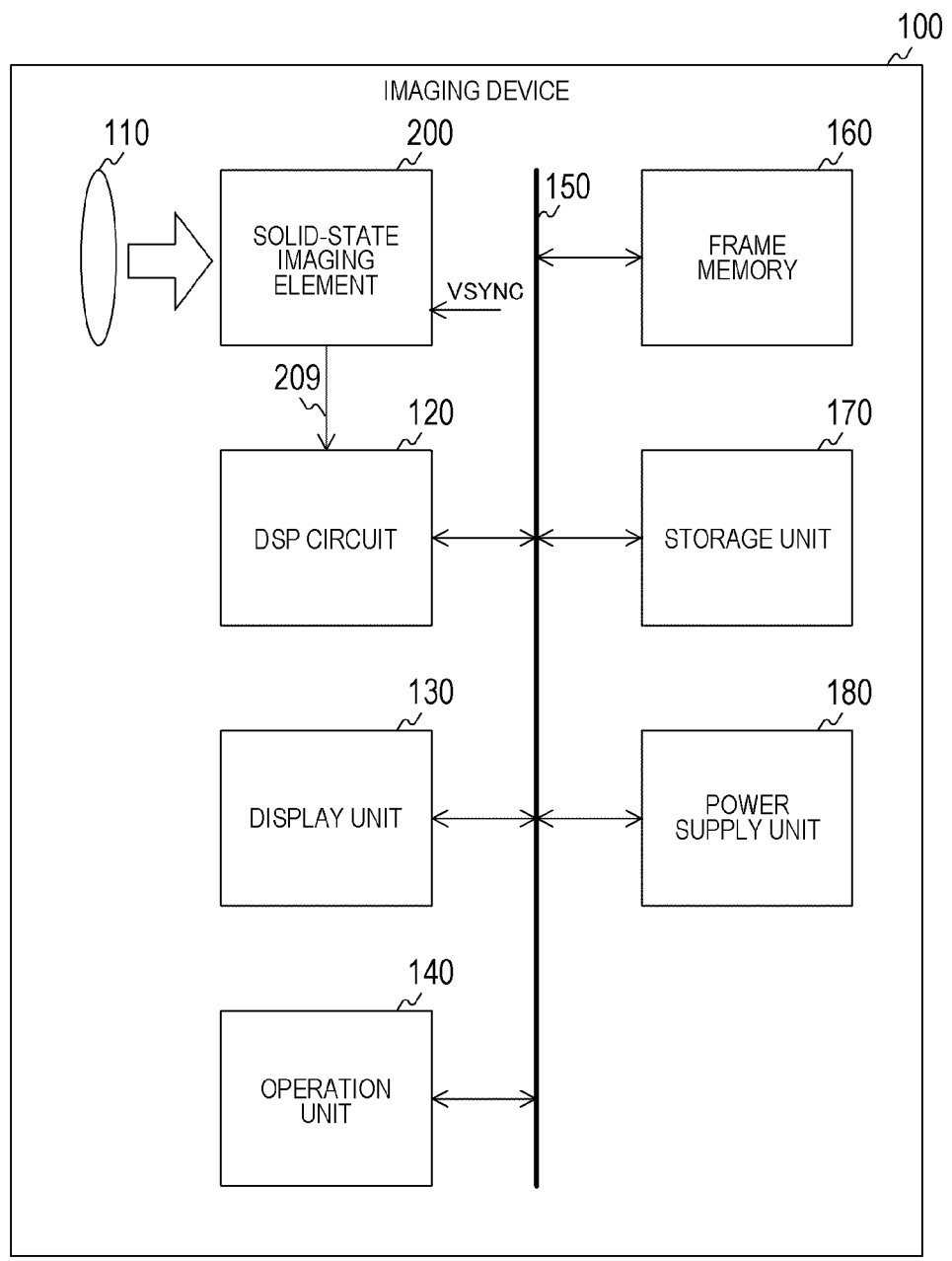
FIG. 1 is a block diagram illustrating a configuration example of an imaging device according to a first embodiment of the present technology.

FIG. 1 is a block diagram illustrating a configuration example of an imaging device 100 according to the first embodiment of the present technology. The imaging device 100 is a device for capturing image data, and includes an optical unit 110, a solid-state imaging element 200, and a digital signal processing (DSP) circuit 120. The imaging device 100 further includes a display unit 130, an operation unit 140, a bus 150, a frame memory 160, a storage unit 170, and a power supply unit 180. As the imaging device 100, a camera mounted on a smartphone, an in-vehicle camera, or the like is considered.

The optical unit 110 condenses light from a subject and guides the light to the solid-state imaging element 200. The solid-state imaging element 200 generates image data by photoelectric conversion. The solid-state imaging element 200 supplies the generated image data to the DSP circuit 120 via a signal line 209.

The DSP circuit 120 executes predetermined signal processing on the image data. The DSP circuit 120 outputs the processed image data to the frame memory 160 or the like via the bus 150.

The display unit 130 displays the image data. As the display unit 130, for example, a liquid crystal panel or an organic electro luminescence (EL) panel is considered. The operation unit 140 generates an operation signal according to a user's operation.

The bus 150 is a common path for the optical unit 110, the solid-state imaging element 200, the DSP circuit 120, the display unit 130, the operation unit 140, the frame memory 160, the storage unit 170, and the power supply unit 180 to exchange data with each other.

The frame memory 160 holds the image data. The storage unit 170 stores various data such as image data. The power supply unit 180 supplies power to the solid-state imaging element 200, the DSP circuit 120, the display unit 130, and the like.

Figure 2:
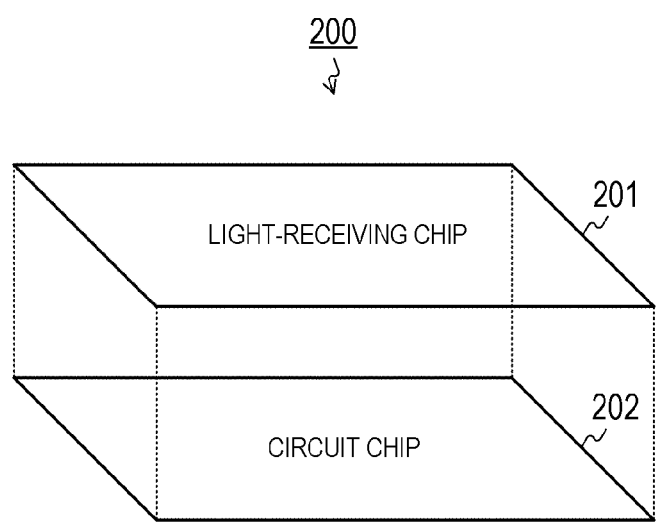
FIG. 2 is a diagram illustrating an example of a stacked structure of a solid-state imaging element according to the first embodiment of the present technology.

FIG. 2 is a diagram illustrating an example of a stacked structure of the solid-state imaging element 200 according to the first embodiment of the present technology. The solid-state imaging element 200 includes a circuit chip 202 and a light-receiving chip 201 stacked on the circuit chip 202. These chips are electrically connected via a connection portion such as a via. Note that in addition to the via, connection can also be made by Cu—Cu bonding or a bump.

[Configuration Example of Solid-State Imaging Element]

Figure 3:
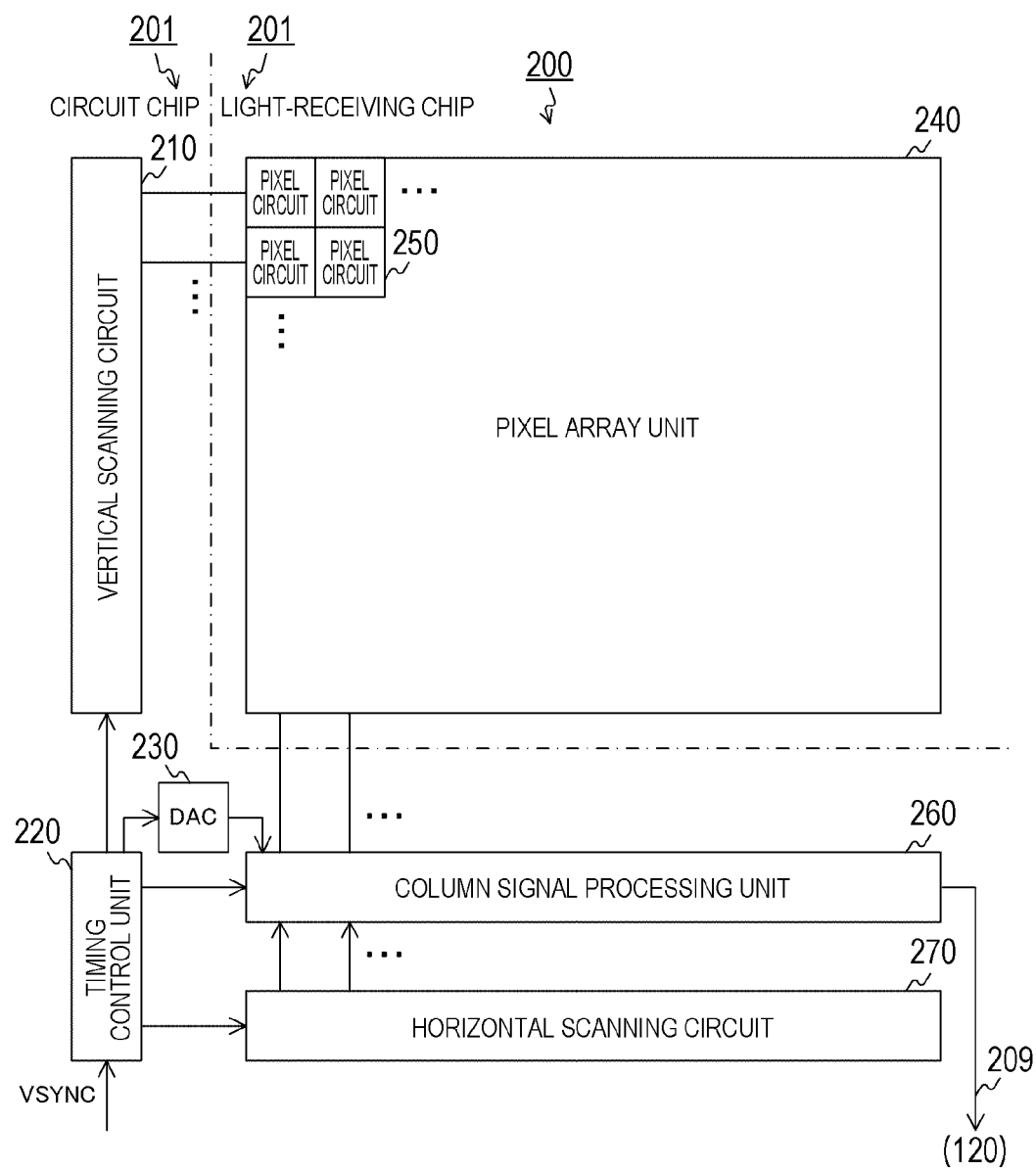
FIG. 3 is a block diagram illustrating a configuration example of a solid-state imaging element according to the first embodiment of the present technology.

FIG. 3 is a block diagram illustrating a configuration example of the solid-state imaging element 200 according to the first embodiment of the present technology. The solid-state imaging element 200 includes a vertical scanning circuit 210, a timing control unit 220, a digital-to-analog converter (DAC) 230, a pixel array unit 240, a column signal processing unit 260, and a horizontal scanning circuit 270. In the pixel array unit 240, a plurality of pixel circuits 250 is arranged in a two-dimensional lattice shape.

For example, the pixel array unit 240 is disposed on the light-receiving chip 201 and the remaining circuits are disposed on the circuit chip 202. Note that the circuits disposed in the respective chips are not limited to those illustrated in the drawing.

The vertical scanning circuit 210 sequentially selects and drives rows in the pixel array unit 240.

The timing control unit 220 controls operation timings of the vertical scanning circuit 210, the DAC 230, the column signal processing unit 260, and the horizontal scanning circuit 270 in synchronization with a vertical synchronization signal VSYNC.

The DAC 230 generates a saw-tooth wave ramp signal and supplies the generated ramp signal to the column signal processing unit 260 as a reference signal.

Each of the pixel circuits 250 generates an analog pixel signal by photoelectric conversion under the control of the vertical scanning circuit 210. The pixel circuit 250 of each column outputs a pixel signal to the column signal processing unit 260 via a vertical signal line (not illustrated).

In the column signal processing unit 260, an ADC (not illustrated) is disposed for each column of the pixel circuit 250. Each ADC converts the pixel signal of the corresponding column into a digital signal and outputs the digital signal to the DSP circuit 120 under the control of the horizontal scanning circuit 270.

The horizontal scanning circuit 270 controls the column signal processing unit 260 and the digital signal is sequentially output.

[Configuration Example of Pixel Circuit]

Figure 4:
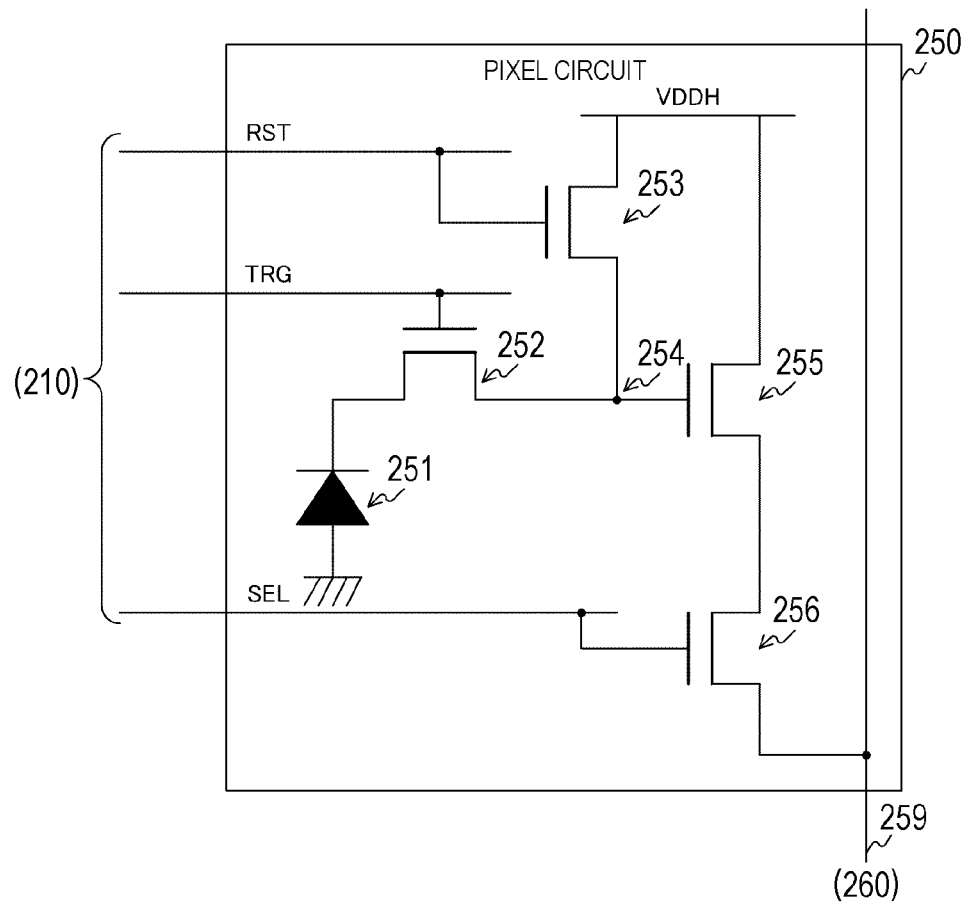
FIG. 4 is a circuit diagram illustrating a configuration example of a pixel circuit according to the first embodiment of the present technology.

FIG. 4 is a circuit diagram illustrating a configuration example of the pixel circuit 250 according to the first embodiment of the present technology. The pixel circuit 250 includes a photoelectric conversion element 251, a transfer transistor 252, a reset transistor 253, a floating diffusion layer 254, an amplification transistor 255, and a selection transistor 256. Furthermore, in the pixel array unit 240, a vertical signal line 259 is wired for each column along a vertical direction.

The photoelectric conversion element 251 photoelectrically converts incident light to generate an electric charge. The transfer transistor 252 transfers the electric charge from the photoelectric conversion element 251 to the floating diffusion layer 254 in accordance with a drive signal TRG from the vertical scanning circuit 210.

The reset transistor 253 extracts the electric charge from the floating diffusion layer 254 and initializes the extracted electric charge in accordance with a drive signal RST from the vertical scanning circuit 210.

The floating diffusion layer 254 accumulates electric charges and generates a voltage corresponding to the electric charge amount. The amplification transistor 255 amplifies the voltage of the floating diffusion layer 254.

The selection transistor 256 outputs, as a pixel signal, a signal of the amplified voltage to the column signal processing unit 260 via the vertical signal line 259 in accordance with a drive signal SEL from the vertical scanning circuit 210.

[Configuration Example of Column Signal Processing Unit]

Figure 5:
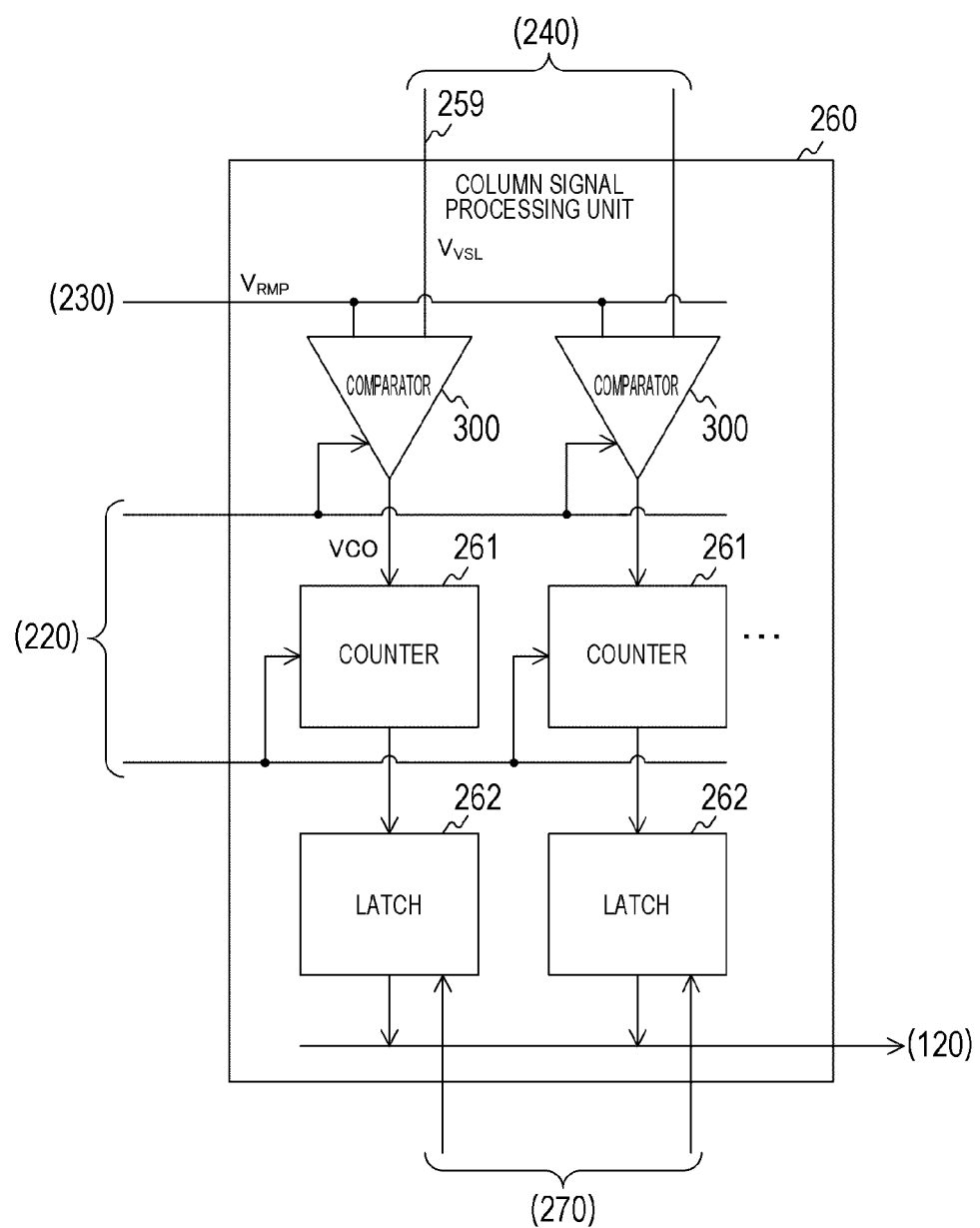
FIG. 5 is a block diagram illustrating a configuration example of a column signal processing unit according to the first embodiment of the present technology.

FIG. 5 is a block diagram illustrating a configuration example of a column signal processing unit 260 according to the first embodiment of the present technology. In the column signal processing unit 260, a comparator 300, a counter 261, and a latch 262 are disposed for each column. In a case where the number of columns is N (N is an integer), N comparators 300, N counters 261, and N latches 262 are disposed.

The comparator 300 compares the reference signal from the DAC 230 with the pixel signal from the corresponding column. Hereinafter, a potential of the reference signal is referred to as a reference potential $V_{RMP}$, and a potential of the vertical signal line 259 for transmitting the pixel signal is referred to as an input potential $V_{VSL}$. The comparator 300 supplies an output signal VCO indicating a comparison result to the counter 261 of the corresponding column.

Furthermore, hereinafter, the level of the pixel signal (that is, input potential $V_{VSL}$) when the pixel circuit 250 is initialized is referred to as a "reset level", and the level of the pixel signal when an electric charge is transferred to the floating diffusion layer 254 is referred to as a "signal level".

The counter 261 counts a count value over a period until the output signal VCO is inverted. For example, the counter 261 performs a down-counting operation over a period until the output signal VCO corresponding to the reset level is inverted, and performs an up-counting operation over a period until the output signal VCO corresponding to the signal level is inverted. Therefore, correlated double sampling (CDS) processing of obtaining a difference between the reset level and the signal level is implemented.

Then, the counter 261 causes the latch 262 to hold a digital signal indicating the count value. AD conversion processing of converting an analog pixel signal into a digital signal is implemented by the comparator 300 and the counter 261. That is, the comparator 300 and the counter 261 function as the ADC. The ADC using the comparator and the counter as described above is generally referred to as a single-slope ADC.

Note that the CDS processing is implemented by the up-counting operation and the down-counting operation, but is not limited to this configuration. The counter 261 may be configured to perform only any one of the up-counting operation and the down-counting operation, and a post-stage circuit may execute the CDS processing for obtaining the difference.

The latch 262 holds the digital signal. The latch 262 outputs the held digital signal under the control of the horizontal scanning circuit 270.

[Configuration Example of Comparator]

Figure 6:
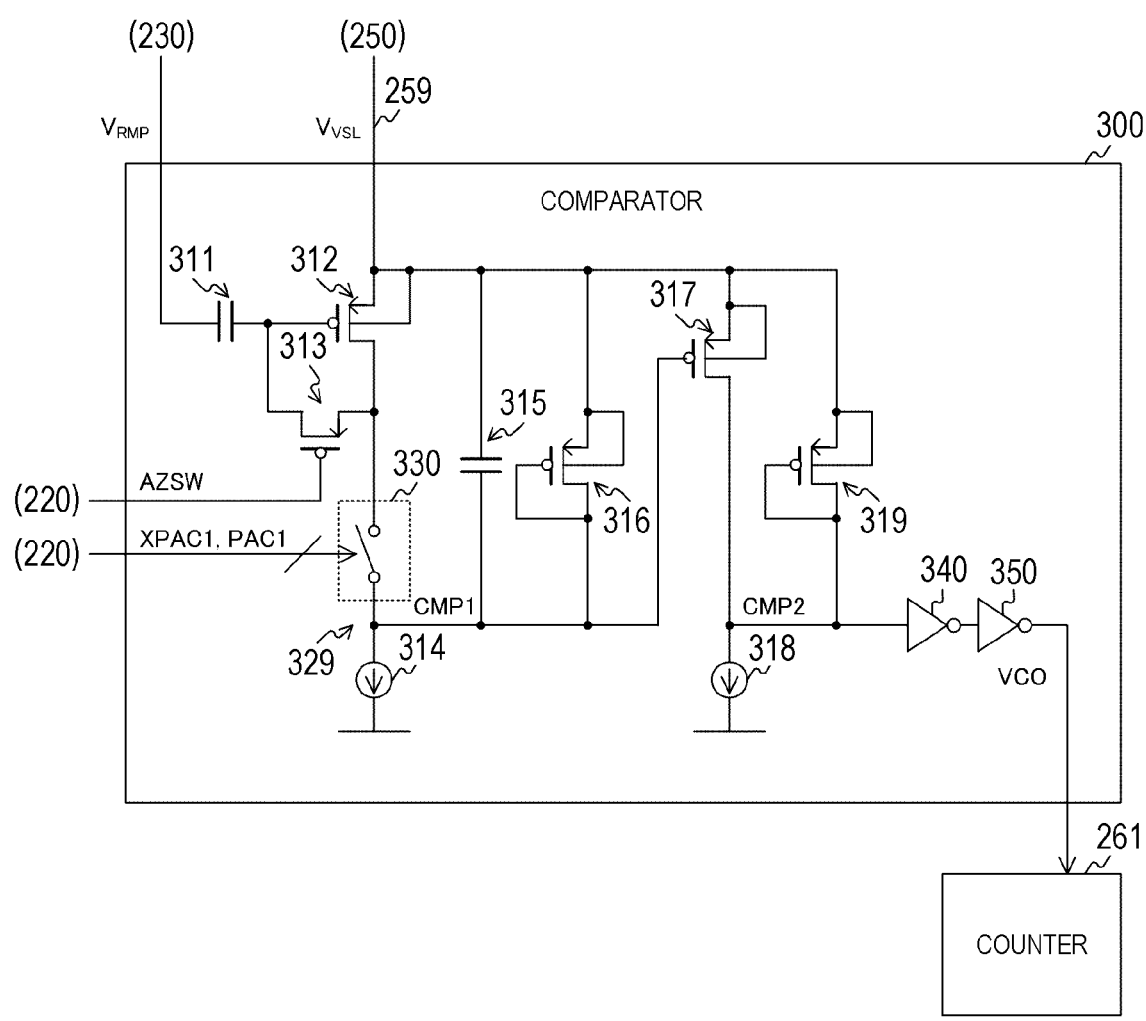
FIG. 6 is a circuit diagram illustrating a configuration example of a comparator according to the first embodiment of the present technology.

FIG. 6 is a circuit diagram illustrating a configuration example of the comparator 300 according to the first embodiment of the present technology. The comparator 300 includes an input capacitor 311, an input transistor 312, an auto-zero transistor 313, a cutoff switch 330, a current source 314, a band-limit capacitor 315, and a clamp transistor 316. Moreover, the comparator 300 includes an output transistor 317, a current source 318 and a clamp transistor 319, and inverters 340 and 350.

The input capacitor 311 is inserted between the DAC 230 and a gate of the input transistor 312.

A source of the input transistor 312 is connected to the vertical signal line 259, and the input potential $V_{VSL}$, which is the potential of the vertical signal line 259, is input to the source. Furthermore, the reference potential $V_{RMP}$ is input to the gate of the input transistor 312 via the input capacitor 311. When the input potential $V_{VSL}$ input to the source of the input transistor 312 and the reference potential $V_{RMP}$ input to the gate of the input transistor 312 substantially coincide with each other, the input transistor 312 outputs a drain voltage corresponding to the input potential $V_{VSL}$ and reference potential $V_{RMP}$ from the drain. Here, "substantially coincide" means that the potentials of the comparison targets completely coincide with each other or the difference is within a predetermined allowable value. This allowable value is set to a threshold voltage Vt of the input transistor 312. As the input transistor 312, for example, a p-channel metal-oxide-semiconductor (pMOS) transistor is used.

The auto-zero transistor 313 causes short-circuit between the gate and the drain of the input transistor 312 in accordance with a control signal AZSW from the timing control unit 220. As the auto-zero transistor 313, for example, a pMOS transistor is used.

The current source 314 supplies a constant current. The current source 314 is realized by an n-channel MOS (nMOS) transistor or the like.

The band-limit capacitor 315 is inserted between the vertical signal line 259 (that is, the source of the input transistor) and the current source 314. The band-limit capacitor 315 is disposed, and thus a predetermined band such as a low frequency band below a cutoff frequency can be limited. Note that the band-limit capacitor 315 is an example of a capacitor described in the claims.

The cutoff switch 330 opens and closes a path between a connection node 329 between the band-limit capacitor 315 and current source 314 and the drain of the input transistor 312 according to control signals XPAC1 and PAC1 from the timing control unit 220. When the cutoff switch 330 is closed, as a comparison result CMP1, the drain voltage of the input transistor 312 is output from the connection node 329.

The clamp transistor 316 is inserted between the source of the input transistor 312 and the connection node 329. An re-channel MOS (pMOS) transistor is used as the clamp transistor 316, and the gate of the clamp transistor 316 is short-circuited to the drain. Furthermore, the back gate and the source of the clamp transistor 316 are desirably short-circuited. The clamp transistor 316 can suppress a decrease in the drain voltage when the input transistor 312 is turned off. Hereinafter, a potential lower than the input potential $V_{VSL}$ by a drain-source voltage of the clamp transistor 316 is referred to as "clamp potential $V_{CLP}$".

A source of the output transistor 317 is connected to the vertical signal line 259, and the input potential $V_{VSL}$ is input to the source of the output transistor 317. Furthermore, the gate of the output transistor 317 is connected to the drain of the input transistor 312, and the comparison result CMP1 is input. As the output transistor 317, for example, the pMOS transistor is used. Furthermore, the back gate and the source of the output transistor 317 are desirably short-circuited.

The output transistor 317 outputs, from the drain, a signal indicating whether or not a difference between the input potential $V_{VSL}$ input to the source and the comparison result CMP1 input to the gate exceeds a predetermined threshold voltage as a comparison result CMP2. The comparison result CMP2 is input to the inverter 340. Note that the output transistor 317 is an example of a second output transistor described in the claims.

Here, when the pixel signal and the reference signal substantially coincide with each other, the drain voltage of the input transistor 312 (that is, the comparison result CMP1) varies according to the level of the pixel signal. Therefore, in a case where the comparison result CMP1 is input to, for example, a post-stage circuit having a fixed threshold based on the ground potential, a timing at which the drain voltage is inverted may deviate from an ideal timing at which the pixel signal and the reference signal substantially coincide with each other.

With the connection in the drawing, the drain-source voltage of the input transistor 312 is input as a gate-source voltage of the output transistor 317. Since the variation amount of the drain voltage of the input transistor 312 is equal to the variation amount of the voltage of the pixel signal, the comparison result CMP2 from the output transistor 317 is inverted at the ideal timing at which the pixel signal and the reference signal substantially coincide with each other. In a case where the comparison result CMP2 is connected to, for example, the post-stage circuit having a fixed threshold based on the ground potential, the comparison result CMP2 varies depending on the pixel signal level similarly to the comparison result CMP1. However, since a gain is higher than that of the comparison result CMP1, an error is less likely to be seen. As described above, the error of an inversion timing can be suppressed by adding the output transistor 317.

The current source 318 is inserted between the drain of the output transistor 317 and a reference potential VSSB, and supplies a constant current. The current source 318 is realized by the nMOS transistor or the like.

The clamp transistor 319 is inserted between the source and the drain of the output transistor 317. The n-channel MOS (pMOS) transistor is used as the clamp transistor 319, and the gate of the clamp transistor 319 is short-circuited to the drain. Furthermore, the back gate and the source of the clamp transistor 319 are desirably short-circuited. The clamp transistor 319 can suppress a decrease in the drain voltage when the output transistor 317 is in an OFF state. A clamp potential corresponding to the clamp transistor 319 is substantially the same as a clamp potential corresponding to the clamp transistor 316.

Note that the clamp transistor 316, the output transistor 317, and the clamp transistor 319 are disposed in the comparator 300, but at least one of the clamp transistor 316, the output transistor 317, or the clamp transistor 319 may not be provided. In a case where the output transistor 317 is not provided, the current source 318 and the clamp transistor 319 are unnecessary.

The reference potential $V_{RMP}$ is set to be higher than a potential at the auto-zero time in the start of the AD conversion, and decreases with the lapse of time within an AD conversion period. Here, the AD conversion period is a period for the counter 261 to perform counting. In the start of the AD conversion period, the input transistor 312 of the first stage is turned off, a current flows through the clamp transistor 316, and the clamp potential $V_{CLP}$ lower than the input potential $V_{VSL}$ is output as the comparison result CMP1 from the connection node 329 via the cutoff switch 330. The output transistor 317 of the second stage is turned on, and outputs the input potential $V_{VSL}$ as the comparison result CMP2.

Then, when the reference potential $V_{RMP}$ decreases and the gate potential of the input transistor 312 in the substantially coincident state described above decreases by a value obtained by subtracting a threshold Vt of the input transistor 312 from the input potential $V_{VSL}$, the input transistor 312 of the first stage transitions to the ON state, and the comparison result CMP1 is inverted to the input potential $V_{VSL}$. The output transistor 317 of the second stage transitions to the OFF state, and the comparison result CMP2 is inverted to the clamp potential $V_{CLP}$.

As described above, the potential of the comparison result CMP1 is a value within a range from the clamp potential $V_{CLP}$ to the input potential $V_{VSL}$. Furthermore, the comparison result CMP1 output from the connection node 329 transitions from a low level (clamp potential $V_{CLP}$) to a high level (input potential $V_{VSL}$) within a counting period (that is, the AD conversion period) of the counter 261. Therefore, it is necessary to initialize the potential of the connection node 329 to the low level immediately before the AD conversion period. The timing control unit 220 controls the cutoff switch 330 to be opened over a predetermined pulse period at the timing of initialization to the low level. Accordingly, the connection node 329 is disconnected from the drain of the input transistor 312. Furthermore, other than the pulse period, the cutoff switch 330 is controlled to be closed, and the connection node 329 is connected to the drain of the input transistor 312.

Note that the clamp potential $V_{CLP}$ and input potential $V_{VSL}$, which are output from the input transistor 312, indicate an example of a pair of output potentials described in the claims.

The inverter 340 inverts the comparison result CMP2 and supplies an inverted signal to the inverter 350. The inverter 350 inverts the inverted signal supplied from the inverter 340 and supplies the inverted signal as the output signal VCO to the counter 261.

Note that instead of the inverters 340 and 350, other logic gates such as a buffer and a negative OR (NOR) gate can be provided. The inverters 340 and 350 are examples of the logic gates described in the claims.

Figure 7A:
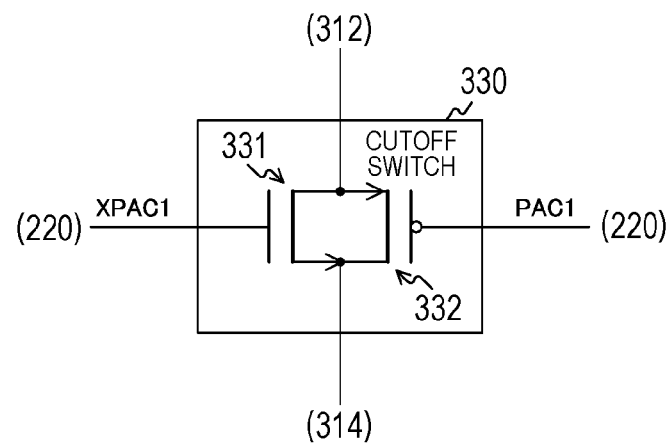
FIGS. 7A and 7B are circuit diagrams illustrating configuration examples of a cutoff switch and an inverter according to the first embodiment of the present technology.
Figure 7B:
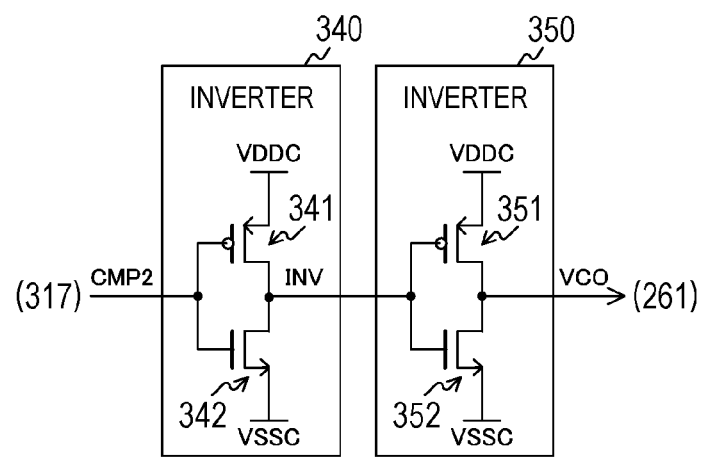

[Configuration Examples of Cutoff Switch and Inverter]
FIGS. 7A and 7B are circuit diagrams illustrating configuration examples of the cutoff switch 330 and the inverters 340 and 350 according to the first embodiment of the present technology. In the drawing, FIG. 7A is a circuit diagram illustrating a configuration example of the cutoff switch 330. In the drawing, FIG. 7B is a circuit diagram illustrating a configuration examples of the inverters 340 and 350.

As illustrated in FIG. 7A of the drawing, the cutoff switch 330 includes an nMOS transistor 331 and a pMOS transistor 332 which are connected in parallel between the drain of the input transistor 312 and the current source 314. The control signal XPAC1 is input to a gate of the nMOS transistor 331, and the control signal PAC1 is input to a gate of the pMOS transistor 332. The control signal XPAC1 is a signal having a phase different from that of the control signal PAC1 by 180 degrees.

Note that the nMOS transistor 331 is an example of an N-type transistor described in the claims, and the pMOS transistor 332 is an example of a P-type transistor described in the claims.

Furthermore, as illustrated in FIG. 7B of the drawing, the inverter 340 includes a pMOS transistor 341 and an nMOS transistor 342. The inverter 350 includes a pMOS transistor 351 and an nMOS transistor 352.

The pMOS transistor 341 and nMOS transistor 342 in the inverter 340 are connected in series between a power supply potential VDDC and a reference potential VSSC. The comparison result CMP2 is input to the gates of the pMOS transistor 341 and nMOS transistor 342. An inverted signal INV is output from a connection node between the pMOS transistor 341 and nMOS transistor 342 to the inverter 350. Here, a power supply potential VDDB is a power supply potential different from a power supply potential VDDA of the pixel circuit 250. Furthermore, the reference potential VSSC is a potential different from the reference potential VSSB of the comparator 300.

The pMOS transistor 351 and nMOS transistor 352 in the inverter 350 are connected in series between the power supply potential VDDC and the reference potential VSSC. The inverted signal INV is input to the gates of the pMOS transistor 351 and nMOS transistor 352. The output signal VCO is output from a connection node between the pMOS transistor 351 and nMOS transistor 352 to the counter 261.

The inverters 340 and 350 can convert the power supply potential VDDB of the preceding stage into a lower power supply potential VDDC.

Figure 8A:
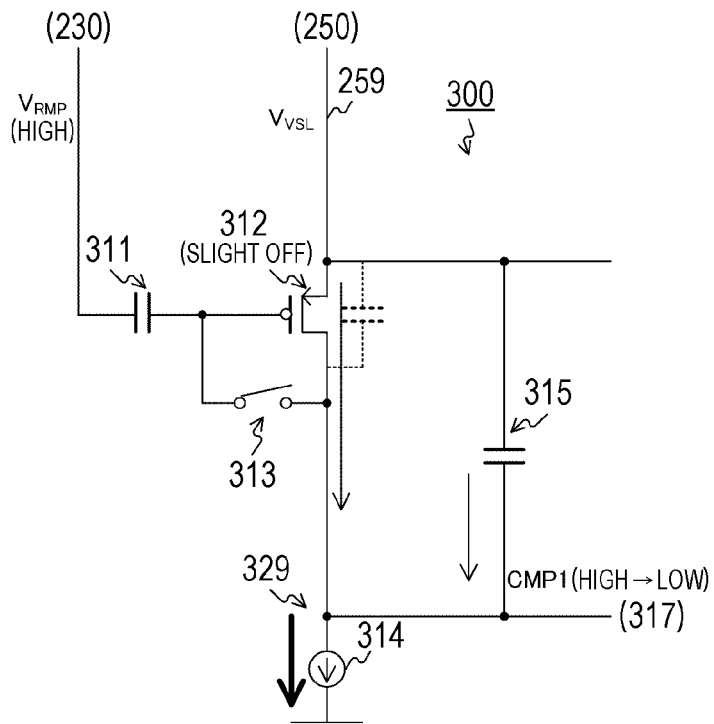
FIGS. 8A and 8B are diagrams for explaining an improvement effect of responsiveness according to the first embodiment of the present technology.
Figure 8B:
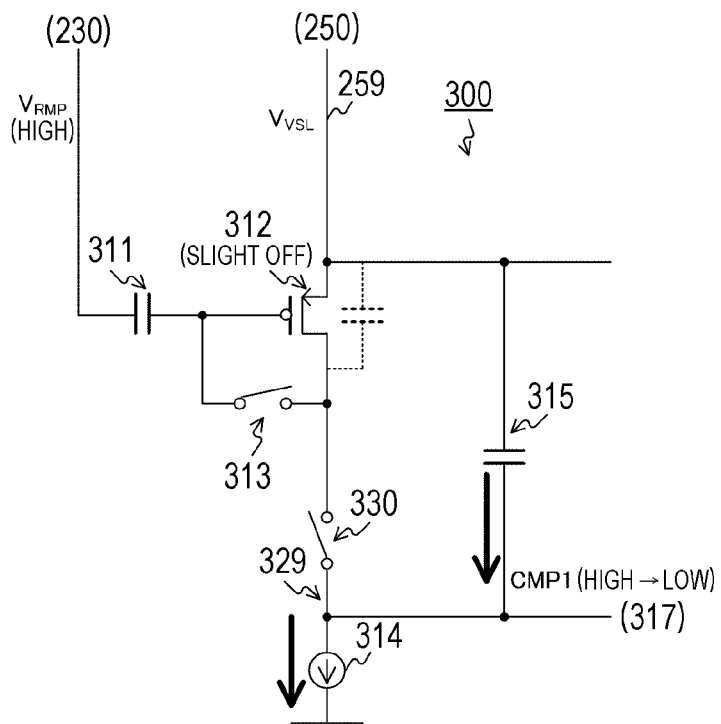

FIGS. 8A and 8B are diagrams for explaining an improvement effect of responsiveness according to the first embodiment of the present technology. In the drawing, FIG. 8A is a circuit diagram illustrating a configuration example of the comparator 300 of a comparative example in which the cutoff switch 330 is not provided. In the drawing, FIG. 8B is a circuit diagram illustrating a configuration example of the comparator 300 according to the first embodiment of the present technology.

As illustrated in FIG. 8A of the drawing, the comparative example of a configuration in which the cutoff switch 330 is not provided and the drain of the input transistor 312 is connected to the connection node 329 is considered. In this comparative example, in order to cause the potential of the connection node 329 to transition from the high level (input potential VVSL) to the low level (clamp potential VCLP), a high-level reference potential VRMP equal to or higher than the input potential VVSL is input to the input transistor 312.

When the high-level reference potential $V_{RMP}$ is input, the input transistor 312 transitions to an OFF state, and the comparison result CMP1 transitions from the high level to the low level. However, since a difference between the reference potential $V_{RMP}$ and the input potential $V_{VSL}$ is relatively small, the input transistor 312 is not completely turned off, but is slightly turned off. Therefore, a leakage current flows between the drain and the source of the input transistor 312.

Furthermore, since the current source 314 supplies a constant current, the band-limit capacitor 315 is discharged by a differential current between the leakage current of the input transistor 312 and a constant current supplied by the current source 314. Thin arrows in FIG. 8A of the drawing indicate the differential current and the leakage current. A thick arrow indicates a constant current.

The speed (that is, the response speed) at which the comparison result CMP1 transitions to the low level according to the input is determined by a slew rate and a settling time. The slew rate of the first stage means a falling speed of the potential of the connection node 329 when the band-limit capacitor 315 is discharged by a discharge current. The settling time of the first stage means a time until the potential of the connection node 329 transitions to the low level when an RC circuit including an output impedance of the input transistor 312 and the band-limit capacitor 315 is considered. The slew rate increases and the response speed increases as the discharge current is greater. Furthermore, the settling time becomes longer, and the response speed decreases as a capacitance value of the band-limit capacitor 315 is greater.

In particular, since the input transistor 312 is source-grounded, when drain conductance is set to gds, the output impedance is relatively high at 1/gds. Furthermore, in FIG. 8A of the drawing, since discharge is performed by a differential current (thin arrow) between the leakage current and the constant current, the discharge current becomes smaller than that in a case where there is no leakage current, and the response speed decreases. Furthermore, since a drain-source parasitic capacitor of the input transistor 312 appears as a part of the band-limit capacitor 315, a capacitance value becomes greater than a case where there is no parasitic capacitor, and the response speed decreases. The capacitor indicated by a dotted line in the drawing indicates a parasitic capacitor.

On the other hand, as illustrated in FIG. 8B of the drawing, in a case where the cutoff switch 330 is provided and is opened, the leakage current is cut off, and thus the discharge current becomes greater than that in the comparative example. Furthermore, since the input transistor 312 is disconnected, the capacitance value decreases by a drain-source parasitic capacitance. Therefore, the response speed is increased and the responsiveness is improved as compared with the comparative example.

[Operation Example of Solid-State Imaging Element]

Figure 9:
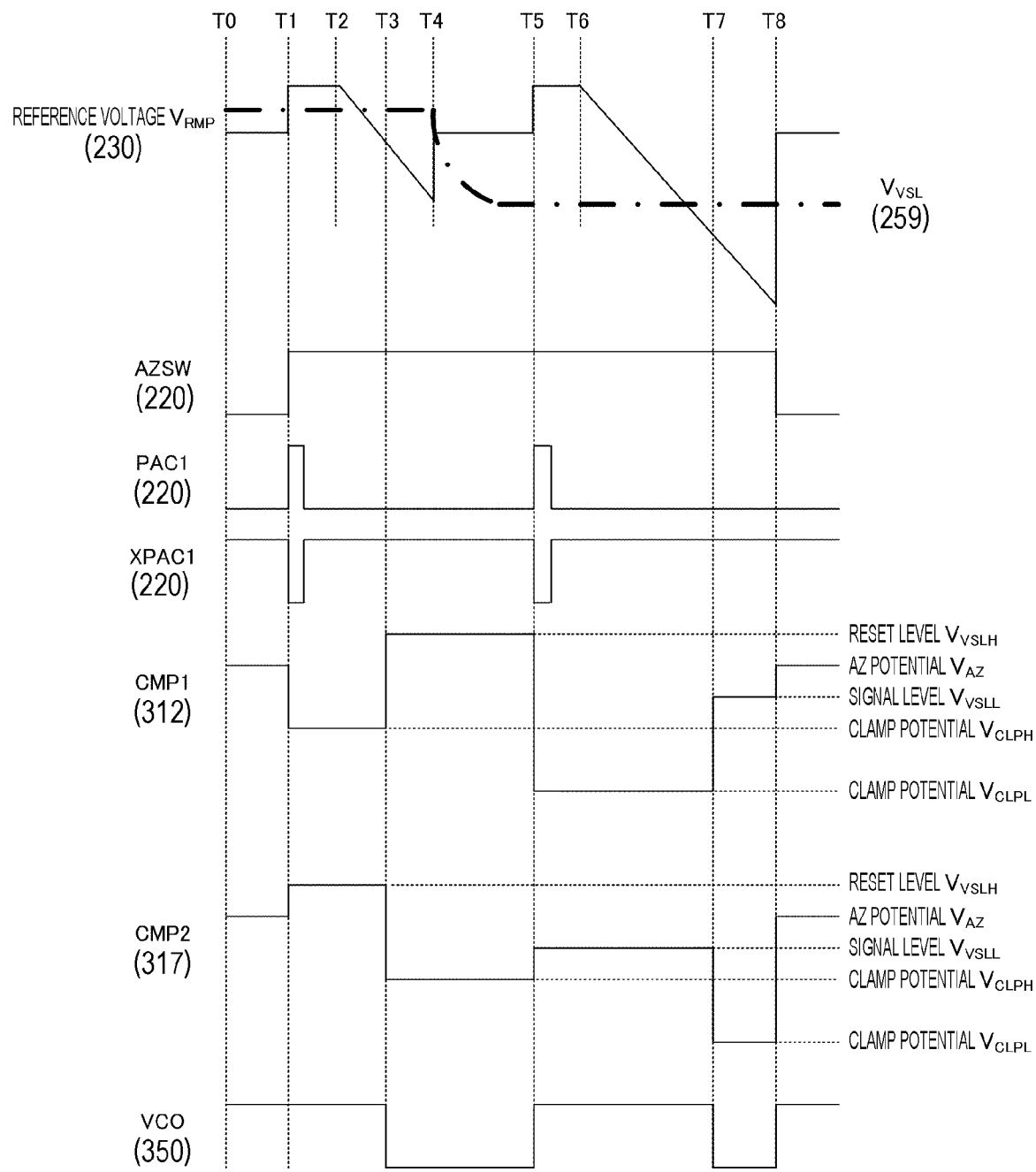
FIG. 9 is a timing chart illustrating an example of an operation of a solid-state imaging element according to the first embodiment of the present technology.

FIG. 9 is a timing chart illustrating an example of an operation of the solid-state imaging element 200 according to the first embodiment of the present technology. An alternate long and short dash line in the drawing indicates a potential (input potential $V_{VSL}$) of the vertical signal line 259.

In an auto-zero period from timing T0 to timing T1, the DAC 230 sets the reference potential $V_{RMP}$, to an auto-zero potential $V_{AZ}$. Furthermore, the timing control unit 220 sets the control signal AZSW to the low level. Accordingly, the comparison results CMP1 and CMP2 become the auto-zero potential $V_{AZ}$. Furthermore, the control signal PAC1 is controlled to be at the low level, and the control signal XPAC1 is controlled to be at the high level. Accordingly, the cutoff switch 330 is closed.

The timing control unit 220 sets the control signal AZSW to the high level at timing T1 to timing T8. Furthermore, at timing T1, the timing control unit 220 sets the control signal PAC1 to the high level and sets the control signal XPAC1 to the low level over a predetermined pulse period. Accordingly, the cutoff switch 330 is opened.

Within the period from timing T1 to timing T2, the DAC 230 sets the reference potential $V_{RMP}$, to be higher than a potential at the auto-zero time. Accordingly, the input transistor 312 is turned off, and outputs the comparison result CMP1 of the clamp potential $V_{CLP}$. The clamp potential at this time is higher than the clamp potential corresponding to the signal level, and this potential is set as $V_{CLPH}$. Within this period, the output transistor 317 is turned on, and outputs the comparison result CMP2 of a reset level $V_{VSLL}$. Furthermore, the inverter 350 outputs the high-level output signal VCO.

Here, the comparison results CMP1 and CMP2 and the output signal VCO do not actually instantaneously transition from one of the high level and the low level to the other, and a predetermined time corresponding to a time constant or the like is required until the transition is completed. However, in the drawing, for convenience of description, waveforms are illustrated as instantaneous transition.

Then, within the period from timing T2 to timing T4, the DAC 230 decreases the reference potential $V_{RMP}$ with the lapse of time. This period corresponds to an AD conversion period at the reset level. It is assumed that a difference between the reference potential $V_{RMP}$ and the input potential $V_{VSL}$ is less than the threshold voltage Vt of the input transistor 312 at timing T3 within this period. At this time, the input transistor 312 transitions to the ON state, and the comparison result CMP1 is inverted to the reset level $V_{VSLL}$. The output transistor 317 transitions to the OFF state, and the comparison result CMP2 is inverted to a clamp potential $V_{CLPH}$. The output signal VCO is inverted to the low level.

At timing T5, the timing control unit 220 sets the control signal PAC1 to the high level and sets the control signal XPAC1 to the low level over a predetermined pulse period. Accordingly, the cutoff switch 330 is opened.

Furthermore, during the period from timing T5 to timing T6, the DAC 230 sets the reference potential $V_{RMP}$, to be higher than a potential at the auto-zero time. Accordingly, the input transistor 312 is turned off, and outputs the comparison result CMP1 of the clamp potential $V_{CLP}$. The clamp potential at this time is lower than the clamp potential corresponding to a black level, and this potential is set as $V_{CLPL}$. Within this period, the output transistor 317 is turned on, and outputs the comparison result CMP2 of a signal level $V_{VSLL}$. Furthermore, the inverter 350 outputs the high-level output signal VCO.

Then, within the period from timing T6 to timing T8, the DAC 230 decreases the reference potential $V_{RMP}$ with the lapse of time. This period corresponds to an AD conversion period at the signal level. It is assumed that a difference between the reference potential $V_{RMP}$ and the input potential $V_{VSL}$ is less than the threshold voltage Vt at timing T7 within this period. At this time, the comparison result CMP1 is inverted to the signal level $V_{VSLL}$, and the comparison result CMP2 is inverted to the clamp potential $V_{CLPL}$. The output signal VCO is inverted to the low level.

As illustrated in the drawing, the timing control unit 220 controls the cutoff switch 330 to be opened over a predetermined pulse period at timing T1 and timing T5 immediately before the AD conversion period.

Figure 10:
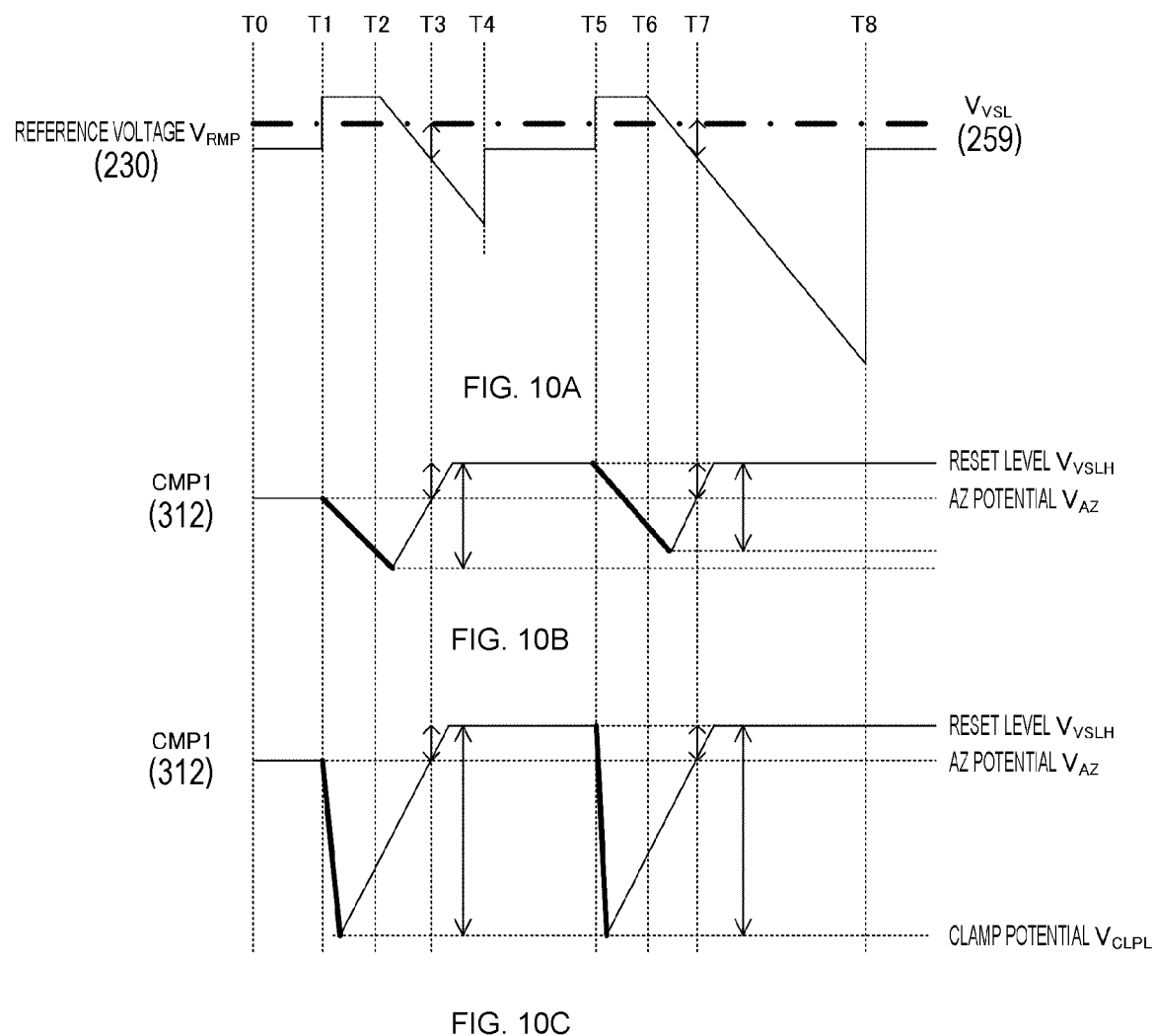
FIGS. 10A, 10B, and 10C are examples of a timing chart in a case where a black level is input within a signal level conversion period according to the first embodiment of the present technology.

FIGS. 10A, 10B, and 10C are examples of a timing chart in a case where the black level is input within a signal level conversion period according to the first embodiment of the present technology. In the drawing, FIG. 10A is a diagram illustrating an example of waveforms of a potential (input potential VVSL) of the vertical signal line 259 and the reference potential VRMP. In the drawing, FIG. 10B is a diagram illustrating an example of a waveform of the comparison result CMP1 in the comparative example in which the cutoff switch 330 is not provided. In the drawing, FIG. 10C is a diagram illustrating an example of a waveform of the comparison result CMP1 in the first embodiment in which the cutoff switch 330 is provided.

As illustrated by an alternate long and short dash line in FIG. 10A of the drawing, the substantially same black level as the reset level is input as the signal level.

As illustrated in FIG. 10B of the drawing, in the comparative example in which the cutoff switch 330 is not provided, a slope when the comparison result CMP1 transitions from the high level to the low level is gentle, and the time until the comparison result CMP1 transitions to the low level becomes long. A thick line in the drawing indicates a locus at the time of transition from the high level to the low level. Furthermore, immediately after timing T2 or timing T6, since the transition to the high level is started before the clamp potential decreases, amplitude from the low level to the high level is different between the time of conversion of the reset level and the time of conversion of the signal level. An arrow line between opposite ends in the drawing indicates the magnitude of the amplitude. Accordingly, the property of the comparator 300 is degraded.

On the other hand, as illustrated in FIG. 10C of the drawing, in a case where the cutoff switch 330 is provided, the slope at the time of the transition from the high level to the low level becomes steep due to the cut-off of the leakage current and the cut-off of the parasitic capacitor, and the time until the transition to the low level becomes short. Furthermore, since the transition to the high level is started after the decrease to the clamp potential, amplitude from the low level to the high level is the same between the time of conversion of the reset level and the time of conversion of the signal level. Accordingly, deterioration in the property of the comparator 300 can be suppressed.

Figure 11:
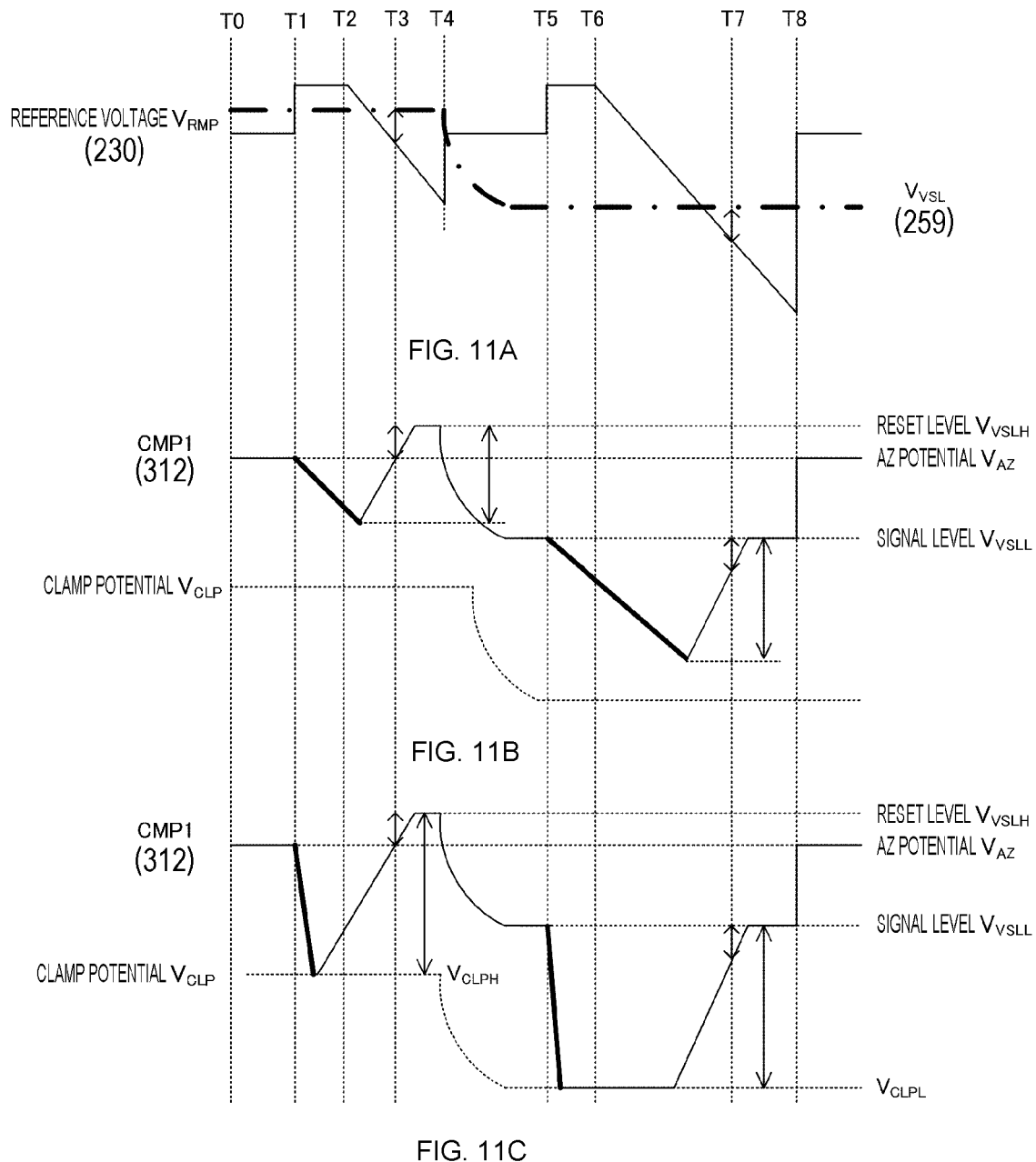
FIGS. 11A, 11B, and 11C are examples of a timing chart in a case where a white level is input within a signal level conversion period according to the first embodiment of the present technology.

FIGS. 11A, 11B, and 11C are examples of a timing chart in a case where a white level is input within a signal level conversion period according to the first embodiment of the present technology. In the drawing, FIG. 11A is a diagram illustrating an example of waveforms of a potential (input potential VVSL) of the vertical signal line 259 and the reference potential VRMP. In the drawing, FIG. 11B is a diagram illustrating an example of a waveform of the comparison result CMP1 in the comparative example in which the cutoff switch 330 is not provided. In the drawing, FIG. 11C is a diagram illustrating an example of a waveform of the comparison result CMP1 in the first embodiment in which the cutoff switch 330 is provided.

As illustrated by an alternate long and short dash line in FIG. 11A of the drawing, the white level lower than the reset level is input as the signal level.

As illustrated in FIG. 11B of the drawing, in the comparative example in which the cutoff switch 330 is not provided, the time until the comparison result CMP1 transitions to the low level becomes long. Furthermore, the amplitude from the low level to the high level is different between the time of conversion of the reset level and the time of conversion of the signal level.

On the other hand, as illustrated in FIG. 11C of the drawing, in a case where the cutoff switch 330 is provided, due to the cut-off of the leakage current and the cut-off of the parasitic capacitor, the time until the transition to the low level becomes short. Furthermore, the amplitude from the low level to the high level is the same between the time of conversion of the reset level and the time of conversion of the signal level.

Figure 12:
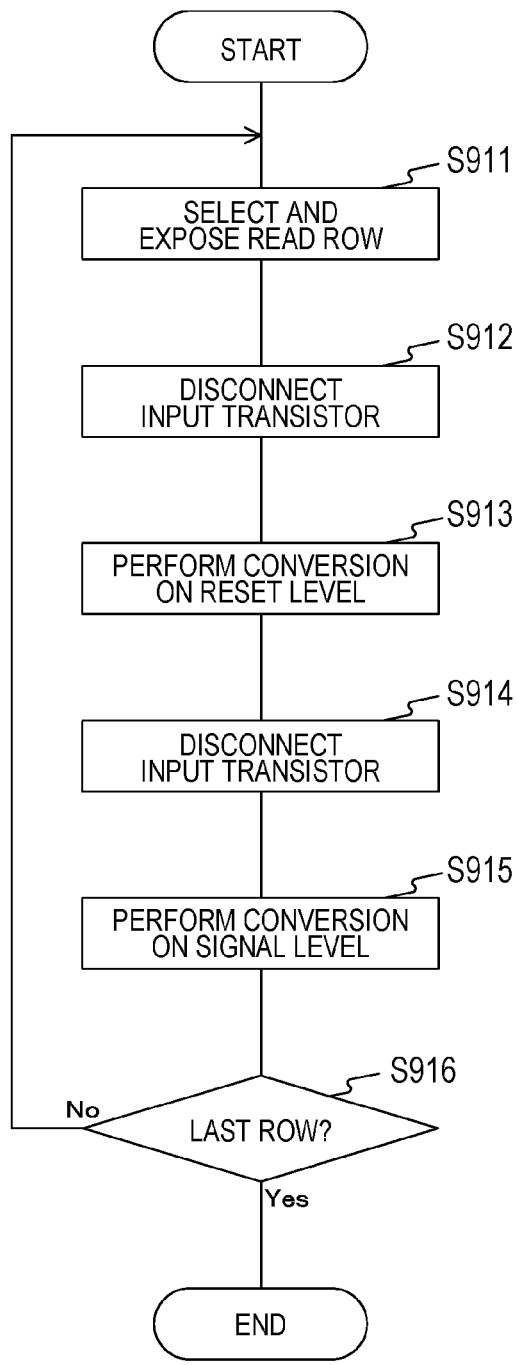
FIG. 12 is a flowchart illustrating an example of an operation of a solid-state imaging element according to the first embodiment of the present technology.

FIG. 12 is a flowchart illustrating an example of an operation of the solid-state imaging element 200 according to the first embodiment of the present technology. This operation is started, for example, when a predetermined application for capturing image data is executed.

The vertical scanning circuit 210 selects and exposes a read row (step S911). The cutoff switch 330 disconnects the input transistor 312 from the connection node 329 within the pulse period (step S912). The column signal processing unit 260 performs AD conversion on the reset level for each column (step S913). The cutoff switch 330 disconnects the input transistor 312 from the connection node 329 within the pulse period (step S914). The column signal processing unit 260 performs AD conversion on the signal level for each column (step S915). Then, the vertical scanning circuit 210 determines whether or not the read row is the last row (step S916).

In a case where the read row is not the last row (step S916: No), the solid-state imaging element 200 repeats step S911 and the subsequent steps. On the other hand, in a case where the read row is the last row (step S916: Yes), the solid-state imaging element 200 ends the operation for imaging.

Note that the operations of the timing chart illustrated in FIG. 9 corresponds to step S912 to step S915 in FIG. 12.

When a plurality of pieces of image data is continuously captured, step S911 to step S916 are repeatedly executed in synchronization with the vertical synchronization signal.

As described above, according to the first embodiment of the present technology, since the cutoff switch 330 disconnects the input transistor 312 from the connection node 329, it is possible to cut off the leakage current of the input transistor 312 and disconnect the parasitic capacitor from the connection node 329. Therefore, the responsiveness of the comparator 300 can be improved.

First Modification Example

In the first embodiment described above, the cutoff switch 330 including the nMOS transistor 331 and the pMOS transistor 332 is disposed for each column. However, in this configuration, the number of transistors increases as compared with a case where the cutoff switch 330 is realized by one transistor. The solid-state imaging element 200 according to the first modification example of the first embodiment is different from that of the first embodiment in that the cutoff switch 330 including only the nMOS transistor 331 is used.

Figure 13:
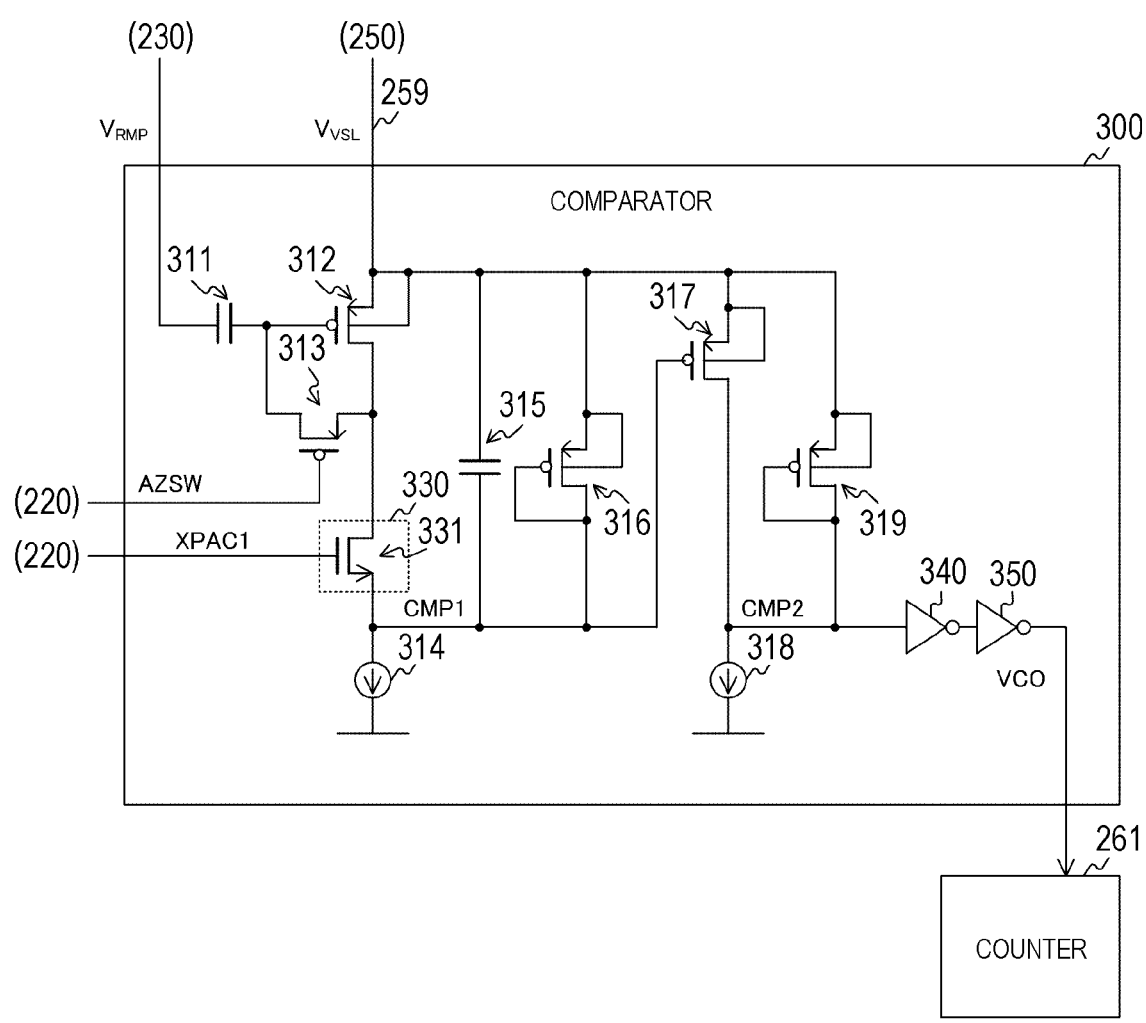
FIG. 13 is a circuit diagram illustrating a configuration example of a comparator according to a first modification example of the first embodiment of the present technology.

FIG. 13 is a circuit diagram illustrating a configuration example of the comparator 300 according to the first modification example of the first embodiment of the present technology. The comparator 300 according to the first modification example of the first embodiment is different from that of the first embodiment in that the cutoff switch 330 including only the nMOS transistor 331 is disposed. The waveform of the control signal XPAC1 for controlling the nMOS transistor 331 is similar to that of the first embodiment.

By realizing the cutoff switch 330 only with the nMOS transistor 331, the number of transistors can be reduced as compared with the case of using a pair of transistors (the nMOS transistor 331 and the pMOS transistor 332).

As described above, according to the first modification example of the first embodiment of the present technology, since the cutoff switch 330 including only the nMOS transistor 331 is used, the number of transistors can be reduced as compared with the case of using a pair of transistors.

Second Modification Example

In the first embodiment described above, the cutoff switch 330 including the nMOS transistor 331 and the pMOS transistor 332 is disposed for each column. However, in this configuration, the number of transistors increases as compared with a case where the cutoff switch 330 is realized by one transistor. The solid-state imaging element 200 according to the second modification example of the first embodiment is different from that of the first embodiment in that the cutoff switch 330 including only the pMOS transistor 332 is used.

Figure 14:
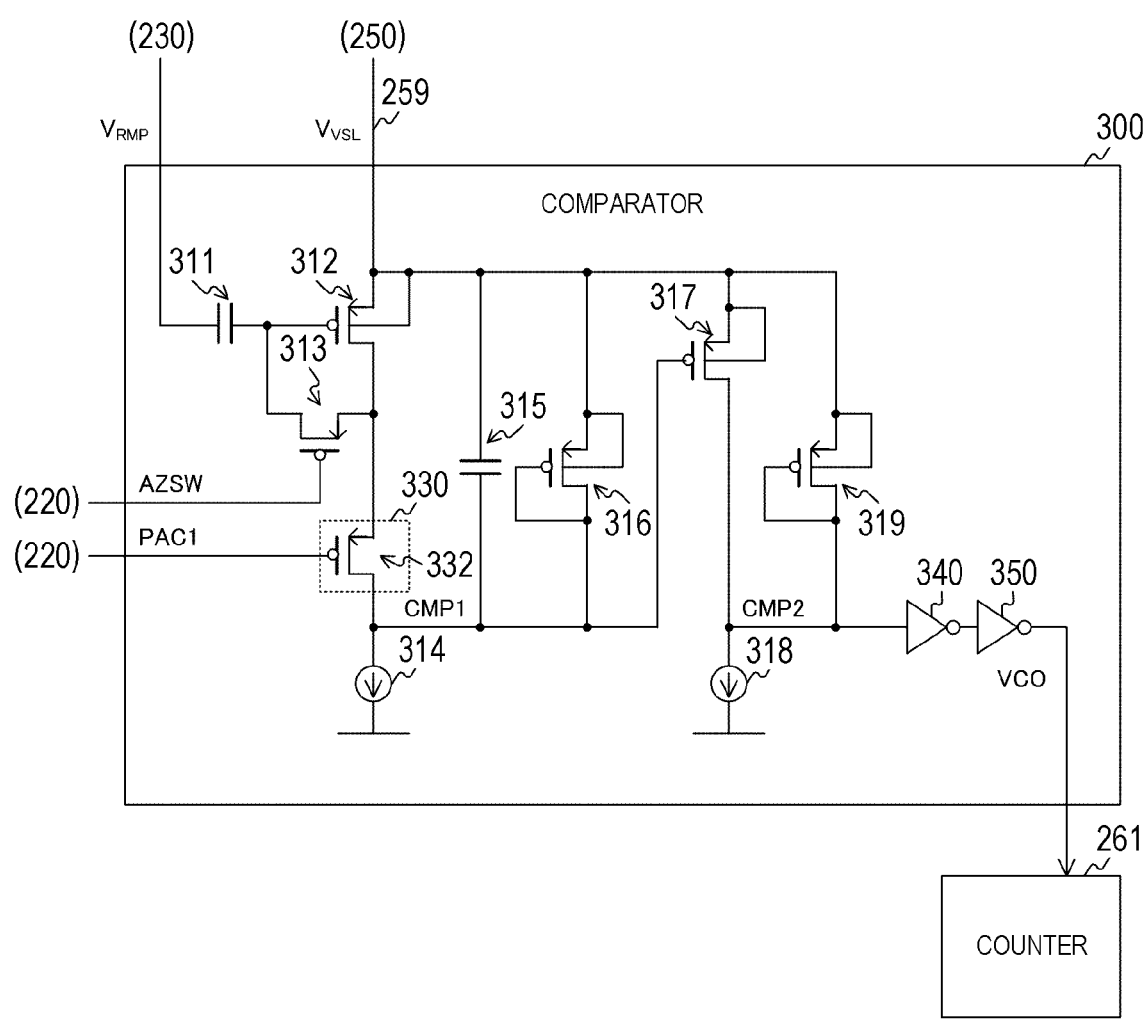
FIG. 14 is a circuit diagram illustrating a configuration example of a comparator according to a second modification example of the first embodiment of the present technology.

FIG. 14 is a circuit diagram illustrating a configuration example of the comparator 300 according to the second modification example of the first embodiment of the present technology. The comparator 300 according to the second modification example of the first embodiment is different from that of the first embodiment in that the cutoff switch 330 including only the pMOS transistor 332 is disposed. The waveform of the control signal PAC1 for controlling the pMOS transistor 332 is similar to that of the first embodiment.

By realizing the cutoff switch 330 only with the pMOS transistor 332, the number of transistors can be reduced as compared with the case of using a pair of transistors (the nMOS transistor 331 and the pMOS transistor 332).

Figure 15:
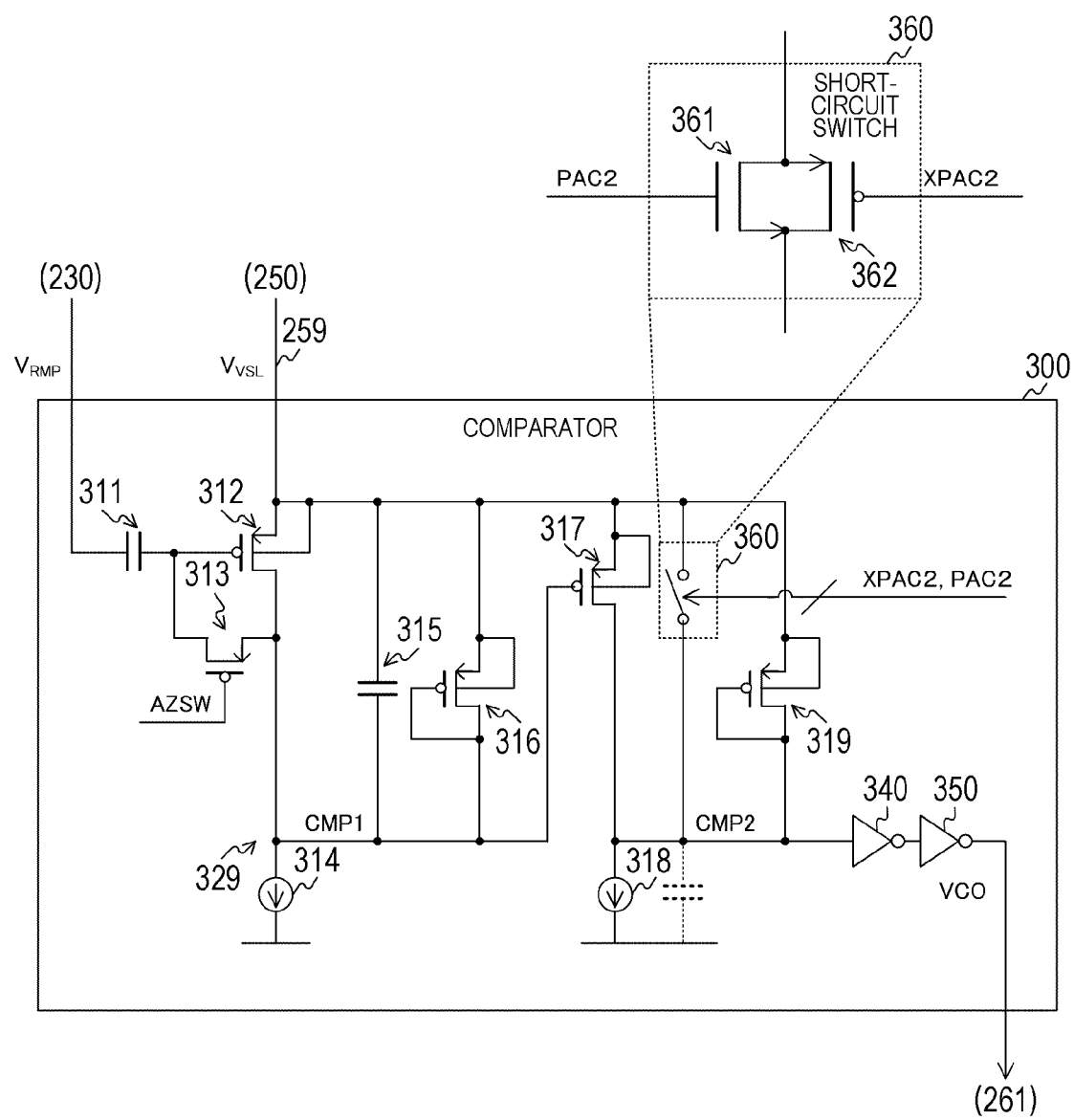
FIG. 15 is a circuit diagram illustrating a configuration example of a comparator according to a second embodiment of the present technology.

As illustrated in FIGS. 14 and 15, the cutoff switch 330 can be realized by only the nMOS transistor 331 or only the pMOS transistor 332. In a case where the level of the comparison result CMP1 of the first stage is relatively low, the nMOS transistor 331 is used. On the other hand, in a case where the level of the comparison result CMP1 of the first stage is relatively high, the pMOS transistor 332 is used. Furthermore, in a case where the level of the comparison result CMP2 is about an intermediate value of the power supply potential VDDB, both the nMOS transistor 331 and the pMOS transistor 332 are used as in the first embodiment.

As described above, according to the second modification example of the first embodiment of the present technology, since the cutoff switch 330 including only the pMOS transistor 332 is used, the number of transistors can be reduced as compared with the case of using a pair of transistors.

2. Second Embodiment

In the first embodiment described above, the time until the comparison result CMP1 transitions to the low level is shortened by the cutoff switch 330. However, the response speed until the comparison result CMP2 of the second stage is at the high level may not be able to be sufficiently increased by the cutoff switch 330. A solid-state imaging element 200 of the second embodiment is different from that of the first embodiment in that the responsiveness is improved by short-circuit of the source and the drain of the output transistor 317.

FIG. 15 is a circuit diagram illustrating a configuration example of the comparator 300 according to the second embodiment of the present technology. The comparator 300 of the second embodiment is different from that of the first embodiment in that an output-side short-circuit switch 360 is provided instead of the cutoff switch 330. Furthermore, the drain of the input transistor 312 of the second embodiment is connected to the connection node 329.

The output-side short-circuit switch 360 opens and closes a path between the source (in other words, vertical signal line 259) of the output transistor 317 and the drain of the output transistor 317 in accordance with control signals XPAC2 and PAC2 from the timing control unit 220.

The output-side short-circuit switch 360 includes, for example, an nMOS transistor 361 and a pMOS transistor 362 which are connected in parallel between the source and the drain of the output transistor 317. A control signal PAC2 is input to a gate of the nMOS transistor 361, and a control signal XPAC2 is input to a gate of the pMOS transistor 362. The control signal XPAC2 is a signal having a phase different from that of the control signal PAC2 by 180 degrees.

Note that the nMOS transistor 361 is an example of an N-type transistor described in the claims, and the pMOS transistor 362 is an example of a P-type transistor described in the claims.

The potential of the comparison result CMP2 of the second stage is a value within a range from the clamp potential $V_{CLP}$ to the input potential $V_{VSL}$. Furthermore, the comparison result CMP2 from the drain of the output transistor 317 transitions from a high level (input potential $V_{VSL}$) to a low level (clamp potential $V_{CLP}$) within a counting period (that is, the AD conversion period) of the counter 261. Therefore, it is necessary to initialize the drain of the output transistor 317 to the high level immediately before the AD conversion period.

Here, the speed (that is, the response speed) at which the comparison result CMP2 transitions to the high level according to the input is determined by a slew rate and a settling time. The slew rate of the second stage means a rising speed of the drain when a parasitic capacitor on the drain side of the output transistor 317 is charged with a charge current from the output transistor 317. The settling time of the second stage means a time until the potential of the drain transitions to the high level when an RC circuit including an output impedance of the output transistor 317 and the parasitic capacitor is considered. The capacitor indicated by a dotted line in the drawing indicates a parasitic capacitor.

Furthermore, the comparison result CMP2 of the second stage is interlocked with the comparison result CMP1 of the first stage, and when the response speed of the first stage decreases, the response speed of the second stage also decreases.

The timing control unit 220 controls the output-side short-circuit switch 360 to be closed over a predetermined pulse period at the timing of initialization to the high level. Accordingly, the source (vertical signal line 259) and the drain of the output transistor 317 are short-circuited. Since the potential of the vertical signal line 259 is at the high level (input potential $V_{VSL}$), the speed at which the comparison result CMP2 transitions to the high level can be increased due to the short-circuit. Furthermore, during the auto-zero period, the output-side short-circuit switch 360 is controlled to be closed.

FIG. 16 is a timing chart illustrating an example of an operation of the solid-state imaging element 200 according to the second embodiment of the present technology.

From timing T0 to timing T1, the timing control unit 220 sets the control signal PAC2 to the high level and sets the control signal XPAC2 to the low level during the auto-zero period. Accordingly, the cutoff switch 330 is closed.

Then, until the pulse period elapses from timing T1, the timing control unit 220 sets the control signal PAC2 to the high level and sets the control signal XPAC2 to the low level. After the pulse period, the control signal PAC2 is controlled to be at the low level, and the control signal XPAC2 is controlled to be at the high level. Accordingly, the cutoff switch 330 is opened.

At timing T5 at the time of the conversion period of the reset level, the timing control unit 220 sets the control signal PAC2 to the high level and sets the control signal XPAC1 to the low level over a predetermined pulse period. Accordingly, the output-side short-circuit switch 360 is closed. After the pulse period, the control signal PAC2 is controlled to be at the low level, and the control signal XPAC2 is controlled to be at the high level. Accordingly, the cutoff switch 330 is opened.

As illustrated in the drawing, the timing control unit 220 controls the output-side short-circuit switch 360 to be closed over a predetermined pulse period at timing T1 and timing T5 immediately before the AD conversion period. Accordingly, the speed (response speed) at which the comparison result CMP2 transitions to the high level can be increased.

Furthermore, the timing control unit 220 controls the output-side short-circuit switch 360 to be closed also within the auto-zero period from timing T0 to timing T1. A loop circuit is formed by the input transistor 312 of the first stage, the output transistor 317 of the second stage, and the vertical signal line 259, and there is a possibility that the loop circuit oscillates within the auto-zero period. However, the oscillation within the auto-zero period can be suppressed by controlling the output-side short-circuit switch 360 to be closed also within the auto-zero period.

FIGS. 17A, 17B, and 17C are examples of a timing chart in a case where the black level is input within a signal level conversion period according to the second embodiment of the present technology. In the drawing, FIG. 17A is a diagram illustrating an example of waveforms of a potential (input potential VVSL) of the vertical signal line 259 and the reference potential VRMP. In the drawing, FIG. 17B is a diagram illustrating an example of a waveform of the comparison result CMP2 in the comparative example in which the output-side short-circuit switch 360 is not provided. In the drawing, FIG. 17C is a diagram illustrating an example of a waveform of the comparison result CMP2 in the second embodiment in which the output-side short-circuit switch 360 is provided.

As illustrated in FIG. 17A of the drawing, the substantially same black level as the reset level is input as the signal level.

As illustrated in FIG. 17B of the drawing, in the comparative example in which the output-side short-circuit switch 360 is not provided, a slope when the comparison result CMP2 transitions from the low level to the high level is gentle, and the time until the comparison result CMP2 transitions to the high level becomes long. A thick line in the drawing indicates a locus at the time of transition from the low level to the high level.

Furthermore, immediately after timing T6, since the transition to the low level is started before reaching the reset level, the amplitude from the high level to the low level is different between the time of conversion of the reset level and the time of conversion of the signal level. Accordingly, the property of the comparator 300 is degraded.

On the other hand, as illustrated in FIG. 17C of the drawing, in a case where the output-side short-circuit switch 360 is provided, the time until the transition to the high level is shortened due to the short-circuit between the source (vertical signal line 259) and the drain of the output transistor 317. Furthermore, since the transition to the low level is started after reaching the reset level, the amplitude from the high level to the low level is the same between the time of conversion of the reset level and the time of conversion of the signal level. Accordingly, deterioration in the property of the comparator 300 can be suppressed.

Figures 18A, 18B, 18C:
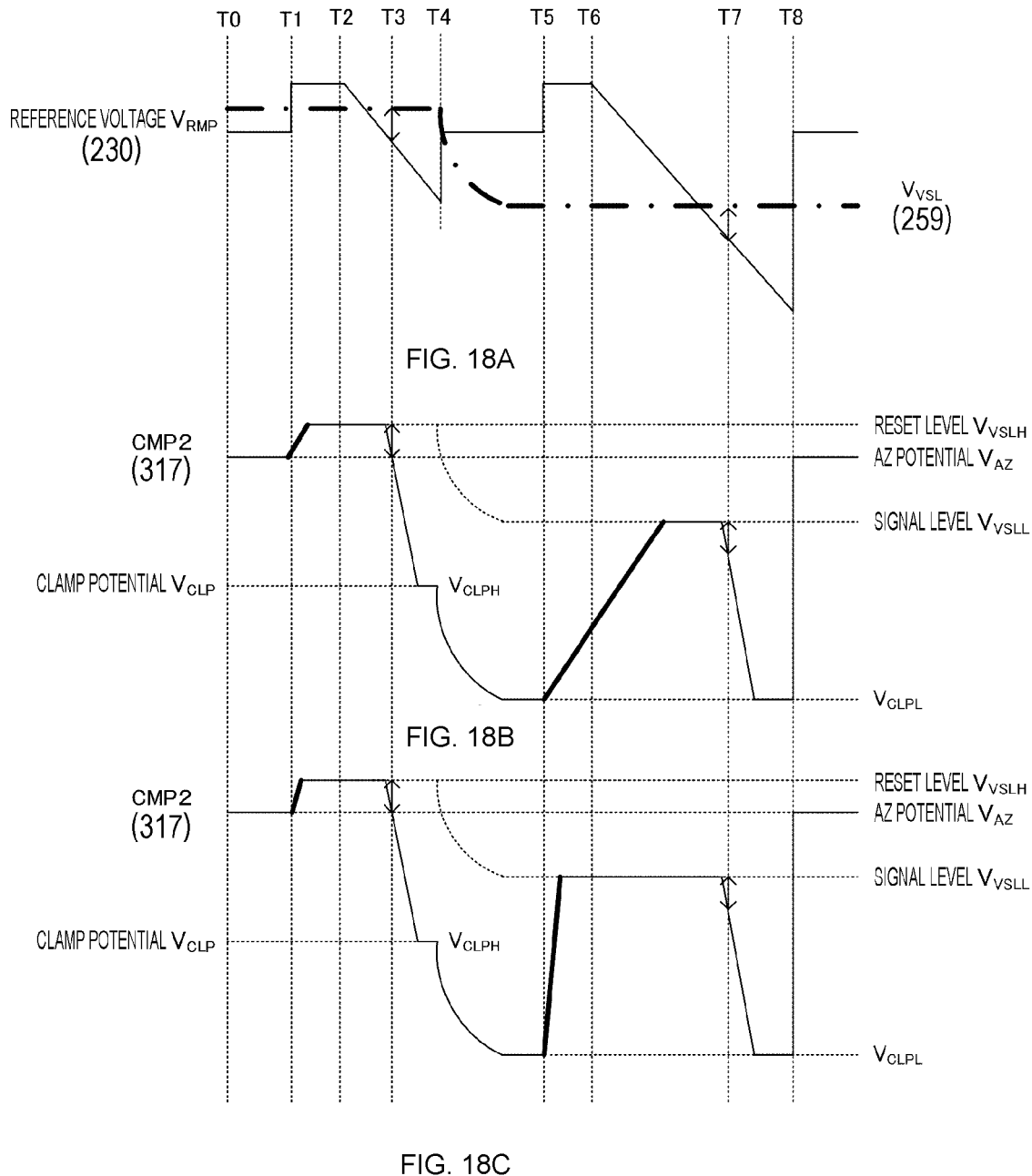
FIGS. 18A, 18B, and 18C are examples of a timing chart in a case where a white level is input within a signal level conversion period according to the second embodiment of the present technology.

FIGS. 18A, 18B, and 18C are examples of a timing chart in a case where the white level is input within a signal level conversion period according to the second embodiment of the present technology. In the drawing, FIG. 18A is a diagram illustrating an example of waveforms of a potential (input potential VVSL) of the vertical signal line 259 and the reference potential VRMP. In the drawing, FIG. 18B is a diagram illustrating an example of a waveform of the comparison result CMP2 in the comparative example in which the output-side short-circuit switch 360 is not provided. In the drawing, FIG. 18C is a diagram illustrating an example of a waveform of the comparison result CMP2 in the second embodiment in which the output-side short-circuit switch 360 is provided.

As illustrated in FIG. 18A of the drawing, the white level lower than the reset level is input as the signal level.

As illustrated in FIG. 18B of the drawing, in the comparative example in which the output-side short-circuit switch 360 is not provided, the time until the comparison result CMP2 transitions to the high level becomes long. Furthermore, the amplitude from the high level to the low level is different between the time of conversion of the reset level and the time of conversion of the signal level.

On the other hand, as illustrated in FIG. 18C of the drawing, in a case where the output-side short-circuit switch 360 is provided, the time until the transition to the high level is shortened due to the short-circuit. Furthermore, the amplitude from the high level to the low level is the same between the time of conversion of the reset level and the time of conversion of the signal level.

As described above, according to the second embodiment of the present technology, since the output-side short-circuit switch 360 short-circuits the source and the drain of the output transistor 317, the speed at which the comparison result CMP2 transitions to the potential (high level) of the source can be increased. Therefore, the responsiveness can be improved.

First Modification Example

In the second embodiment described above, the output-side short-circuit switch 360 including the nMOS transistor 361 and the pMOS transistor 362 is disposed for each column. However, in this configuration, the number of transistors increases as compared with a case where the output-side short-circuit switch 360 is realized by one transistor. The solid-state imaging element 200 according to the first modification example of the second embodiment is different from that of the first embodiment in that the output-side short-circuit switch 360 including only the nMOS transistor 361 is used.

Figure 19:
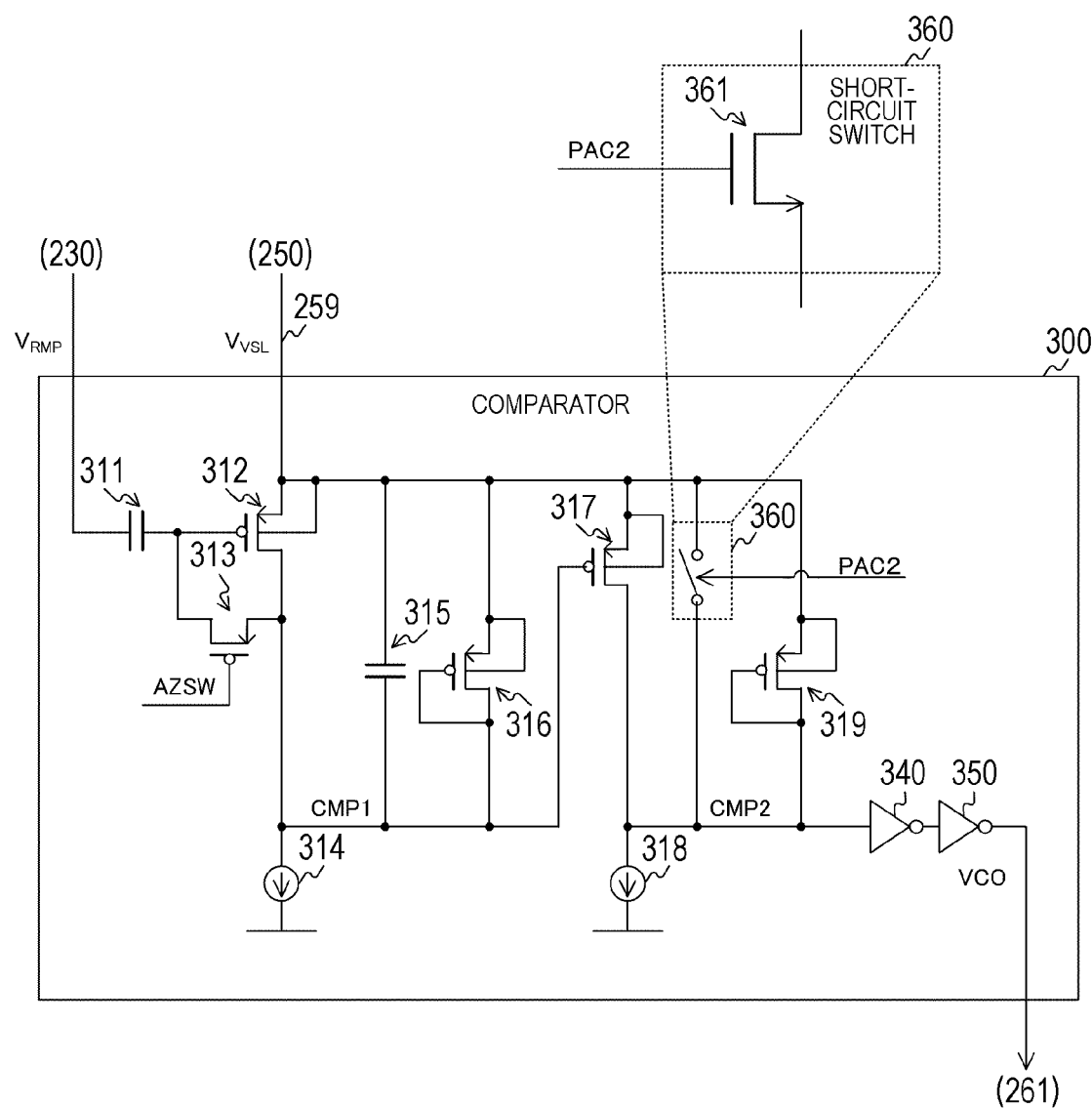
FIG. 19 is a circuit diagram illustrating a configuration example of a comparator according to a first modification example of the second embodiment of the present technology.

FIG. 19 is a circuit diagram illustrating a configuration example of the comparator 300 according to the first modification example of the second embodiment of the present technology. The comparator 300 according to the first modification example of the second embodiment is different from that of the second embodiment in that the output-side short-circuit switch 360 including only the nMOS transistor 361 is disposed. The waveform of the control signal PAC2 for controlling the nMOS transistor 361 is similar to that of the second embodiment.

By realizing the output-side short-circuit switch 360 only with the nMOS transistor 361, the number of transistors can be reduced as compared with the case of using a pair of transistors (the nMOS transistor 361 and the pMOS transistor 362).

As described above, according to the first modification example of the second embodiment of the present technology, since the output-side short-circuit switch 360 including only the nMOS transistor 361 is used, the number of transistors can be reduced as compared with the case of using a pair of transistors.

Second Modification Example

In the second embodiment described above, the output-side short-circuit switch 360 including the nMOS transistor 361 and the pMOS transistor 362 is disposed for each column. However, in this configuration, the number of transistors increases as compared with a case where the output-side short-circuit switch 360 is realized by one transistor. The solid-state imaging element 200 according to the second modification example of the second embodiment is different from that of the first embodiment in that the output-side short-circuit switch 360 including only the pMOS transistor 362 is used.

Figure 20:
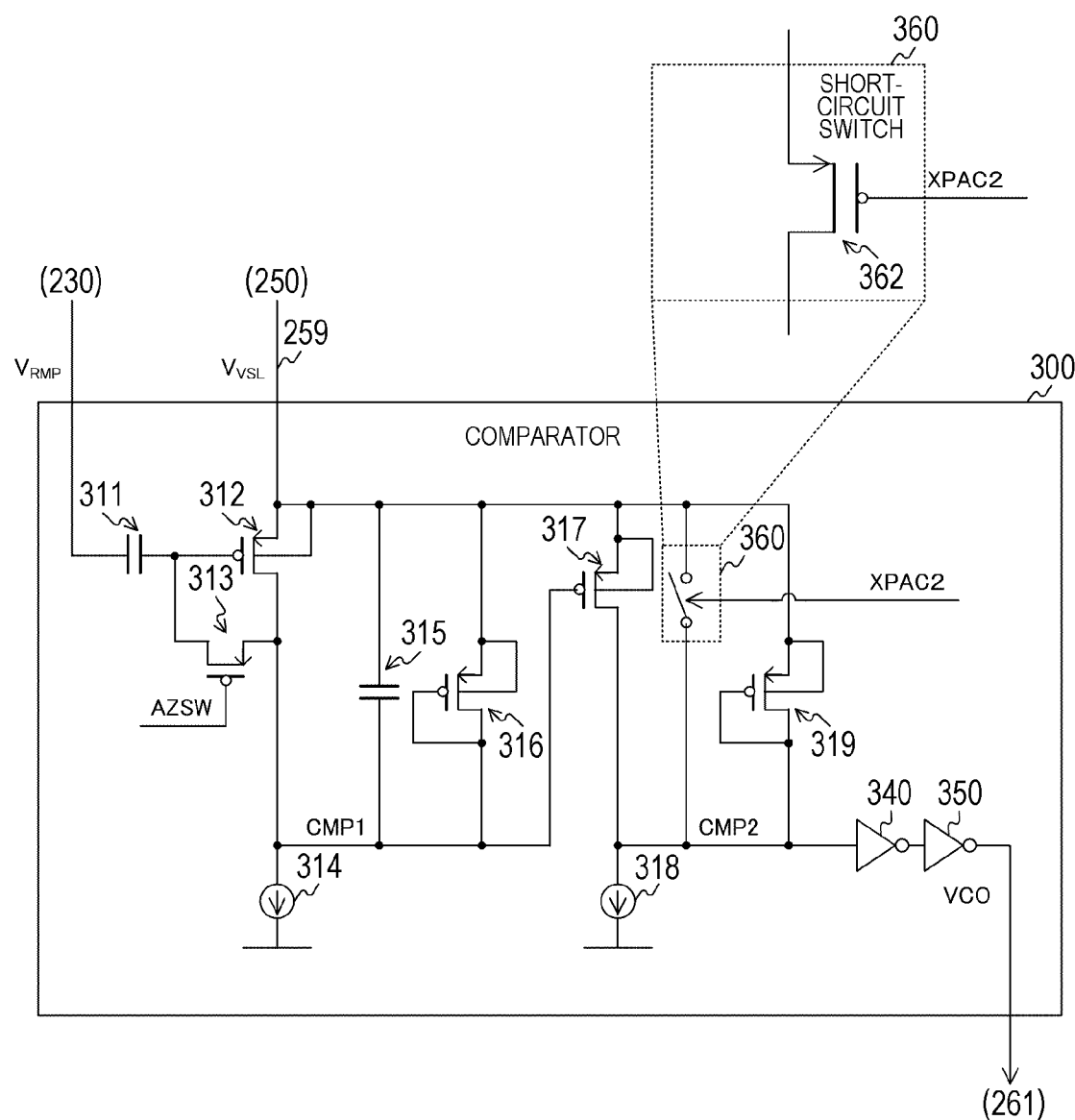
FIG. 20 is a circuit diagram illustrating a configuration example of a comparator according to a second modification example of the second embodiment of the present technology.

FIG. 20 is a circuit diagram illustrating a configuration example of the comparator 300 according to the second modification example of the second embodiment of the present technology. The comparator 300 according to the second modification example of the second embodiment is different from that of the second embodiment in that the output-side short-circuit switch 360 including only the pMOS transistor 362 is disposed. The waveform of the control signal XPAC2 for controlling the pMOS transistor 362 is similar to that of the second embodiment.

By realizing the output-side short-circuit switch 360 only with the pMOS transistor 362, the number of transistors can be reduced as compared with the case of using a pair of transistors (the nMOS transistor 361 and the pMOS transistor 362).

As illustrated in FIGS. 19 and 20, the output-side short-circuit switch 360 can be realized by only the nMOS transistor 361 or only the pMOS transistor 362. In a case where the level of the comparison result CMP2 of the second stage is relatively low, the nMOS transistor 361 is used. On the other hand, in a case where the level of the comparison result CMP2 of the second stage is relatively high, the pMOS transistor 362 is used. Furthermore, in a case where the level of the comparison result CMP2 is about an intermediate value of the power supply potential VDDB, both the nMOS transistor 361 and the pMOS transistor 362 are used as in the second embodiment.

As described above, according to the second modification example of the second embodiment of the present technology, since the output-side short-circuit switch 360 including only the pMOS transistor 362 is used, the number of transistors can be reduced as compared with the case of using a pair of transistors.

3. Third Embodiment

In the first embodiment described above, the time until the comparison result CMP1 transitions to the low level is shortened by the cutoff switch 330. However, the response speed until the comparison result CMP2 of the second stage is at the high level may not be able to be sufficiently increased only by the cutoff switch 330. A solid-state imaging element 200 of the third embodiment is different from that of the first embodiment in that the responsiveness is further improved by adding a switch for short-circuiting the source and the drain of the output transistor 317.

Figure 21:
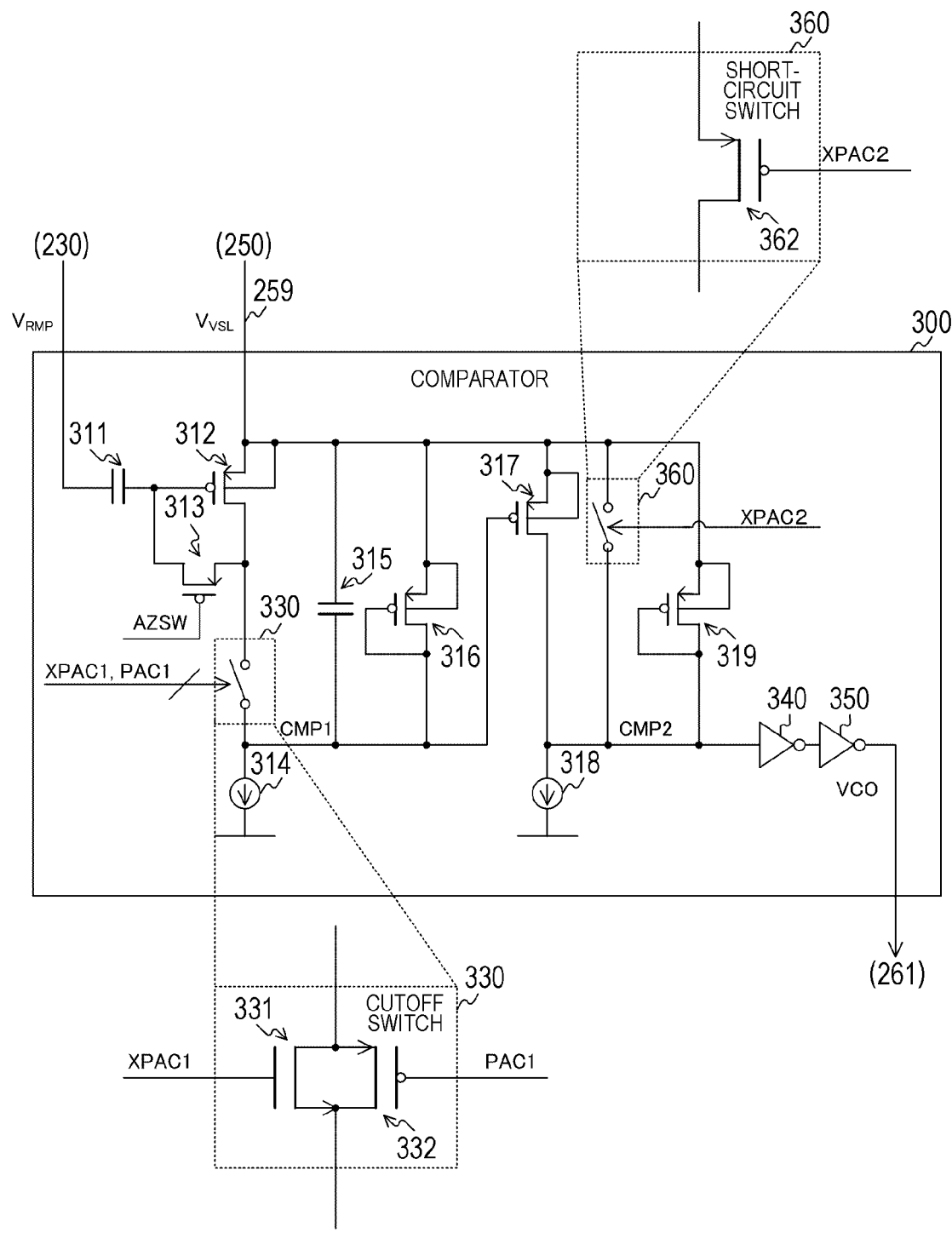
FIG. 21 is a circuit diagram illustrating a configuration example of a comparator according to a third embodiment of the present technology.

FIG. 21 is a circuit diagram illustrating a configuration example of a comparator 300 according to the third embodiment of the present technology. The comparator 300 of the third embodiment is different from that of the first embodiment in that an output-side short-circuit switch 360 is further provided. The output-side short-circuit switch 360 is realized only by the pMOS transistor 362, similarly to the second modification example of the second embodiment. The third embodiment is obtained by applying the second modification example of the second embodiment to the first embodiment.

By adding the output-side short-circuit switch 360, the speed at which the output of the second stage transitions to the high level can be increased, and the responsiveness of the comparator 300 can be further improved.

Note that both the nMOS transistor 331 and the pMOS transistor 332 are provided in the cutoff switch 330, but only one of the nMOS transistor 331 and the pMOS transistor 332 may be provided.

Furthermore, the output-side short-circuit switch 360 is realized only by the pMOS transistor 362, but the present disclosure is not limited to this configuration. Both the nMOS transistor 361 and the pMOS transistor 362 may be provided in the output-side short-circuit switch 360, but only the nMOS transistor 361 may be provided.

Figure 22:
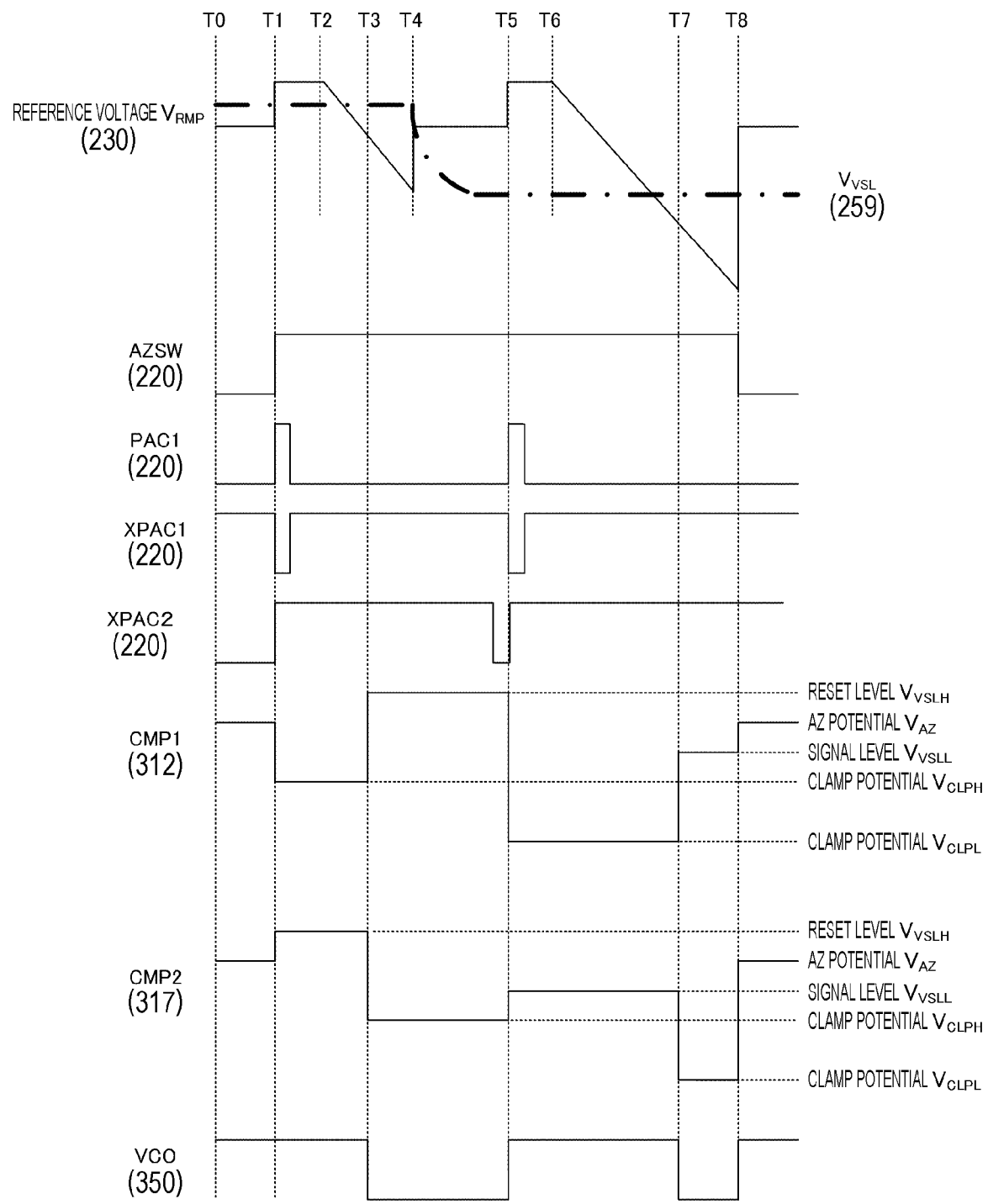
FIG. 22 is a timing chart illustrating an example of an operation of a solid-state imaging element according to the third embodiment of the present technology.

FIG. 22 is a timing chart illustrating an example of an operation of the solid-state imaging element 200 according to the third embodiment of the present technology. The timing control unit 220 further supplies the control signal XPAC2 to control the output-side short-circuit switch 360. The waveform of the control signal XPAC2 is similar to that of the second modification example of the second embodiment.

As described above, according to the third embodiment of the present technology, since the output-side short-circuit switch 360 short-circuits the source and the drain of the output transistor 317, the speed at which the comparison result CMP2 transitions to the potential (high level) of the source can be increased. Therefore, the responsiveness can be further improved.

4. Fourth Embodiment

In the above-described third embodiment, two transistors of the input transistor 312 and the output transistor 317 are disposed, but a transistor of the third stage having the same configuration as that of the output transistor 317 can be added. A solid-state imaging element 200 of the fourth embodiment is different from that of the third embodiment in that a transistor of the third stage is added.

Figure 23:
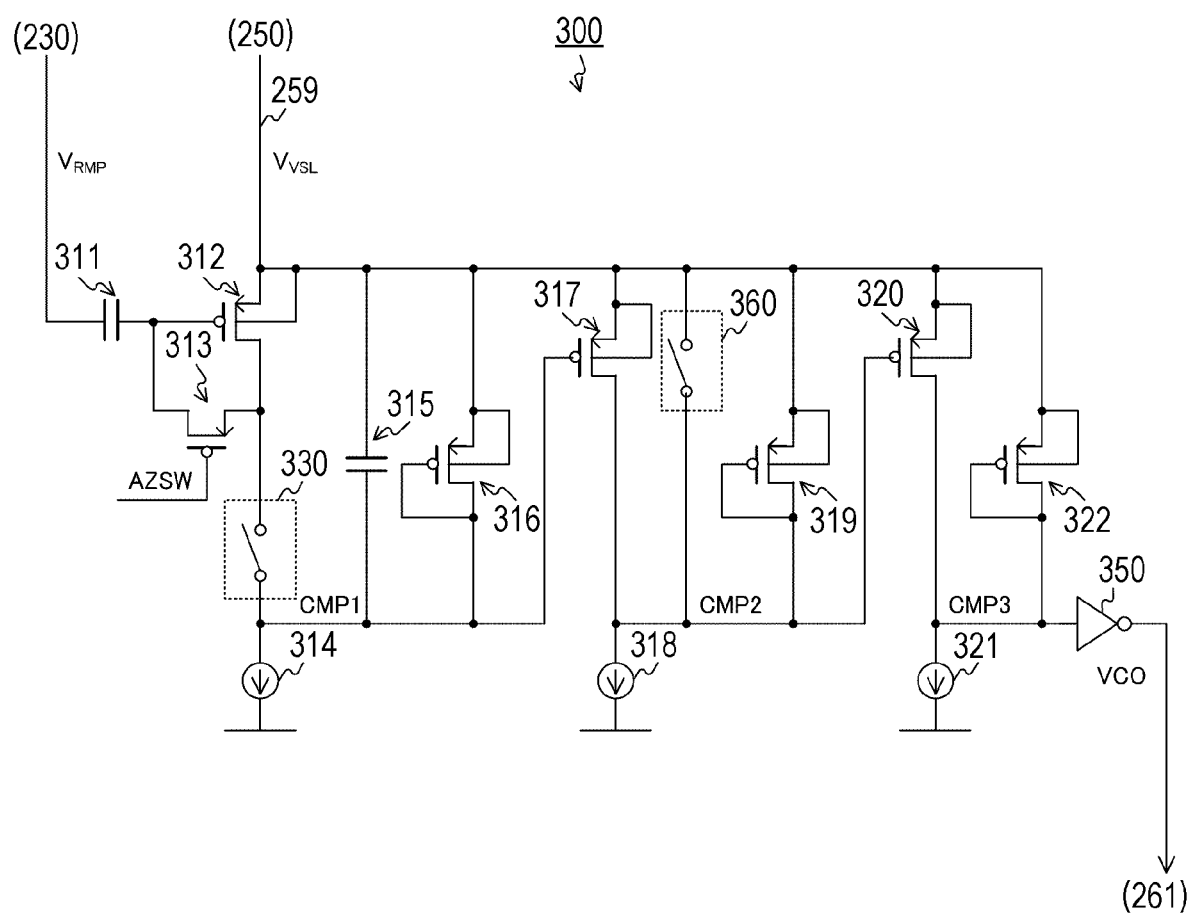
FIG. 23 is a circuit diagram illustrating a configuration example of a comparator according to a fourth embodiment of the present technology.

FIG. 23 is a circuit diagram illustrating a configuration example of a comparator 300 according to the fourth embodiment of the present technology. The comparator 300 of the fourth embodiment is different from that of the third embodiment in that an output transistor 320, a current source 321, and a clamp transistor 322 are included without the inverter 340 disposed.

A source of the output transistor 320 is connected to the vertical signal line 259, and the input potential $V_{VSL}$ is input to the source of the output transistor 320. Furthermore, a gate of the output transistor 320 is connected to a drain of the output transistor 317 of the second stage, and the comparison result CMP2 is input. As the output transistor 320 of the third stage, for example, the pMOS transistor is used. Furthermore, a back gate and the source of the output transistor 320 are desirably short-circuited.

The output transistor 320 outputs, from the drain, a signal indicating whether or not a difference between the input potential $V_{VSL}$ input to the source and the comparison result CMP2 input to the gate exceeds a predetermined threshold voltage as a comparison result CMP3. The comparison result CMP3 is input to the inverter 350. Note that the output transistor 320 is an example of a second output transistor described in the claims.

The current source 321 is inserted between the drain of the output transistor 320 and the reference potential VSSB, and supplies a constant current. The current source 321 is realized by the nMOS transistor or the like.

The clamp transistor 322 is inserted between the source and the drain of the output transistor 320. The pMOS transistor is used as the clamp transistor 322, and the gate of the clamp transistor 322 is short-circuited to the drain. Furthermore, the back gate and the source of the clamp transistor 322 are desirably short-circuited.

When the output-side short-circuit switch 360 of the second stage transitions to an ON state immediately before the AD conversion period, the gate-source voltage of the third stage approaches zero, the output transistor 320 is forcibly turned off, and the comparison result CMP3 transitions to the clamp potential. Therefore, unlike the first stage, the cutoff switch 330 is unnecessary in the third stage.

As illustrated in the drawing, since the output transistor 320 is added to the third stage, the inverter 340 is removed.

Note that both the cutoff switch 330 and the output-side short-circuit switch 360 are disposed, but only one of the cutoff switch 330 and the output-side short-circuit switch 360 can be disposed. Furthermore, both the nMOS transistor and the pMOS transistor may be provided in each of the cutoff switch 330 and the output-side short-circuit switch 360, but only one of the nMOS transistor and the pMOS transistor may be provided.

Furthermore, a transistor equivalent to the output transistor 320 can be further added to be set as the four or more stages. In this case, a switch equivalent to the output-side short-circuit switch 360 may be provided in even-numbered stages after the fourth stage, but the switch may not be provided in odd-numbered stages.

As described above, in the fourth embodiment of the present technology, since the output transistor 320 that determines whether or not a difference between the input potential $V_{VSL}$ and the comparison result CMP2 exceeds a predetermined threshold voltage is added to the third stage, a gain of the comparator 300 increases, and linearity is improved.

5. Fifth Embodiment

In the above-described third embodiment, the cutoff switch 330 disconnects the drain of the input transistor 312 from the connection node 329 immediately before AD conversion, and the input transistor 312 transitions to an OFF state. However, in this configuration, the drain of the input transistor 312 in the OFF state becomes a high impedance node. Since the potential of the high impedance node easily varies due to capacitive coupling, the potential of the gate of the input transistor 312 varies due to the variation, and there is a possibility that the property of the comparator 300 is deteriorated. A solid-state imaging element 200 of the fifth embodiment is different from that of the third embodiment in that the property deterioration is suppressed by short-circuit of the source and the drain of the input transistor 312.

Figure 24:
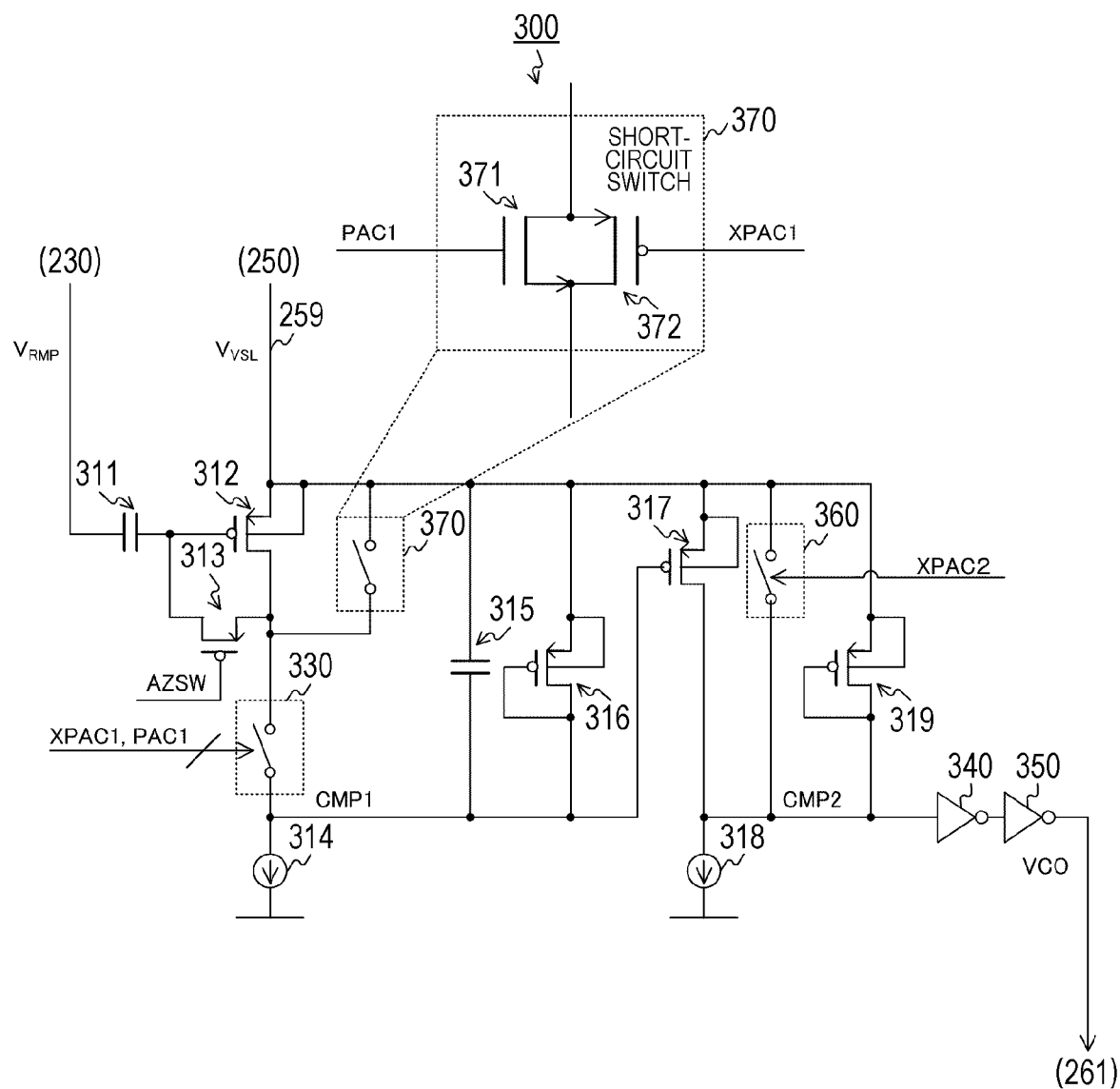
FIG. 24 is a circuit diagram illustrating a configuration example of a comparator according to a fifth embodiment of the present technology.

FIG. 24 is a circuit diagram illustrating a configuration example of a comparator 300 according to the fifth embodiment of the present technology. The comparator 300 of the fifth embodiment further includes an input-side short-circuit switch 370.

The input-side short-circuit switch 370 opens and closes a path between the source (vertical signal line 259) and the drain of the input transistor 312 in accordance with control signals PAC1 and XPAC1.

Furthermore, the input-side short-circuit switch 370 includes, for example, an nMOS transistor 371 and a pMOS transistor 372 which are connected in parallel between the source and the drain of the input transistor 312. The control signal PAC1 is input to a gate of the nMOS transistor 371, and the control signal XPAC1 is input to a gate of the pMOS transistor 372.

In accordance with the control signals PAC1 and XPAC1, the input-side short-circuit switch 370 is closed when the cutoff switch 330 is opened, and short-circuits the source and the drain of the input transistor 312. Therefore, the drain of the input transistor 312 can be prevented from becoming a high impedance node, and the property deterioration can be suppressed.

Note that both the cutoff switch 330 and the output-side short-circuit switch 360 are disposed, but only one of the cutoff switch 330 and the output-side short-circuit switch 360 can be disposed. Furthermore, both the nMOS transistor and the pMOS transistor may be provided in each of the cutoff switch 330, the output-side short-circuit switch 360, and the input-side short-circuit switch 370, but only one of the nMOS transistor and the pMOS transistor may be provided. Furthermore, the fourth embodiment can also be applied to the fifth embodiment.

As described above, according to the fifth embodiment of the present technology, since the input-side short-circuit switch 370 short-circuits the source and the drain of the input transistor 312, the drain of the input transistor 312 can be prevented from being in a high impedance state. Accordingly, deterioration in the property of the comparator 300 can be suppressed.

6. Sixth Embodiment

In the above-described third embodiment, the output transistor 317 inputs the comparison result CMP2 to the inverter 340. However, when a voltage range is narrow, there is a possibility that malfunction and a leakage current of the inverter 340 occurs. A solid-state imaging element 200 of the sixth embodiment is different from that of the third embodiment in that a level-shift circuit for expanding the voltage range is added.

Figure 25:
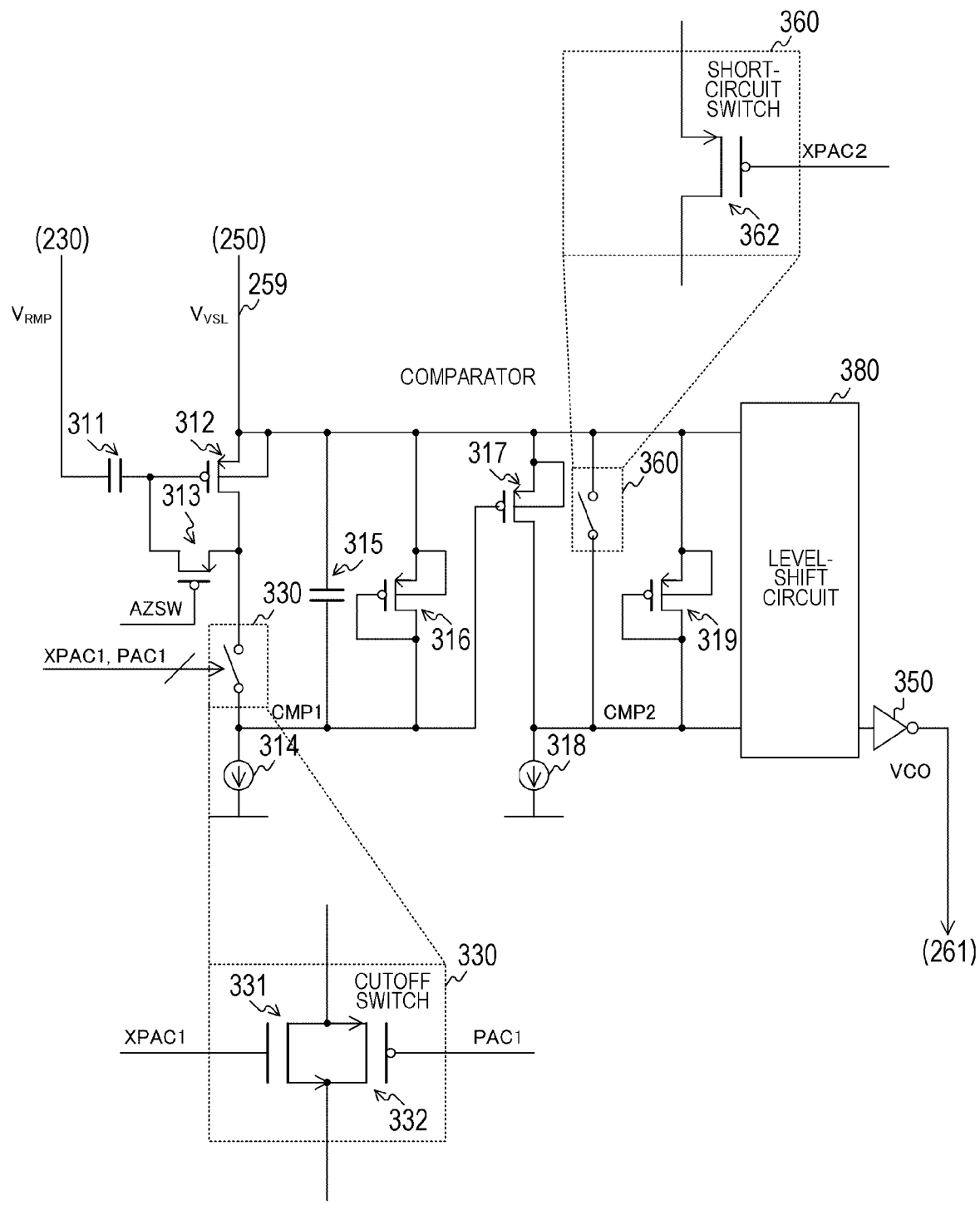
FIG. 25 is a circuit diagram illustrating a configuration example of a comparator according to a sixth embodiment of the present technology.

FIG. 25 is a circuit diagram illustrating a configuration example of a comparator 300 according to the sixth embodiment of the present technology. The comparator 300 of the sixth embodiment is different from that of the third embodiment in that a level-shift circuit 380 is further provided without providing the inverter 340.

The level-shift circuit 380 outputs, as an output signal, any one of a pair of potentials (in other words, high level and low level) having a potential difference greater than the input potential $V_{VSL}$ and the clamp potential $V_{CLP}$ on the basis of the comparison result CMP2 to the inverter 350. The high level is set to, for example, a power supply potential higher than the input potential $V_{VSL}$. The low level is set to, for example, a reference potential lower than the clamp potential $V_{CLP}$. Note that input potential $V_{VSL}$ and the clamp potential $V_{CLP}$ indicate an example of a pair of output potentials described in the claims. The power supply potential and the reference potential indicate an example of a pair of shift potentials described in the claims.

By providing the level-shift circuit 380, the voltage range on the input side of the inverter 350 can be expanded as compared with the third embodiment. Due to the expansion of the voltage range, a difference between a lower limit or an upper limit of the range and a threshold of the inverter 350 becomes sufficiently large, and malfunction and a leakage current of the inverter 350 can be prevented. Accordingly, design restriction for preventing malfunction and a leakage current of the inverter 350 are relaxed, and the degree of freedom in design is improved. Note that the level-shift circuit 380 expands both a voltage range on the power supply side and a voltage range on the ground side, but may expand the voltage range on only one side.

Note that both the cutoff switch 330 and the output-side short-circuit switch 360 are disposed, but only one of the cutoff switch 330 and the output-side short-circuit switch 360 can be disposed. Furthermore, both the nMOS transistor and the pMOS transistor may be provided in each of the cutoff switch 330, the output-side short-circuit switch 360, and the input-side short-circuit switch 370, but only one of the nMOS transistor and the pMOS transistor may be provided. Furthermore, the fourth embodiment and the fifth embodiment can also be applied to the sixth embodiment.

Figure 26:
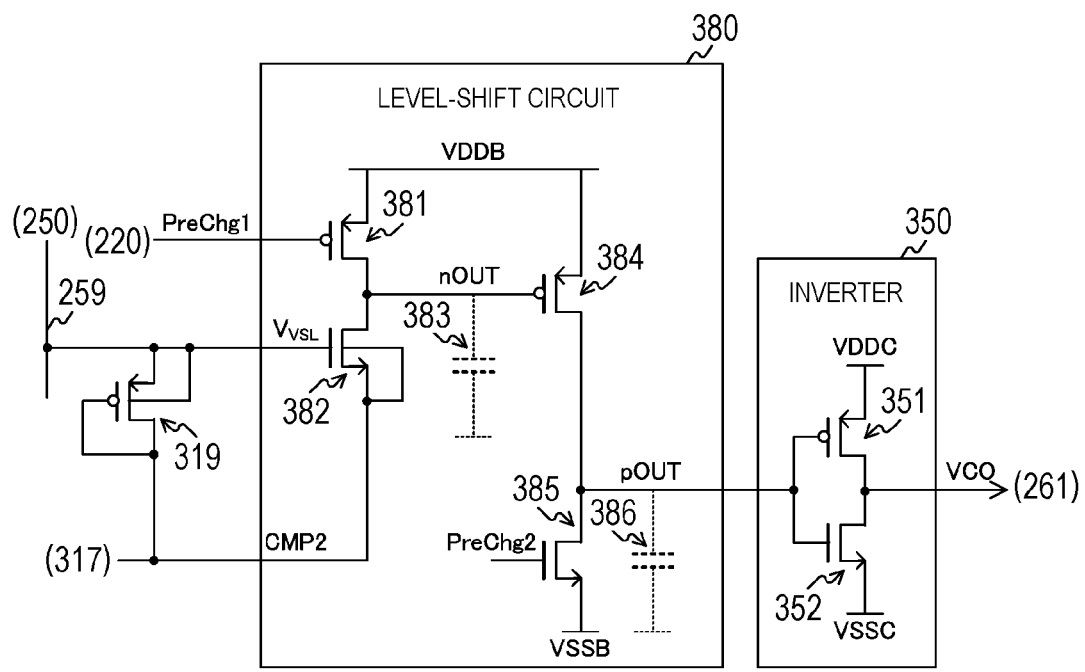
FIG. 26 is a circuit diagram illustrating a configuration example of a level-shift circuit according to the sixth embodiment of the present technology.

FIG. 26 is a circuit diagram illustrating a configuration example of the level-shift circuit 380 according to the sixth embodiment of the present technology.

The level-shift circuit 380 includes a precharge transistor 381, an nMOS transistor 382, a pMOS transistor 384, and a precharge transistor 385. As the precharge transistor 381, for example, the pMOS transistor is used. As the precharge transistor 385, for example, the nMOS transistor is used.

A source of the precharge transistor 381 is connected to the power supply potential VDDB, and a control signal PreChg1 from the timing control unit 220 is input to the gate. A drain of the precharge transistor 381 is connected to a drain of the nMOS transistor 382. Here, a power supply potential VDDB is a potential different from a power supply potential VDDA of the pixel circuit 250 and a power supply potential VDDC of the inverter.

Furthermore, a gate of the nMOS transistor 382 is connected to the vertical signal line 259, and the comparison result CMP2 from the output transistor 317 is input to a source of the nMOS transistor 382. Furthermore, a connection node between the precharge transistor 381 and the nMOS transistor 382 is connected to a gate of the pMOS transistor 384, and an output signal nOUT is output from the connection node. A back gate and a source of the nMOS transistor 382 are short-circuited.

A source of the pMOS transistor 384 is connected to the power supply potential VDDB, and the gate of the pMOS transistor 384 is connected to the connection node between the precharge transistor 381 and the nMOS transistor 382. An output signal pOUT is output from the connection node between the pMOS transistor 384 and the precharge transistor 381. A drain of the pMOS transistor 384 is connected to a drain of the precharge transistor 385.

A source of the precharge transistor 385 is connected to the reference potential VSSB, and a control signal PreChg2 is input to a gate of the precharge transistor 385. Furthermore, the connection node between the pMOS transistor 384 and the precharge transistor 385 is connected to the inverter 350, and the output signal pOUT is output from the connection node between the pMOS transistor 384 and the precharge transistor 385.

Note that the precharge transistor 381 is an example of a power-supply-side precharge transistor described in the claims. The nMOS transistor 382 is an example of an N-type transistor described in the claims. The pMOS transistor 384 is an example of a P-type transistor described in the claims. The precharge transistor 385 is an example of a reference-side precharge transistor described in the claims.

The timing control unit 220 turns on the precharge transistors 381 and 385 with the control signals PreChg1 and PreChg2 immediately before the AD conversion period. The precharge transistor 381 in the ON state precharges a parasitic capacitor 383 and initializes the drain of the nMOS transistor 382 to the power supply potential VDDB. Furthermore, the precharge transistor 385 in the ON state precharges a parasitic capacitor 386 and initializes the drain of the nMOS transistor 382 to the reference potential VSSB. Furthermore, during the AD conversion period, the precharge transistors 381 and 385 are controlled to be turned off.

At the time of starting the AD conversion, the comparison result CMP2 becomes the input potential $V_{VSL}$ (high level). At this time, the nMOS transistor 382 is turned off, and the power supply potential VDDB of the precharged parasitic capacitor 383 is output as the output signal nOUT. In accordance with the output signal nOUT, the pMOS transistor 384 is turned off, and the reference potential VSSB of the precharged parasitic capacitor 386 is output as the output signal pOUT.

Then, when the comparison result CMP2 is inverted to the clamp potential $V_{CLP}$ (low level), the nMOS transistor 382 transitions to the ON state, and the potential of the output signal nOUT is inverted to the clamp potential $V_{CLP}$. Then, in accordance with the output signal nOUT, the pMOS transistor 384 transitions to the ON state, and the potential of the output signal pOUT is inverted to the power supply potential VDDB.

Note that it can be configured that the pMOS transistor 384 and the precharge transistor 385 are not provided. In this case, the inverter 340 is added, and the output signal nOUT is output to the inverter 340. Furthermore, the back gate of the nMOS transistor 382 can be grounded.

Figure 27:
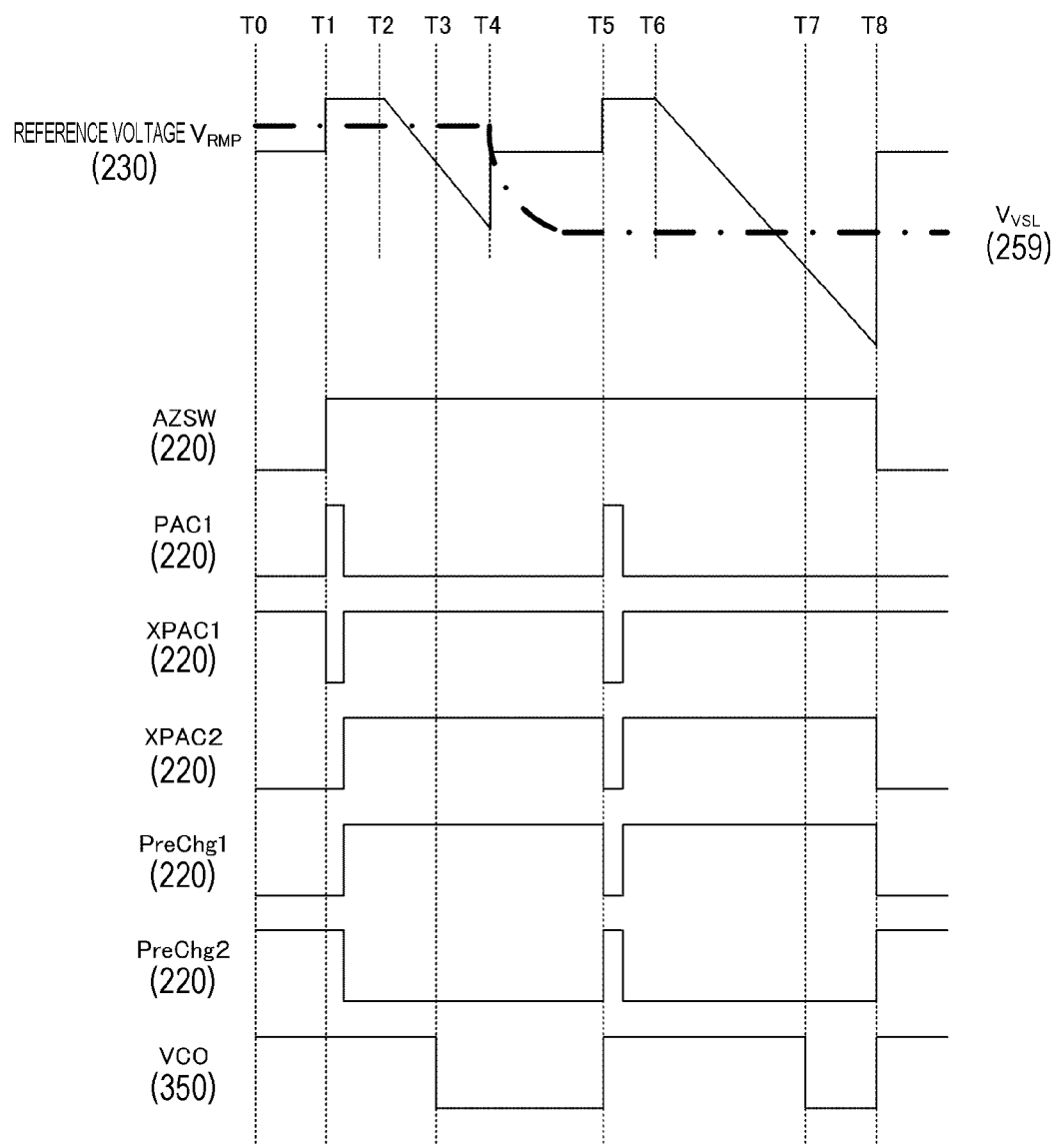
FIG. 27 is a timing chart illustrating an example of an operation of a solid-state imaging element according to the sixth embodiment of the present technology.

FIG. 27 is a timing chart illustrating an example of an operation of the solid-state imaging element 200 according to the sixth embodiment of the present technology.

The timing control unit 220 sets the control signal PreChg1 to the low level and sets the control signal PreChg2 to the high level during a period from timing T0 to a timing immediately after timing T1 (when a pulse period has elapsed from timing T1). Accordingly, the precharge transistors 381 and 385 perform precharging. Until timing T5 after that, the control signal PreChg1 is controlled to the high level, and the control signal PreChg2 is controlled to the low level.

Furthermore, the timing control unit 220 sets the control signal PreChg1 to the low level and sets the control signal PreChg2 to the high level over a period from timing T5 to the pulse period to cause the precharge transistors 381 and 385 to perform precharging. Until timing T8 after that, the control signal PreChg1 is controlled to the high level, and the control signal PreChg2 is controlled to the low level.

During the auto-zero period from timing T0 to timing T1 in the drawing, since the output of the second stage (comparison result CMP2) is at the auto-zero potential $V_{AZ}$, when the output-side short-circuit switch 360 is opened during the auto-zero period, a potential difference is generated between the gate and the source of the nMOS transistor 382. There is a possibility that due to this potential difference, the nMOS transistor 382 is turned on, and a leakage current flows from the power supply potential VDDB to the precharge transistor 381, the nMOS transistor 382, and the current source 318. However, as illustrated in the drawing, within the auto-zero period, the output-side short-circuit switch 360 is controlled to be closed by the control signal XPAC2, and thus the nMOS transistor 382 is turned off. As described above, by closing the output-side short-circuit switch 360 within the auto-zero period, it is possible to prevent the leakage current in addition to suppressing of the oscillation.

As described above, according to the sixth embodiment of the present technology, since the level-shift circuit 380 outputs any one of a pair of potentials having a potential difference greater than the input potential $V_{VSL}$ and the clamp potential $V_{CLP}$, a voltage range on the input side of the inverter 350 can be expanded. Due to the expansion of the voltage range, a difference between a lower limit or an upper limit of the range and a threshold of the inverter 350 becomes sufficiently large, and malfunction and a leakage current of the inverter 350 can be prevented. Accordingly, design restriction for a power supply voltage or a threshold for preventing the malfunction and the leakage current is relaxed and the degree of freedom in design can be improved.

7. Seventh Embodiment

In the above-described first embodiment, a ramp signal of which the level (reference potential $V_{RMP}$) gradually decreases within the AD conversion period is used, but a ramp signal of which the level gradually increases can also be used. A solid-state imaging element 200 of the seventh embodiment is different from that of the first embodiment in that the ramp signal of which the level gradually increases is used.

Figure 28:
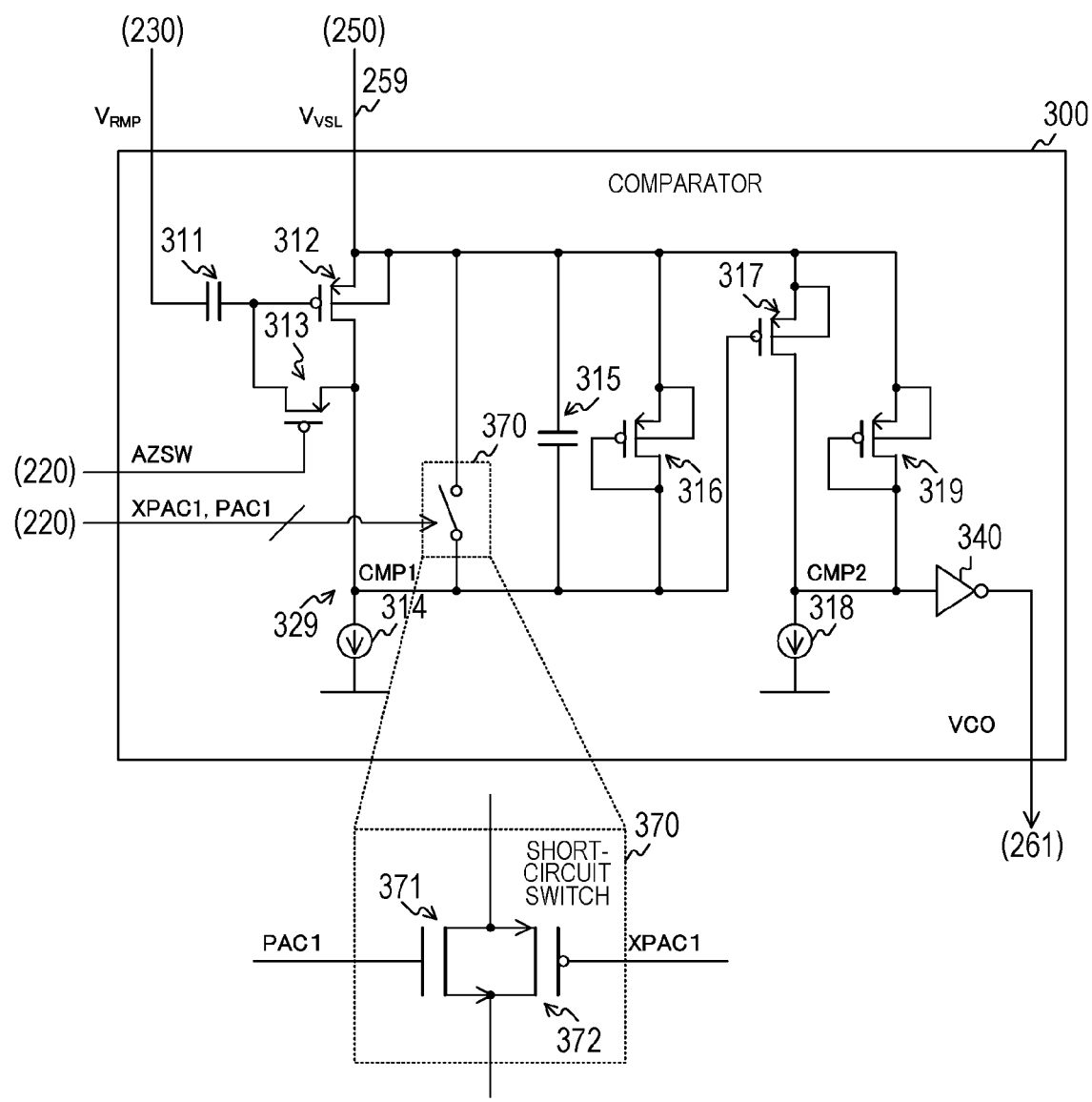
FIG. 28 is a circuit diagram illustrating a configuration example of a comparator according to a seventh embodiment of the present technology.

FIG. 28 is a circuit diagram illustrating a configuration example of a comparator 300 according to the seventh embodiment of the present technology. The comparator 300 of the seventh embodiment is different from that of the first embodiment in that an input-side short-circuit switch 370 is further provided without providing the cutoff switch 330 and the inverter 350.

The input-side short-circuit switch 370 opens and closes a path between the source (vertical signal line 259) and the drain of the input transistor 312 in accordance with control signals PAC1 and XPAC1.

Furthermore, the input-side short-circuit switch 370 includes, for example, an nMOS transistor 371 and a pMOS transistor 372 which are connected in parallel between the source and the drain of the input transistor 312. The control signal PAC1 is input to a gate of the nMOS transistor 371, and the control signal XPAC1 is input to a gate of the pMOS transistor 372.

Figure 29:
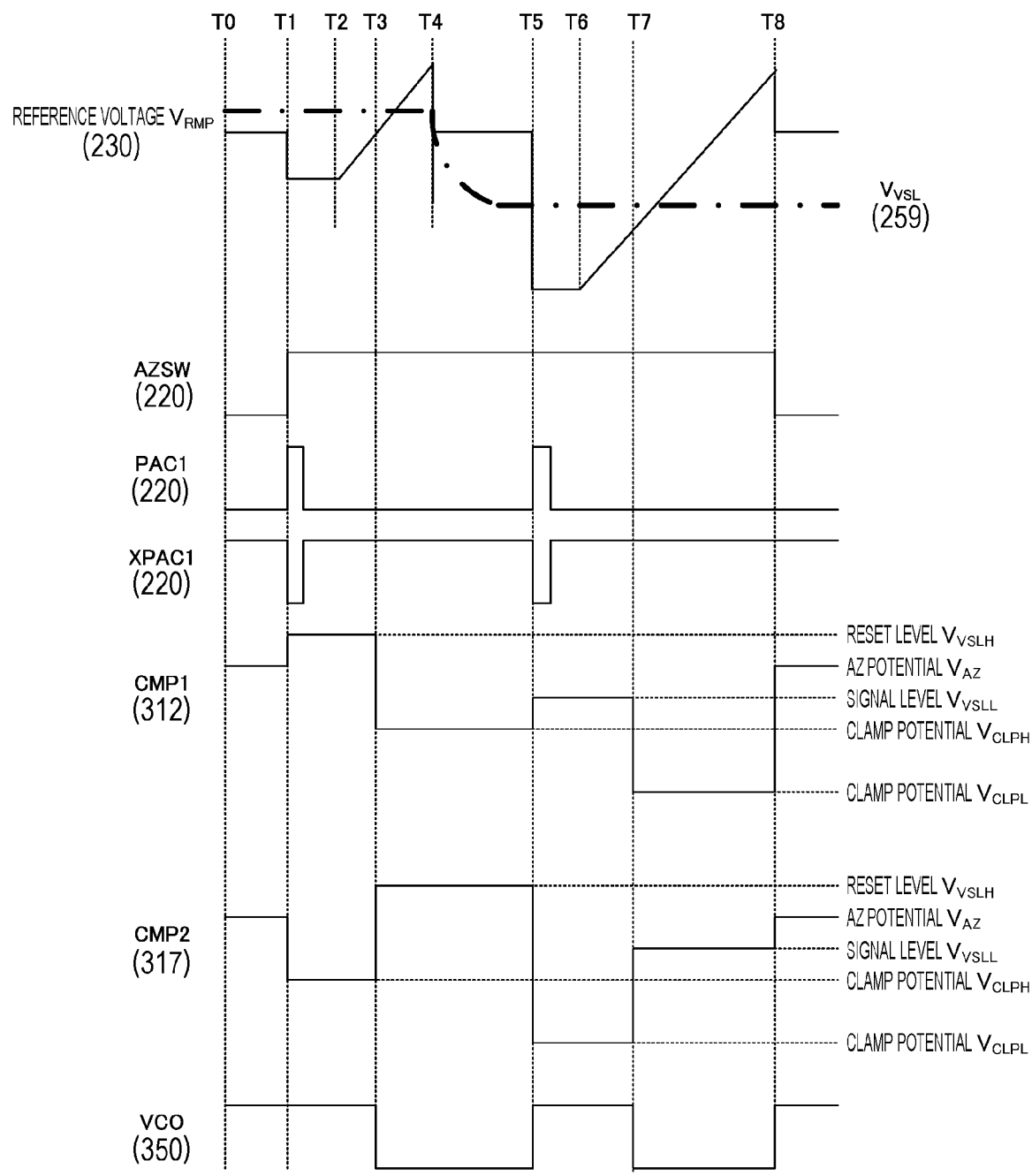
FIG. 29 is a timing chart illustrating an example of an operation of a solid-state imaging element according to the seventh embodiment of the present technology.

FIG. 29 is a timing chart illustrating an example of an operation of the solid-state imaging element 200 according to the seventh embodiment of the present technology.

In an auto-zero period from timing T0 to timing T1, the DAC 230 sets the reference potential $V_{RMP}$, to an auto-zero potential $V_{AZ}$. Furthermore, the timing control unit 220 sets the control signal AZSW to the low level. Accordingly, the comparison results CMP1 and CMP2 become the auto-zero potential $V_{AZ}$. Furthermore, the control signal PAC1 is controlled to be at the low level, and the control signal XPAC1 is controlled to be at the high level. Accordingly, the input-side short-circuit switch 370 is opened.

The timing control unit 220 sets the control signal AZSW to the high level at timing T1 to timing T8. Furthermore, at timing T1, the timing control unit 220 sets the control signal PAC1 to the high level and sets the control signal XPAC1 to the low level over a predetermined pulse period. Accordingly, the input-side short-circuit switch 370 is closed.

Within the period from timing T1 to timing T2, the DAC 230 sets the reference potential $V_{RMP}$, to be lower than a potential at the auto-zero time. Accordingly, the input transistor 312 is turned on, and outputs the comparison result CMP1 at a reset level $V_{VSLH}$. Within this period, the output transistor 317 is turned off, and outputs the comparison result CMP2 of a clamp potential $V_{CLPH}$. Furthermore, the inverter 350 outputs the high-level output signal VCO.

Then, within the period from timing T2 to timing T4, the DAC 230 increases the reference potential $V_{RMP}$ with the lapse of time. This period corresponds to an AD conversion period at the reset level. It is assumed that a difference between the reference potential $V_{RMP}$ and the input potential $V_{VSL}$ is less than the threshold voltage Vt of the input transistor 312 at timing T3 within this period. At this time, the input transistor 312 transitions to the OFF state, and the comparison result CMP1 is inverted to the clamp potential $V_{CLPH}$. The output transistor 317 transitions to the ON state, and the comparison result CMP2 is inverted to the reset level $V_{VSLH}$. The output signal VCO is inverted to the low level.

At timing T5, the timing control unit 220 sets the control signal PAC1 to the high level and sets the control signal XPAC1 to the low level over a predetermined pulse period. Accordingly, the input-side short-circuit switch 370 is closed.

Furthermore, within the period from timing T5 to timing T6, the DAC 230 sets the reference potential $V_{RMP}$ to be lower than a potential at the auto-zero time. Accordingly, the input transistor 312 is turned on, and outputs the comparison result CMP1 at the signal level $V_{VSLL}$. Within this period, the output transistor 317 is turned off, and outputs the comparison result CMP2 of a clamp potential $V_{CLPL}$. Furthermore, the inverter 350 outputs the high-level output signal VCO.

Then, within the period from timing T6 to timing T8, the DAC 230 increases the reference potential $V_{RMP}$ with the lapse of time. This period corresponds to an AD conversion period at the signal level. It is assumed that a difference between the reference potential $V_{RMP}$ and the input potential $V_{VSL}$ is less than the threshold voltage Vt at timing T7 within this period. At this time, the comparison result CMP1 is inverted to the clamp potential $V_{CLPL}$, and the comparison result CMP2 is inverted to the signal level $V_{VSLL}$. The output signal VCO is inverted to the low level.

As illustrated in the drawing, in a case where the ramp signal of which the level gradually increases is used, it is necessary to increase the speed at which the output of the first stage transitions to the high level. Therefore, the input-side short-circuit switch 370 is provided in the first stage. In this case, the cutoff switch 330 for increasing the speed of transition to the low level is unnecessary.

As described above, according to the seventh embodiment of the present technology, since the ramp signal of which the level gradually increases is used, the responsiveness can be improved by the input-side short-circuit switch 370.

First Modification Example

In the above-described seventh embodiment, the input-side short-circuit switch 370 including the nMOS transistor 371 and the pMOS transistor 372 is disposed for each column. However, in this configuration, the number of transistors increases as compared with a case where the input-side short-circuit switch 370 is realized by one transistor. The solid-state imaging element 200 according to the first modification example of the seventh embodiment is different from that of the seventh embodiment in that the input-side short-circuit switch 370 including only the nMOS transistor 371 is used.

Figure 30:
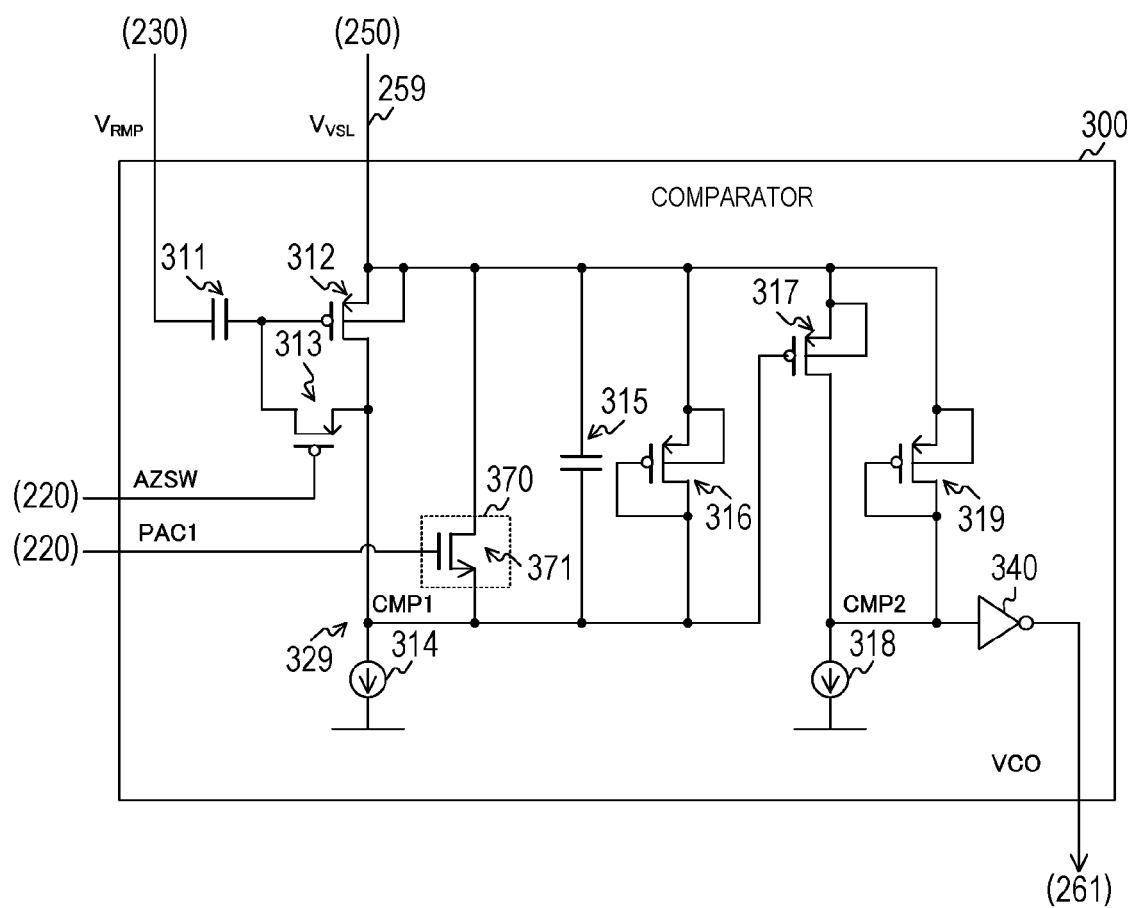
FIG. 30 is a circuit diagram illustrating a configuration example of a comparator according to a first modification example of the seventh embodiment of the present technology.

FIG. 30 is a circuit diagram illustrating a configuration example of the comparator 300 according to the first modification example of the seventh embodiment of the present technology. The comparator 300 according to the first modification example of the seventh embodiment is different from that of the first embodiment in that the input-side short-circuit switch 370 including only the nMOS transistor 371 is disposed. The waveform of the control signal PAC1 for controlling the nMOS transistor 371 is similar to that of the seventh embodiment.

As described above, according to the first modification example of the seventh embodiment of the present technology, since the input-side short-circuit switch 370 including only the nMOS transistor 371 is used, the number of transistors can be reduced as compared with the case of using a pair of transistors.

Second Modification Example

In the above-described seventh embodiment, the input-side short-circuit switch 370 including the nMOS transistor 371 and the pMOS transistor 372 is disposed for each column. However, in this configuration, the number of transistors increases as compared with a case where the input-side short-circuit switch 370 is realized by one transistor. The solid-state imaging element 200 according to the second modification example of the seventh embodiment is different from that of the first embodiment in that the input-side short-circuit switch 370 including only the pMOS transistor 372 is used.

Figure 31:
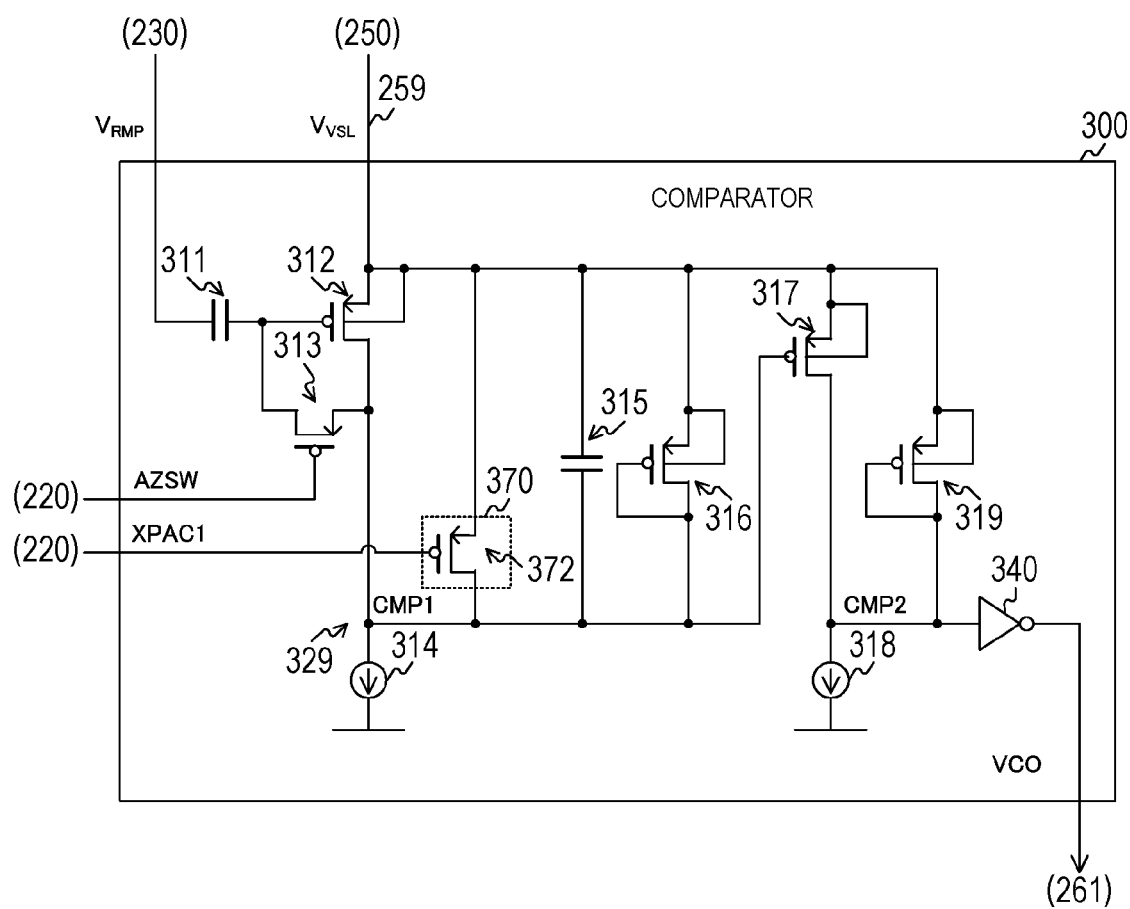
FIG. 31 is a circuit diagram illustrating a configuration example of a comparator according to a second modification example of the seventh embodiment of the present technology.

FIG. 31 is a circuit diagram illustrating a configuration example of the comparator 300 according to the second modification example of the seventh embodiment of the present technology. The comparator 300 according to the second modification example of the seventh embodiment is different from that of the seven embodiment in that the input-side short-circuit switch 370 including only the pMOS transistor 372 is disposed. The waveform of the control signal XPAC1 for controlling the pMOS transistor 372 is similar to that of the seventh embodiment.

As described above, according to the second modification example of the seventh embodiment of the present technology, since the input-side short-circuit switch 370 including only the pMOS transistor 372 is used, the number of transistors can be reduced as compared with the case of using a pair of transistors.

Third Modification Example

In the above-described seventh embodiment, two transistors of the input transistor 312 and the output transistor 317 are disposed, but a transistor of the third stage having the same configuration as that of the output transistor 317 can be added. The solid-state imaging element 200 according to the third modification example of the seventh embodiment is different from that of the seventh embodiment in that a transistor of the third stage is added.

Figure 32:
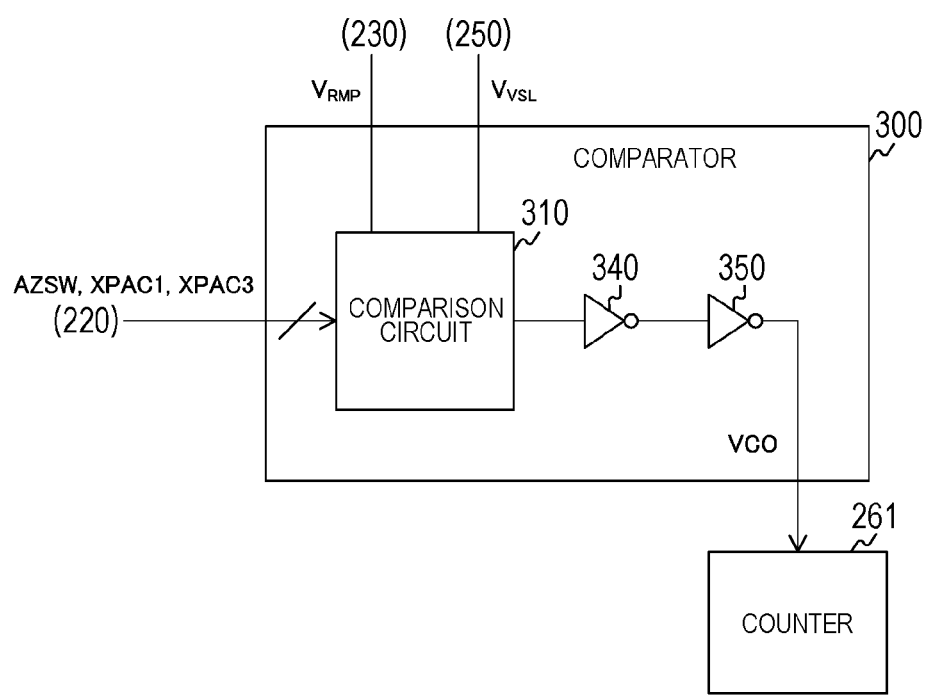
FIG. 32 is a block diagram illustrating a configuration example of a comparator according to a third modification example of the seventh embodiment of the present technology.

FIG. 32 is a block diagram illustrating a configuration example of the comparator 300 according to the third modification example of the seventh embodiment of the present technology. The comparator 300 according to the third modification example of the seventh embodiment includes a comparison circuit 310 and inverters 340 and 350.

Figure 33:
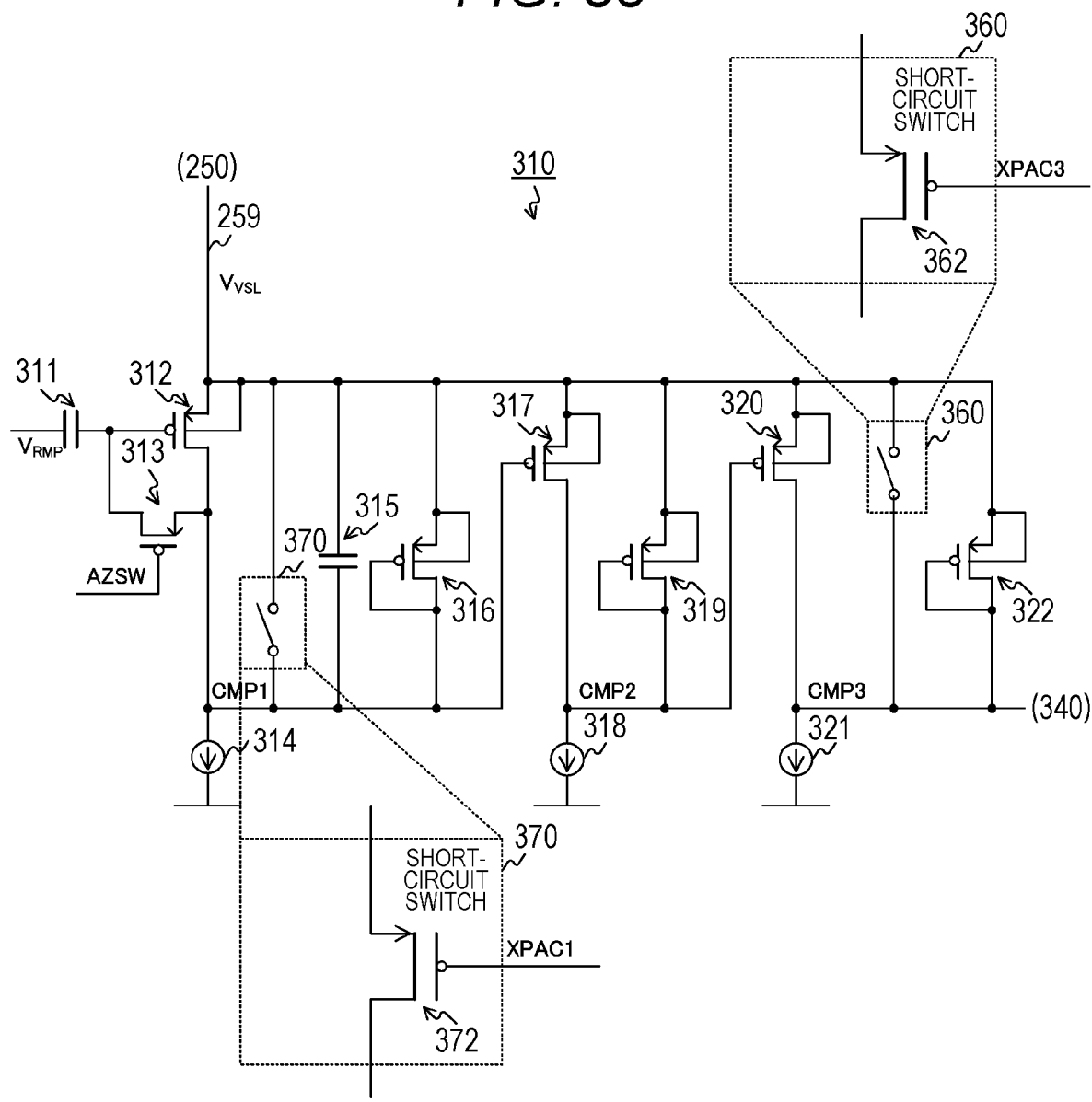
FIG. 33 is a circuit diagram illustrating a configuration example of a comparison circuit according to the third modification example of the seventh embodiment of the present technology.

FIG. 33 is a circuit diagram illustrating a configuration example of the comparison circuit 310 according to the third modification example of the seventh embodiment of the present technology. The comparison circuit 310 includes, in the first stage, an input capacitor 311, an input transistor 312, an auto-zero transistor 313, an input-side short-circuit switch 370, a current source 314, a band-limit capacitor 315, and a clamp transistor 316. Furthermore, the comparison circuit 310 includes, in the second stage, an output transistor 317, a current source 318, and a clamp transistor 319. The comparison circuit 310 includes, in the third stage, an output transistor 320, a current source 321, a clamp transistor 322, and an output-side short-circuit switch 360.

The circuit configurations of the first and second stages in FIG. 33 are similar to those illustrated in FIG. 31. Furthermore, the circuit configuration of the third stage of FIG. 33 is similar to a configuration in which the output-side short-circuit switch 360 is added to the third stage of FIG. 23. The output-side short-circuit switch 360 opens and closes a path between the source (vertical signal line 259) and the drain of the output transistor 320 in accordance with a control signal XPAC3. The waveform of the control signal XPAC3 is similar to that of the control signal XPAC1. Note that the output-side short-circuit switch 360 can be realized by any one of only the nMOS transistor, only the pMOS transistor, and both the nMOS transistor and the pMOS transistor.

Note that the comparison circuit 310 has three stages, but may have four or more stages. In this case, short-circuit switches can be provided in odd-numbered stages.

As described above, according to the third modification example of the seventh embodiment of the present technology, since the output-side short-circuit switch 360 short-circuits the source and the drain of the output transistor 317, the speed at which the comparison result CMP3 transitions to the potential (high level) of the source can be increased. Therefore, the responsiveness can be further improved.

Fourth Modification Example

In the above-described seventh embodiment, the comparison result CMP2 is input to the inverter 340. However, when the voltage range is narrow, there is a possibility that malfunction and a leakage current of the inverter 340 occurs. The solid-state imaging element 200 according to the fourth modification example of the seventh embodiment is different from that of the seventh embodiment in that a level-shift circuit for expanding the voltage range is added.

Figure 34:
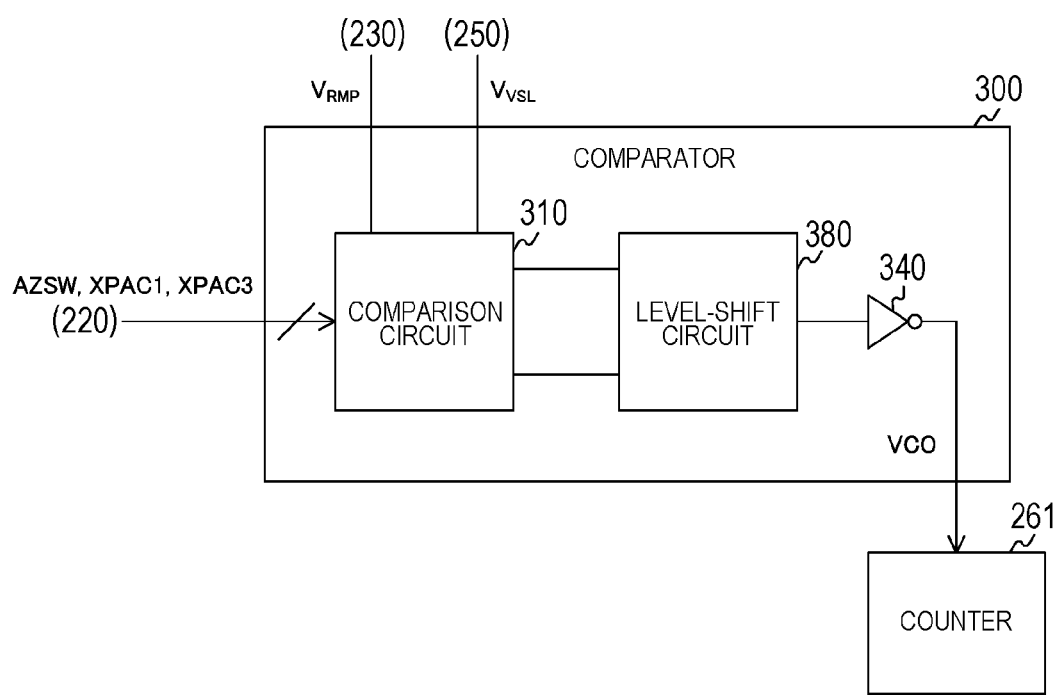
FIG. 34 is a block diagram illustrating a configuration example of a comparator according to the third modification example of the seventh embodiment of the present technology.

FIG. 34 is a block diagram illustrating a configuration example of the comparator 300 according to the fourth modification example of the seventh embodiment of the present technology. The comparator 300 according to the third modification example of the seventh embodiment includes a comparison circuit 310, a level-shift circuit 380, and an inverter 340. The configuration of the comparison circuit 310 is similar to that illustrated in FIG. 33. The circuit configuration of the level-shift circuit 380 is similar to that illustrated in FIG. 26.

Figure 35:
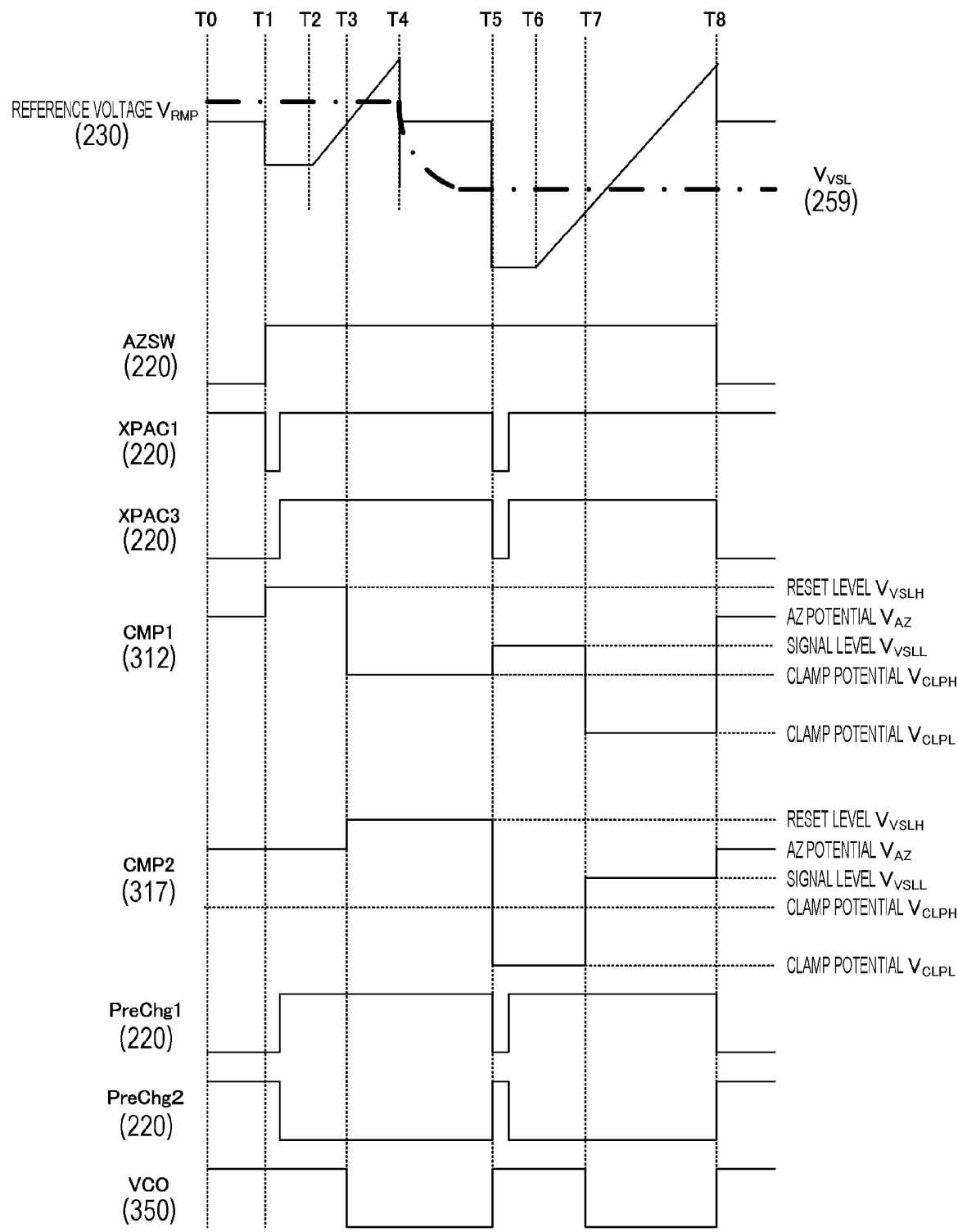
FIG. 35 is a timing chart illustrating an example of an operation of a solid-state imaging element according to the third modification example of the seventh embodiment of the present technology.

FIG. 35 is a timing chart illustrating an example of an operation of the solid-state imaging element 200 according to the fourth modification example of the seventh embodiment of the present technology.

The waveforms of the control signals AZSW and XPAC1 are similar to those illustrated in FIG. 29. The timing control unit 220 sets the control signal XPAC3 to the low level over a period until a timing at which the control signal XPAC1 immediately after timing T1 is at the high level. Accordingly, the output-side short-circuit switch 360 is closed.

The timing control unit 220 sets the control signal XPAC3 to the high level at a timing at which the control signal XPAC1 immediately after timing T1 is at the high level. Accordingly, the output-side short-circuit switch 360 is opened. Furthermore, at timing T5, the timing control unit 220 sets the control signal XPAC1 to the low level over a predetermined pulse period.

The waveform of the comparison result CMP1 of the first stage is similar to that illustrated in FIG. 29. The comparison result CMP2 of the second stage becomes the auto-zero potential $V_{AZ}$ over the period until timing T3. The waveform of the comparison result CMP2 after timing T3 is similar to that illustrated in FIG. 29.

The waveforms of the control signals PreChg1 and PreChg2 are similar to those illustrated in FIG. 27. The waveform of the output signal VCO is similar to that illustrated in FIG. 29.

As described above, according to the fourth modification example of the seventh embodiment of the present technology, since the level-shift circuit 380 outputs any one of a pair of potentials having a potential difference greater than the input potential $V_{VSL}$ and the clamp potential $V_{CLP}$, a voltage range on the input side of the inverter 340 can be expanded.

8. Eighth Embodiment

In the above-described third embodiment, the source and the drain of the output transistor 317 are short-circuited by the output-side short-circuit switch 360. However, in this configuration, there is a possibility that the input potential $V_{VSL}$ varies during settling. A configuration in which the clamp transistor 319 and the inverters 340 and 350 are removed from the circuit of the third embodiment illustrated in FIG. 21 is taken as a comparative example.

Figure 36:
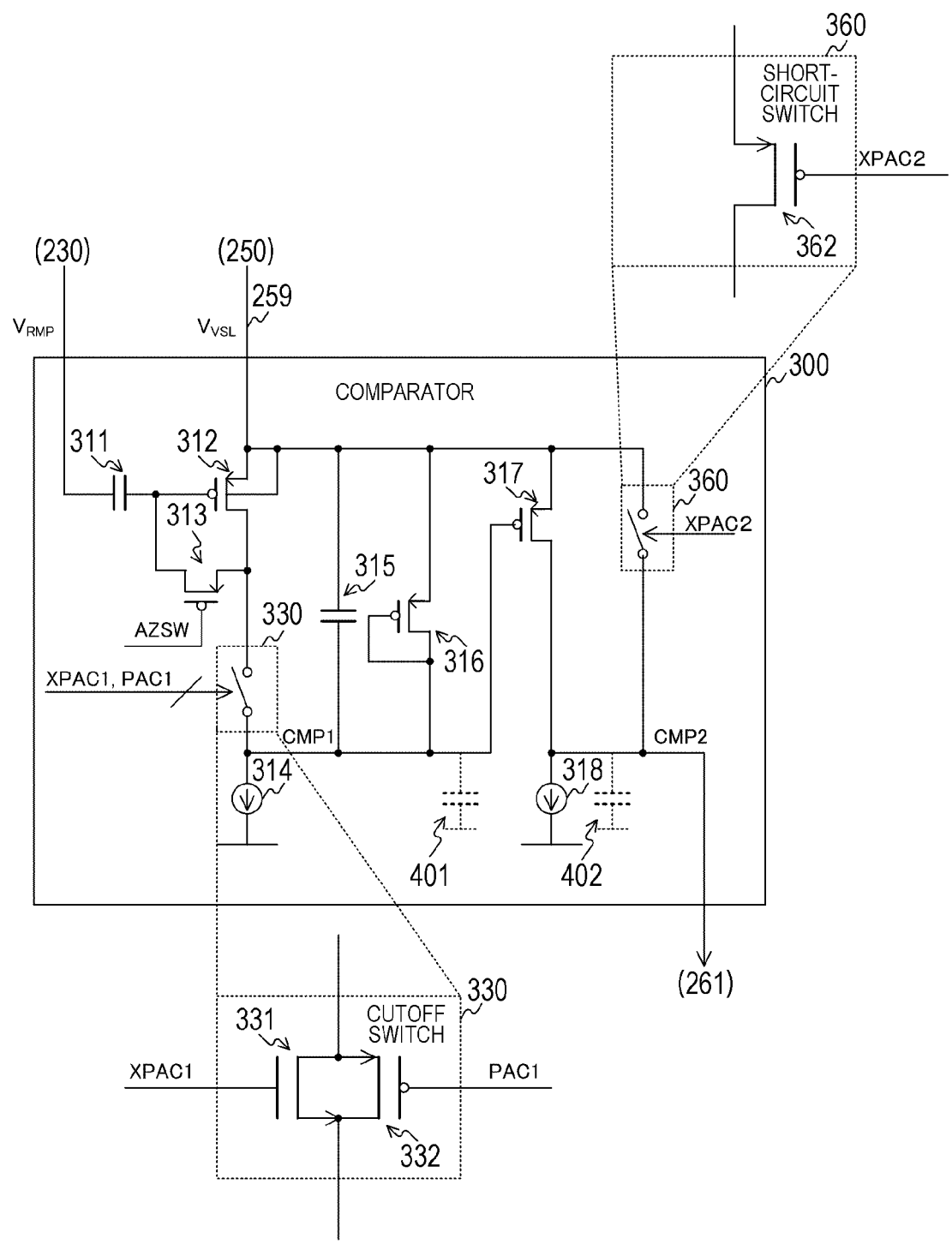
FIG. 36 is a circuit diagram illustrating a configuration example of a comparator according to a comparative example.

FIG. 36 is a circuit diagram illustrating a configuration example of a comparator 300 according to the comparative example. A parasitic capacitor of an output node of the comparison result CMP1 of the first stage is set to 402, and a parasitic capacitor of an output node of the comparison result CMP2 of the second stage is set to 403.

Figure 37:
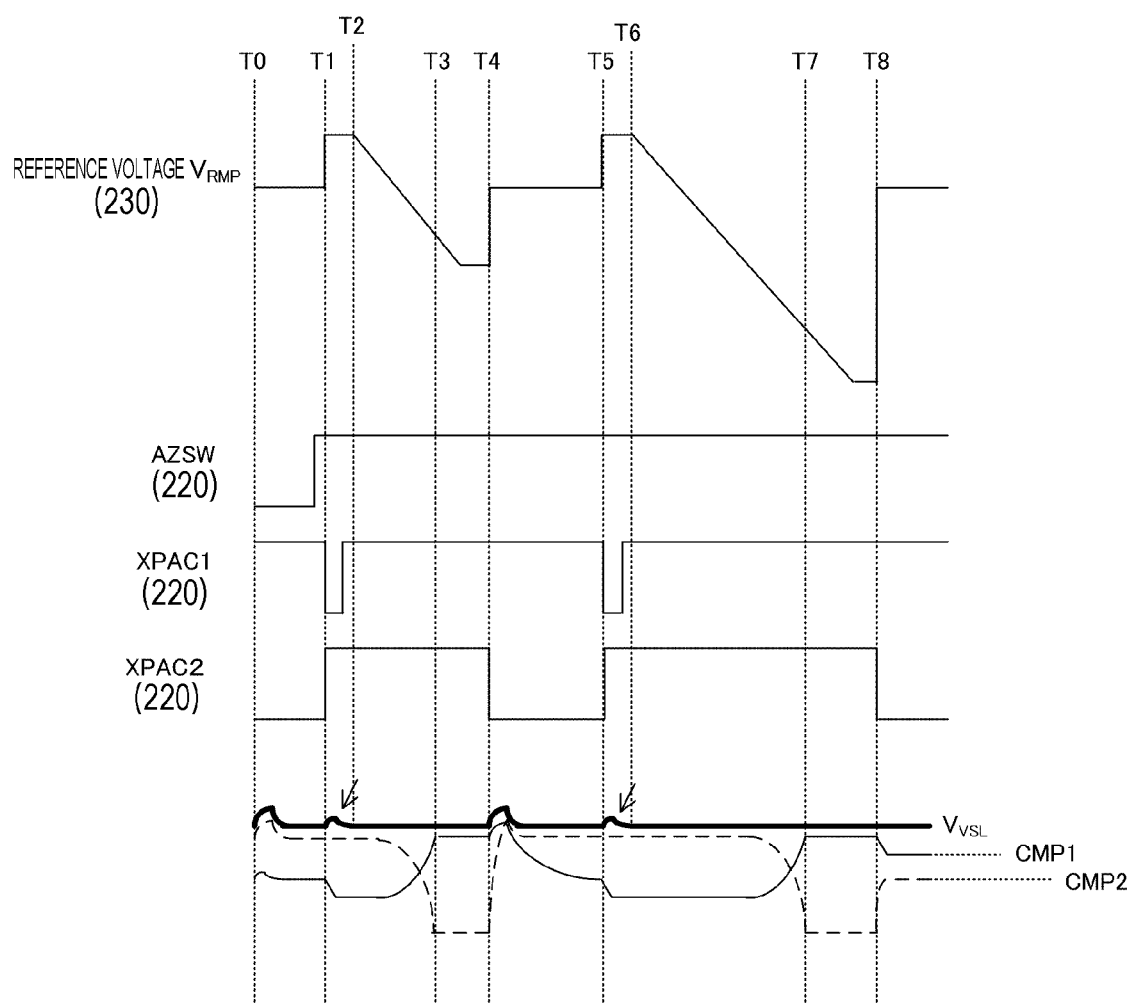
FIG. 37 is a timing chart illustrating an example of an operation of a solid-state imaging element according to the comparative example.

FIG. 37 is a timing chart illustrating an example of an operation of a solid-state imaging element 200 according to the comparative example. First, within the auto-zero period from timing T0 to timing T1, the DAC 230 sets the reference potential $V_{RMP}$ to a neutral auto-zero potential $V_{AZ}$. After that, the reference potential $V_{RMP}$ rises once at a POF edge at timing T1, and then enters a P-phase slope period in which the reference potential $V_{RMP}$ gradually decreases. The reason why the reference potential $V_{RMP}$ is raised once at the POF edge is to ensure that the inverted operation occurs in the slope portion by making the reverse direction. The count value is counted over a period until the output signal VCO when the pixel circuit 250 is reset is inverted within the P-phase slope period.

Thereafter, the input potential $V_{VSL}$ decreases according to a signal charge amount transferred by the transfer transistor 252, and after that, the reference potential $V_{RMP}$ rises once at timing T5 of the POF edge, and then enters a D-phase slope period in which the reference potential $V_{RMP}$ gradually decreases. The count value is counted over a period until the output signal VCO when the signal charge is transferred is inverted within the D-phase slope period. By subtracting the count value during the P-phase slope period from the count value during the D-phase slope period in the CDS processing, a net amount of signal charges is obtained as a digital value. Note that, in this drawing, the amount of signal charges is zero, and the input potential $V_{VSL}$ does not decrease.

In this circuit operation, when the reference potential $V_{RMP}$ increases at the POF edge or a DOF edge, the comparison result CMP1 of the first stage starts to decrease, and stops decreasing when the clamp transistor 316 transitions to the ON state. In order to advance falling of the comparison result CMP1 of the first stage, the timing control unit 220 sets the cutoff switch 330 to be in the OFF state (opened state) for a short period from timing T1 and timing T5 with the control signal XPAC1.

On the other hand, the output-side short-circuit switch 360 of the second stage is turned on when the reference potential $V_{RMP}$ is at a potential at the auto-zero time, and fixes the comparison result CMP2 of the second stage to the input potential $V_{VSL}$. This is because the circuit oscillates depending on conditions when an amplifier of the second stage is enabled in a neutral state.

In the circuit of this comparative example, there is a problem that a potential variation (kickback) occurs in the potential (input potential $V_{VSL}$) of the vertical signal line 259 with the POF edge and DOF edge as starting points. In order to shift to the slope period after the deviation of the input potential $V_{VSL}$ due to kickback is stabilized, it is necessary to lengthen the settling period (timing T1 to timing T2, and timing T5 to timing T6) immediately before the P-phase slope period and the D-phase slope period. This causes the AD conversion time to be increased, and causes a decrease in a frame rate and an increase in average power consumption. Furthermore, when the stabilization of the kickback is insufficient, the count value within the P-phase slope period or the D-phase slope period is deviated due to a settling error, but a certain degree or more of the settling error cannot be removed in the CDS processing due to a mismatch between the P phase and the D phase or between columns. As a result, image quality degradation such as offset or a vertical streak occurs.

The cause of the kickback is as follows. First, when the potential of the comparison result CMP1 of the first stage decreases due to the POF edge or the DOF edge, the parasitic capacitor (401 in FIG. 36) of the first stage is discharged. Since a part of the current drawn by the current source 314 of the first stage is used for the discharge, the current drawn from the vertical signal line 259 is reduced for a short period. At this time, a part of the electric charges continuing to flow from a pixel side loses a place to go and charges the parasitic capacitor of the vertical signal line 259, and thus the potential ($V_{VSL}$) of the vertical signal line 259 temporarily rises (that is, kickback occurs).

Figure 38:
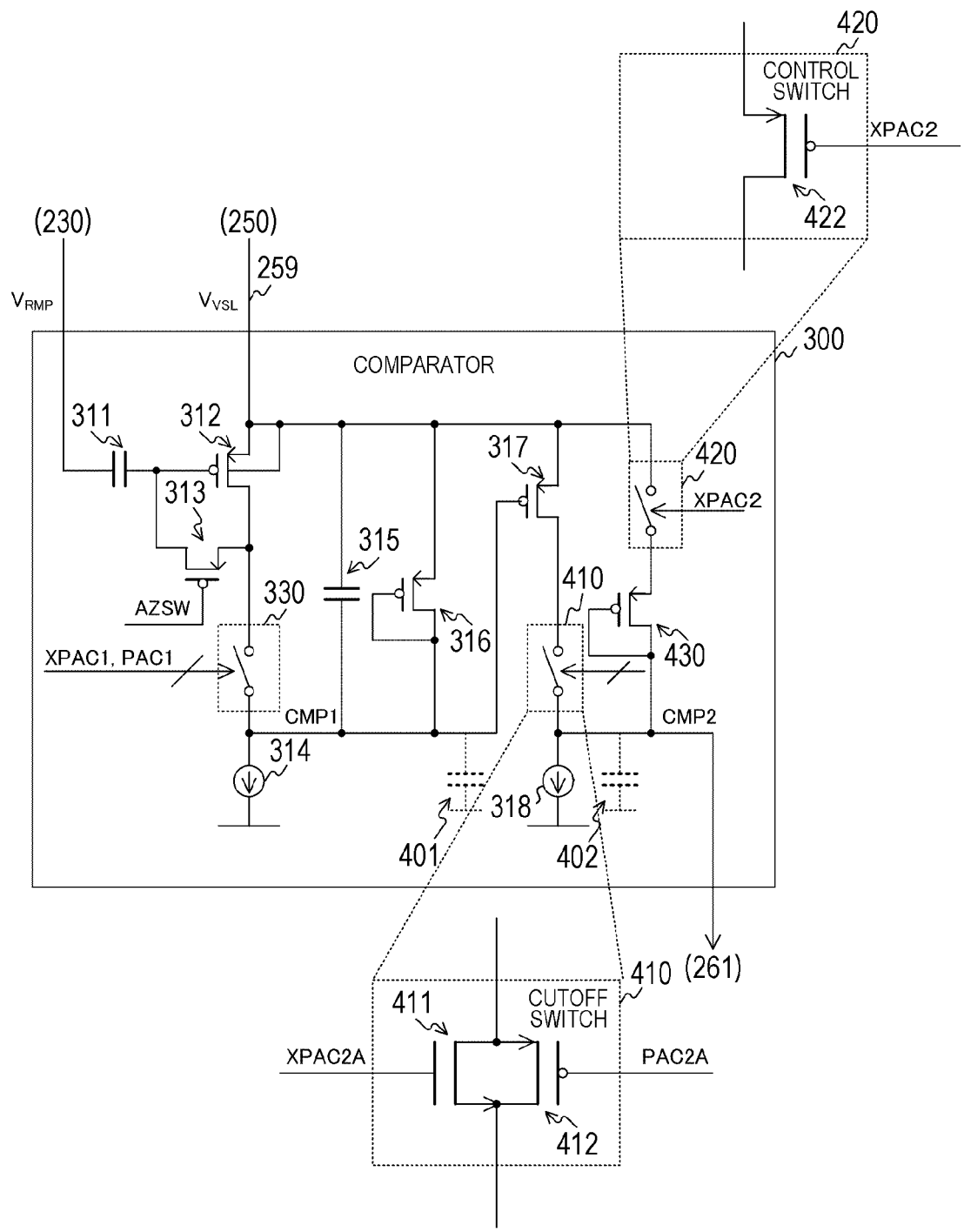
FIG. 38 is a circuit diagram illustrating a configuration example of a comparator according to an eighth embodiment of the present technology.

FIG. 38 is a circuit diagram illustrating a configuration example of a comparator 300 according to the eighth embodiment of the present technology. In order to suppress the kickback, in the eighth embodiment, a cutoff switch 410, a control switch 420, and a clamp transistor 430 are added.

The cutoff switch 410 is inserted between the output transistor 317 and the current source 318. The cutoff switch 410 transitions to either the opened state or the closed state in accordance with control signals XPAC2A and PAC2A from the timing control unit 220. The cutoff switch 410 includes, for example, an nMOS transistor 411 and a pMOS transistor 412 which are connected in parallel between the output transistor 317 and the current source 318. The control signal XPAC2A is input to a gate of the nMOS transistor 411, and the control signal PAC2A is input to a gate of the pMOS transistor 412. Note that the cutoff switch 410 may include only one of the nMOS transistor 411 and the pMOS transistor 412.

The clamp transistor 430 is P type, and has a gate and drain connected to the current source 318, a source connected to the control switch 420. The control switch 420 is inserted between the source of the output transistor 317 and the source of the clamp transistor 430. The control switch 420 transitions to either the opened state or the closed state in accordance with the control signal XPAC2. Furthermore, the control switch 420 includes, for example, a pMOS transistor 422. Note that the control switch 420 may include an nMOS transistor instead of the pMOS transistor 422, or may include both the nMOS transistor 422 and the pMOS transistor.

Note that the cutoff switch 330 is an example of a first cutoff switch described in the claims, and the cutoff switch 410 is an example of a second cutoff switch described in the claims. The current source 314 is an example of a first current source described in the claims, and the current source 318 is an example of a second current source described in the claims.

Figure 39:
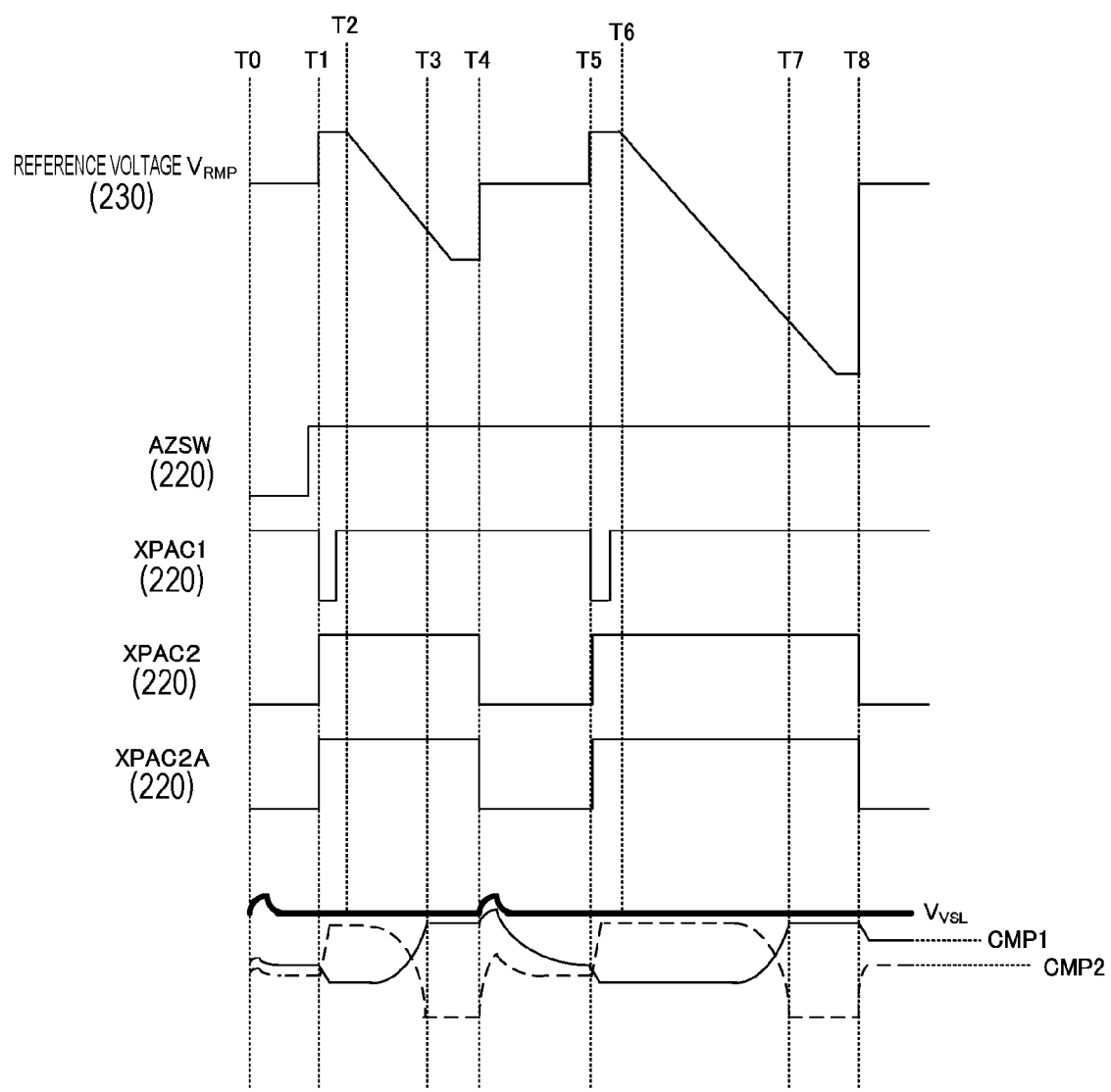
FIG. 39 is a timing chart illustrating an example of an operation of a solid-state imaging element according to the eighth embodiment of the present technology.

FIG. 39 is a timing chart illustrating an example of an operation of the solid-state imaging element 200 according to the eighth embodiment of the present technology. In order to suppress the kickback, in the eighth embodiment, the comparison result CMP2 of the second stage is lowered before the settling period of the reference potential $V_{RMP}$. Moreover, at the POF edge and the DOF edge, the comparison result CMP1 of the first stage decreases and the comparison result CMP2 of the second stage rises at the same time.

The cutoff switch 410 and the control switch 420 operate exclusively such that any one of the cutoff switch 410 and the control switch 420 is turned on. Before the settling period (such as timing T1 to timing T2), the control switch 420 is turned on, and thus the current of the current source 318 of the second stage flows to the clamp transistor 430 of the second stage. Then, the potential of the comparison result CMP2 of the second stage decreases from the input potential $V_{VSL}$ by the gate-source voltage of the clamp transistor 430. In the settling period and the slope period subsequent to the settling period, the cutoff switch 410 is turned on, and thus the current of the current source 318 of the second stage flows to the input side of the second stage, and the potential of the comparison result CMP2 of the second stage becomes an inverting amplifier output according to the comparison result CMP1 of the first stage. In the settling period, since the potential of the comparison result CMP1 of the first stage decreases, the comparison result CMP1 of the second stage increases.

Accordingly, the parasitic capacitor 401 of the first stage is discharged and a parasitic capacitor 402 of the second stage is charged at the same time at the POF edge and the DOF edge, and these charge and discharge currents cancel each other. Therefore, a change in the current drawn from the vertical signal line 259 is suppressed. As a result, it is possible to suppress the occurrence of the kickback. At this time, since the potential when the potential of the comparison result CMP2 of the second stage is lowered can be adjusted by adjusting the size of the clamp transistor 430 of the second stage, it is possible to performs design such that the cancellation effect is maximized.

By suppressing the kickback, the settling period for a P-phase ramp signal and D-phase ramp signal can be shortened. As a result, the increase in the AD conversion time can be avoided, and the decrease in a frame rate and the increase in average power consumption can be suppressed.

Figure 40:
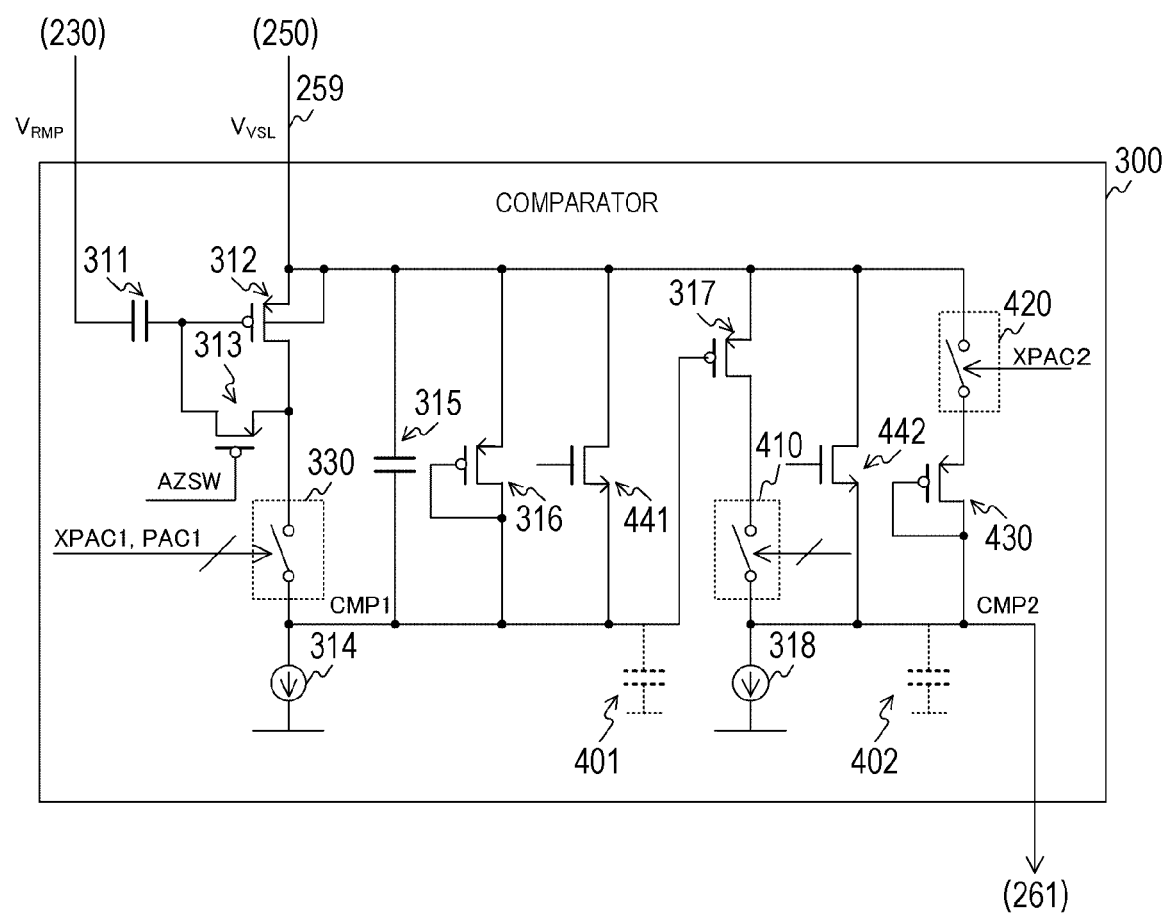
FIG. 40 is a circuit diagram illustrating a configuration example of a comparator to which an N-type clamp transistor is added according to the eighth embodiment of the present technology.

Note that, as illustrated in FIG. 40, N-type clamp transistors 441 and 442 can be further added. The clamp transistor 441 is connected in parallel with a P-type clamp transistor 316. The clamp transistor 442 is connected in parallel with the control switch 420 and the clamp transistor 430.

The clamp transistor 441 of the first stage is provided to prevent the drain potential of the current source 314 of the first stage from being excessively lowered and a current value from being changed when the input potential $V_{VSL}$ falls beyond a dynamic range due to excessive input. Similarly, the clamp transistor 442 of the second stage also has a role of protecting the current source 318 of the second stage, but the clamp transistor 442 is provided such that the potential of the clamp transistor decreases and the transistor of the current source 318 does not transitions to a linear region after the comparison result CMP2 of the second stage is inverted.

As described above, according to the eighth embodiment of the present technology, the kickback can be suppressed, since the cutoff switch 410, the control switch 420, and the clamp transistor 430 are added.

First Modification Example

In the above-described eighth embodiment, the output transistor 317 outputs the comparison result CMP2. However, when a voltage range is narrow, there is a possibility that malfunction and a leakage current of a logic gate of the post stage (inverter or the like) occurs. The solid-state imaging element 200 according to the first modification example of the eighth embodiment is different from that of the third embodiment in that a level-shift circuit for expanding the voltage range is added.

Figure 41:
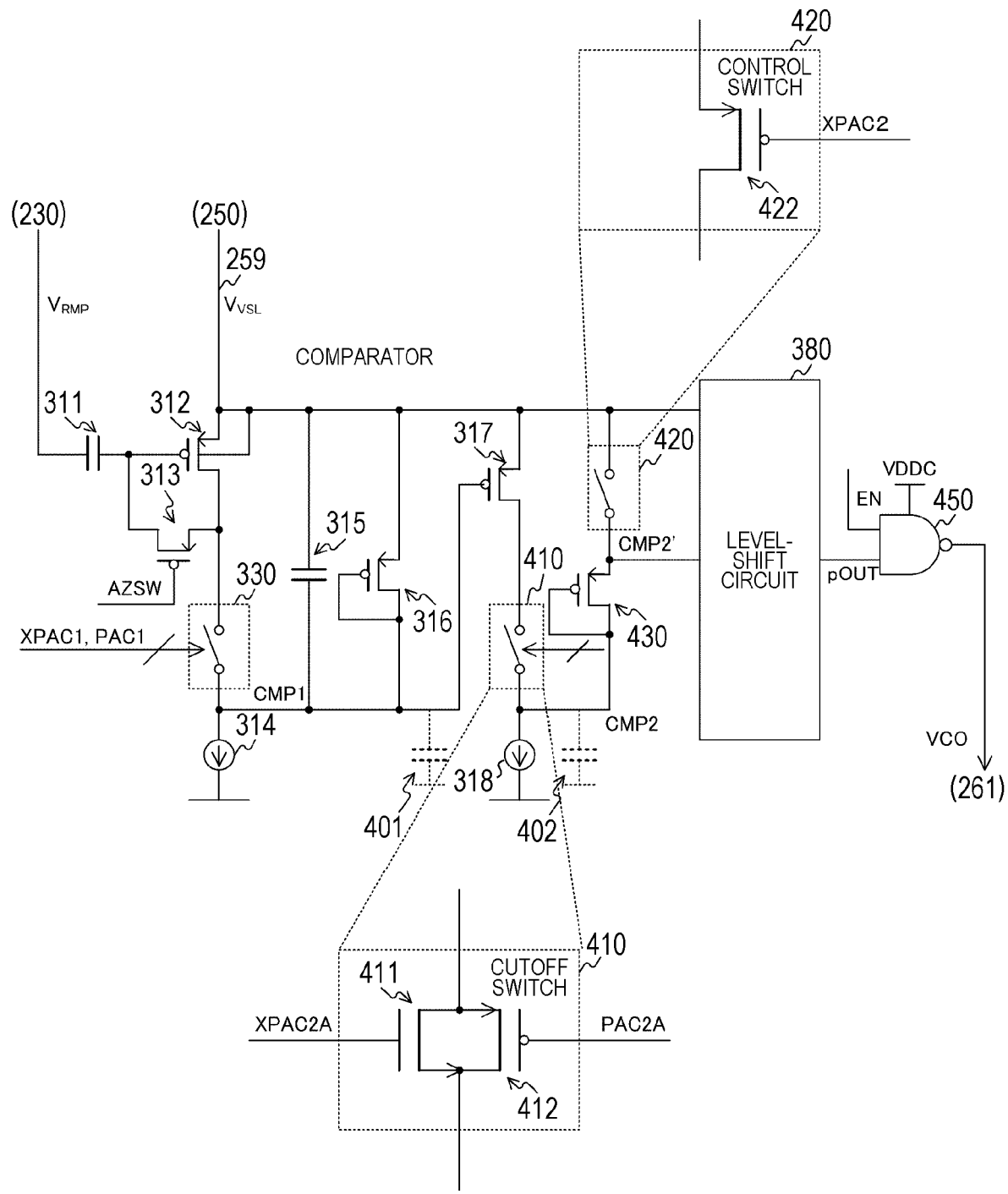
FIG. 41 is a circuit diagram illustrating a configuration example of a comparator according to a first modification example of the eighth embodiment of the present technology.

FIG. 41 is a circuit diagram illustrating a configuration example of the comparator 300 according to the first modification example of the eighth embodiment of the present technology. The comparator 300 of the first modification example of the eighth embodiment is different from that of the eighth embodiment in that a level-shift circuit 380 and a NAND gate 450 are further provided. The circuit configuration of the level-shift circuit 380 is similar to the circuit illustrated in FIG. 26. The NAND gate 450 outputs, as the output signal VCO, a NAND of the output signal pOUT and an enable signal EN of the level-shift circuit 380. Note that the NAND gate 450 is an example of the logic gate described in the claims.

However, in FIG. 41, a node connected to a source of the nMOS transistor 382 of the third stage is not a node of the comparison result CMP2 of the second stage but a connection node between the control switch 420 and the clamp transistor 430. The output of this connection node is CMP2'. The reason for this connection is that when the source is connected to the node of the comparison result CMP2, the potential of the comparison result CMP2 is lowered before the settling period of the ramp signal, and thus a potential difference between the gate and the source of the nMOS transistor 382 in FIG. 26 is expanded and the nMOS transistor 382 is turned on.

Since the settling period is a period in which the precharge transistor 381 of the third stage illustrated in FIG. 26 is turned on, a through-current flows in the third stage, which causes a malfunction. By connecting the connection node between the control switch 420 and the clamp transistor 430 to the source of the nMOS transistor 382, the nMOS transistor 382 of the third stage can be correctly turned off before the settling period.

Note that N-type clamp transistors 441 and 442 can be further added.

Figure 42:
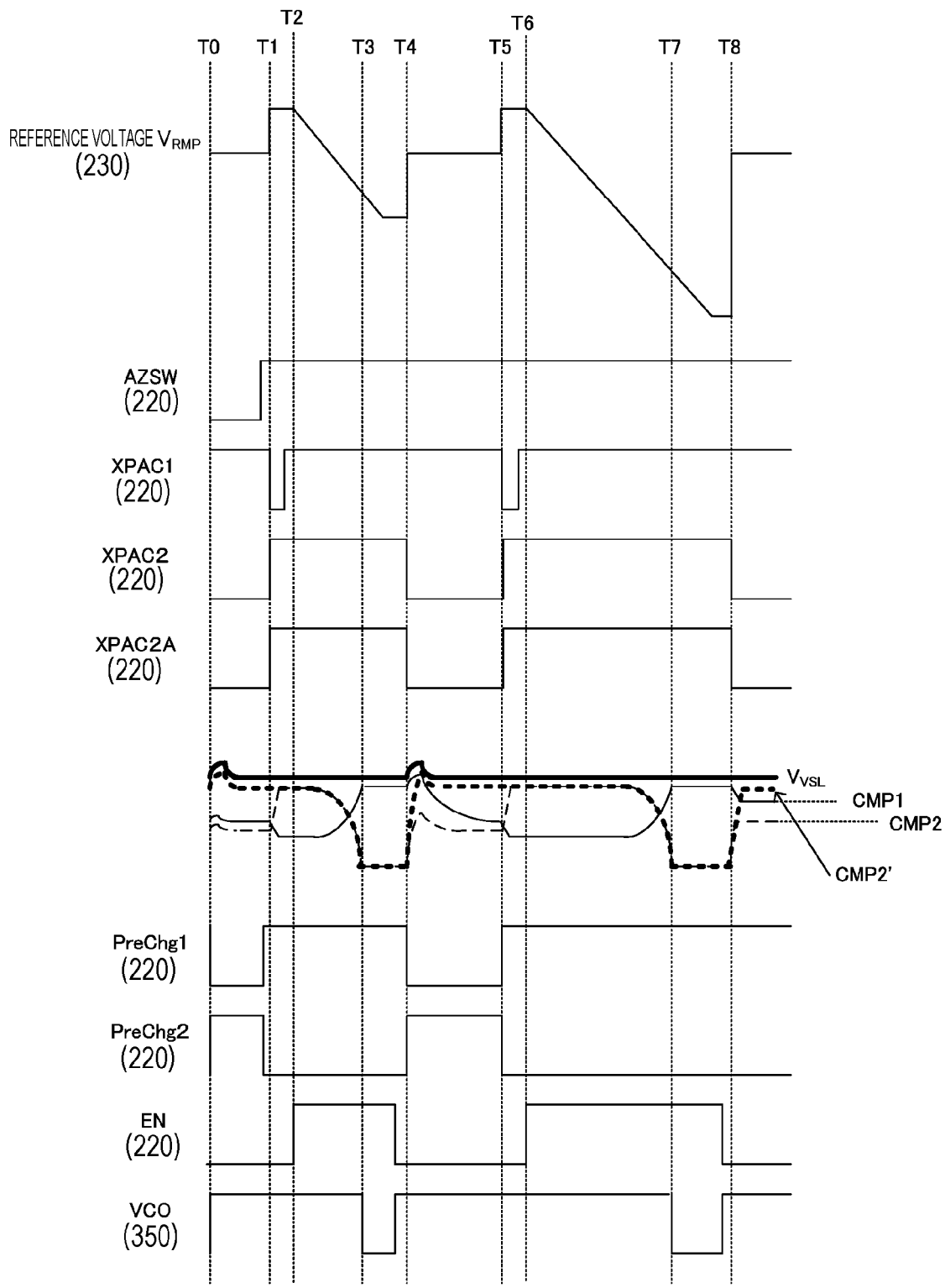
FIG. 42 is a timing chart illustrating an example of an operation of a solid-state imaging element according to the first modification example of the eighth embodiment of the present technology.

FIG. 42 is a timing chart illustrating an example of an operation of the solid-state imaging element according to the first modification example of the eighth embodiment of the present technology. A thick alternate long and short dash line in the drawing indicates a variation of the output CMP2' of the connection node between the control switch 420 and the clamp transistor 430. The enable signal EN is controlled to a low level (disable) until the end of the settling period (timing T2 or timing T6), and is controlled to a high level (enable) from the end of the settling period to the end of the slope period. As illustrated in the drawing, the kickback is suppressed.

As described above, according to the first modification example of the eighth embodiment of the present technology, since the level-shift circuit 380 outputs any one of a pair of potentials having a potential difference greater than the input potential $V_{VSL}$ and the clamp potential $V_{CLP}$, a voltage range on the input side can be expanded.

Second Modification Example

In the first modification example of the eighth embodiment described above, one input capacitor 311 is inserted between the DAC 230 and the gate of the input transistor 312, but with this configuration, noise may not be capable of being sufficiently attenuated. The comparator 300 according to the second modification example of the eighth embodiment is different from that of the first modification example of the eighth embodiment in that an input capacitor switching circuit 470 is added.

Figure 43:
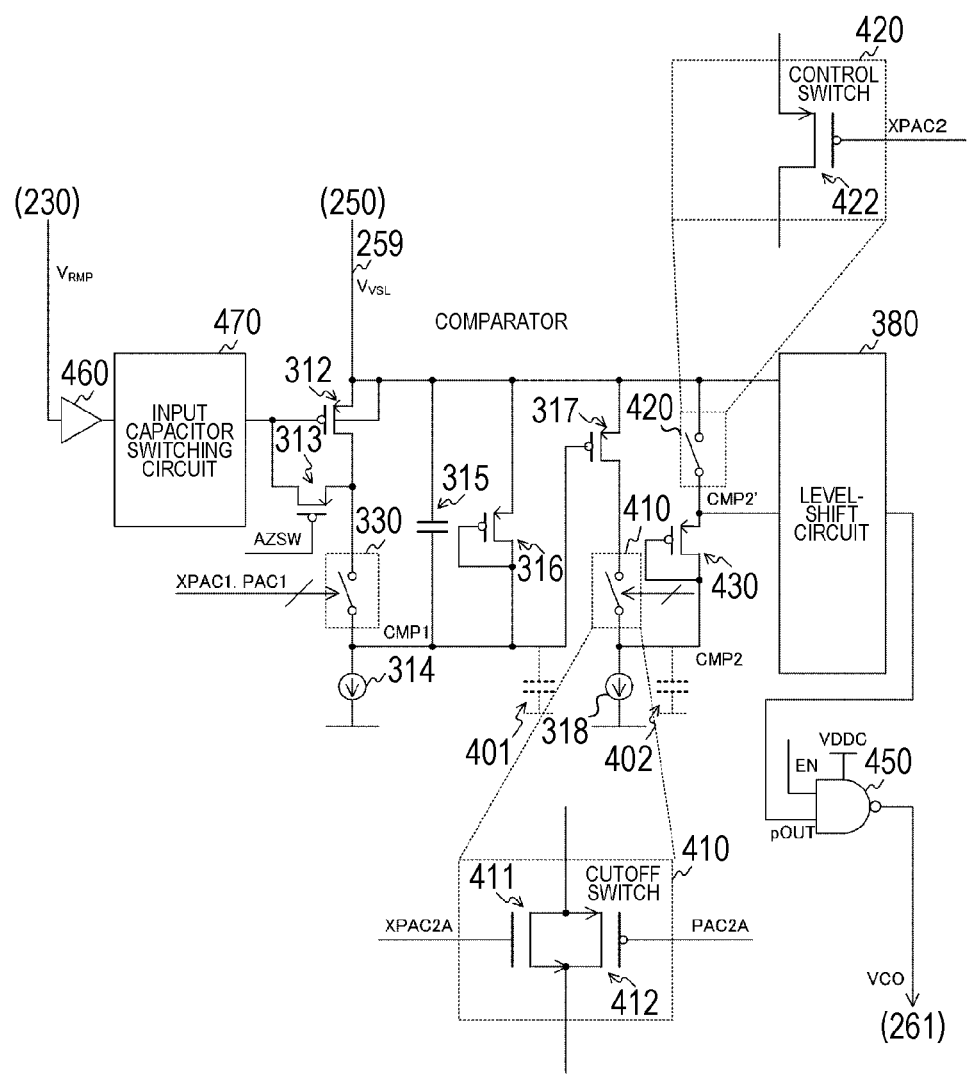
FIG. 43 is a circuit diagram illustrating a configuration example of a comparator according to a second modification example of the eighth embodiment of the present technology.

FIG. 43 is a circuit diagram illustrating a configuration example of the comparator 300 according to the second modification example of the eighth embodiment of the present technology. The comparator 300 according to the second modification example of the eighth embodiment is different from that of the first modification example of the eighth embodiment in that a buffer 460 and the input capacitor switching circuit 470 are further added. The buffer 460 is inserted between the DAC 230 and the input capacitor switching circuit 470.

Figure 44:
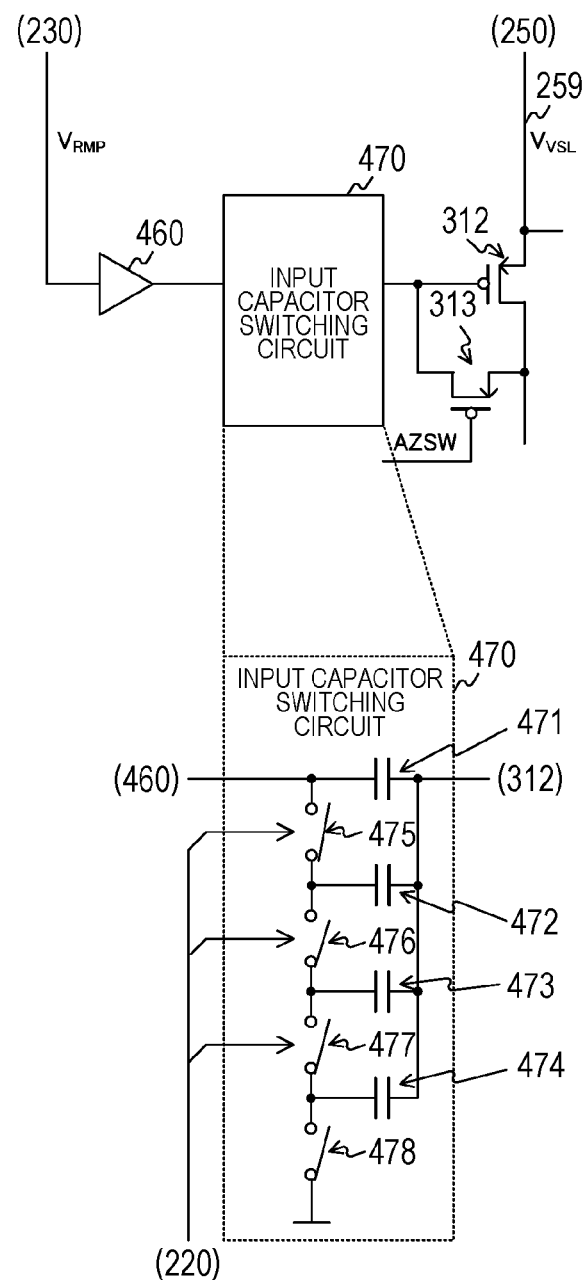
FIG. 44 is a circuit diagram illustrating a configuration example of an input capacitor switching circuit according to the second modification example of the eighth embodiment of the present technology.

FIG. 44 is a circuit diagram illustrating a configuration example of the input capacitor switching circuit 470 according to the second modification example of the eighth embodiment of the present technology. The input capacitor switching circuit 470 includes input capacitors 471 to 474 and switches 475 to 478.

One end of each of the input capacitors 471 to 474 is commonly connected to the gate of the input transistor 312. The other end of the input capacitor 471 is connected to an output terminal of the buffer 460. The switch 475 opens and closes a path between the other end of the input capacitor 471 and the other end of the input capacitor 474 under the control of the timing control unit 220. The switch 476 opens and closes a path between the other end of the input capacitor 472 and the other end of the input capacitor 473 under the control of the timing control unit 220. The switch 477 opens and closes a path between the other end of the input capacitor 473 and the other end of the input capacitor 474 under the control of the timing control unit 220. The switch 478 opens and closes a path between the other end of the input capacitor 474 and the ground potential under the control of the timing control unit 220.

By the circuit illustrated in the drawing, the input capacitor switching circuit 470 can switch the number of input capacitors connected in parallel to the gate of the input transistor 312 to any one of one to four. Accordingly, noise of the ramp signal in the buffer 460 and noise on the ramp signal common to the columns can be reduced. In this case, it is desirable to increase the slope of the ramp signal by the amount of attenuation caused by capacitance voltage division.

Note that the number of input capacitors is not limited to four. In a case where the number of input capacitors is M (M is an integer), M−1 switches are provided. Furthermore, the input capacitor switching circuit 470 can be added to the circuit of FIG. 38 in which the level-shift circuit 380 is not provided. Furthermore, N-type clamp transistors 441 and 442 can be further added.

As described above, according to the second modification example of the eighth embodiment of the present technology, since the input capacitor switching circuit 470 is added, noise can be further reduced.

9. Application Example to Mobile Body

The technology (present technology) according to the present disclosure can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, or a robot.

Figure 45:
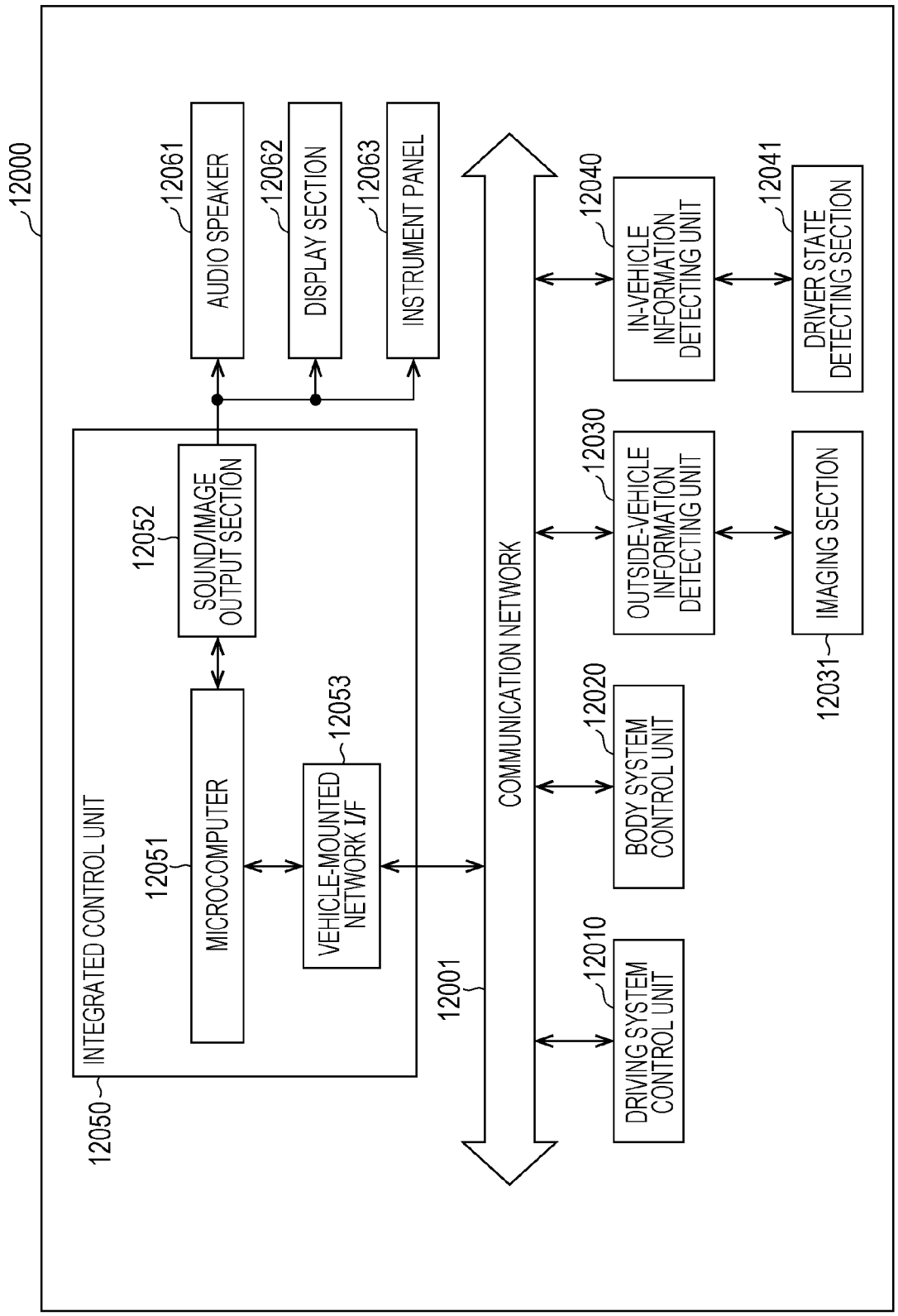
FIG. 45 is a block diagram illustrating a schematic configuration example of a vehicle control system.

FIG. 45 is a block diagram illustrating a schematic configuration example of a vehicle control system as an example of a mobile body control system to which the technology according to the present disclosure can be applied.

The vehicle control system 12000 includes a plurality of electronic control units connected to each other via a communication network 12001. In the example illustrated in FIG. 45, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information regarding the outside of the vehicle, the information obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 45, an audio speaker 12061, a display section 12062, and an instrument panel 12063 are illustrated as the output device. The display section 12062 may, for example, include at least one of an on-board display and a head-up display.

Figure 46:
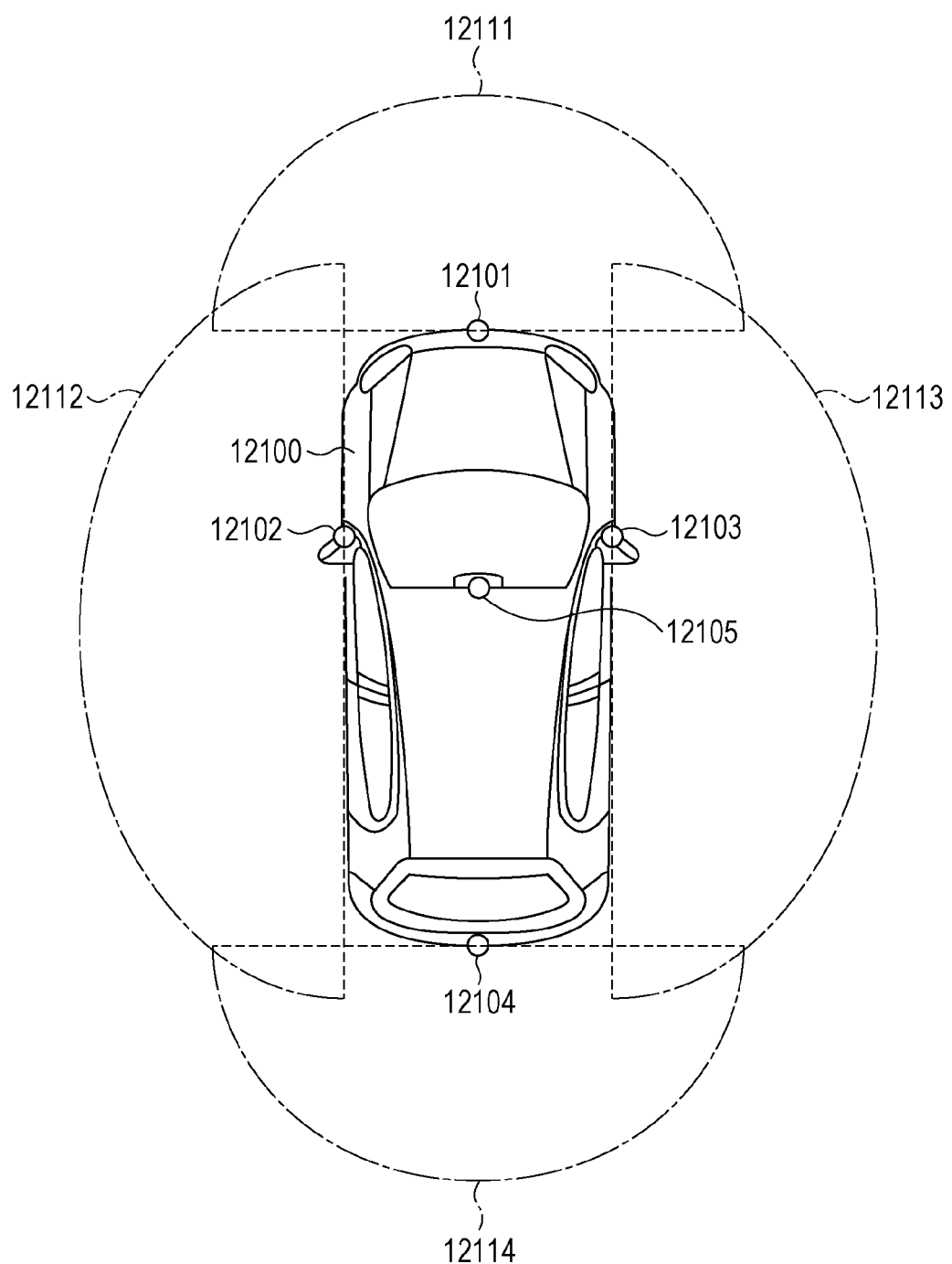
FIG. 46 is an explanatory diagram illustrating an example of an installation position of an imaging section.

FIG. 46 is a diagram illustrating an example of the installation position of the imaging section 12031.

In FIG. 46, as the imaging section 12031, imaging sections 12101, 12102, 12103, 12104, and 12105 are provided.

The imaging sections 12101, 12102, 12103, 12104, and 12105 are, for example, provided at positions on a front nose, sideview mirrors, a rear bumper, and a back door of the vehicle 12100 and at a position on an upper portion of a windshield inside the vehicle interior. The imaging section 12101 provided to the front nose and the imaging section 12105 provided to the upper portion of the windshield within the interior of the vehicle obtain mainly an image of the front of the vehicle 12100. The imaging sections 12102 and 12103 provided on the sideview mirrors mainly acquire images of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 46 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to, for example, the imaging section 12031 among the above-described configurations. Specifically, the imaging device 100 in FIG. 1 can be applied to the imaging section 12031. By applying the technology according to the present disclosure to the imaging section 12031, it is possible to improve the responsiveness of the comparator 300, increase the frame rate, and obtain a moving image which is more easily viewable. Therefore, driver's fatigue can be reduced.

Note that the above-described embodiments describe examples for embodying the present technology, and the matters in the embodiment and the matters specifying the invention in the claims have a correspondence relationship. Similarly, the matters specifying the invention in the claims and the matters in the embodiments of the present technology denoted by the same names as the matters specifying the invention have a correspondence relationship. However, the present technology is not limited to the embodiments, and can be embodied by making various modifications to the embodiments without departing from the gist thereof.

Note that the effects described in the present specification are merely examples and are not limited, and other effects may be provided.

Note that the present technology can also have the following configurations.

(1) A solid-state imaging element including:
an input transistor configured to output, from a drain, a potential within a range from one side to the other side of a pair of output potentials on the basis of whether or not an input potential input to a source and a predetermined reference potential input to a gate substantially coincide with each other;
a first current source configured to supply a constant current;
a capacitor that is inserted between the source of the input transistor and the first current source; and
a first cutoff switch configured to disconnect the drain of the input transistor from a connection node within a predetermined period for initializing the connection node between the capacitor and the first current source to a lower one of the pair of output potentials, and connect the connection node with the drain of the input transistor outside the predetermined period.

(2) The solid-state imaging element according to (1), in which the first cutoff switch includes an N-type transistor and a P-type transistor which are connected in parallel between the drain of the input transistor and the first current source.

(3) The solid-state imaging element according to (1), in which the first cutoff switch includes an N-type transistor.

(4) The solid-state imaging element according to (1), in which the first cutoff switch includes a P-type transistor.

(5) The solid-state imaging element according to any one of (1) to (4), further including:
a first output transistor configured to output, from a drain, a potential within a range from a predetermined potential lower than the input potential to the input potential on the basis of whether or not a difference between the input potential input to a source and a potential of the connection node input to a gate exceeds a predetermined threshold voltage; and an output-side short-circuit switch configured to short-circuit the source and the drain of the first output transistor within the predetermined period.

(6) The solid-state imaging element according to (5), further including an auto-zero transistor configured to connect the gate and the drain of the input transistor within an auto-zero period before the predetermined period,
in which the output-side short-circuit switch short-circuits the source and the drain of the first output transistor within the auto-zero period and the predetermined period.

(7) The solid-state imaging element according to (5), in which the output-side short-circuit switch includes an N-type transistor and a P-type transistor which are connected in parallel between the source and the drain of the first output transistor.

(8) The solid-state imaging element according to (5), in which the output-side short-circuit switch includes an N-type transistor.

(9) The solid-state imaging element according to any one of (5) to (8), further including
a second output transistor configured to output, from a drain, a voltage within a range from the predetermined potential to the input potential on the basis of whether or not a difference between the input potential input to a source and the drain of the first output transistor input to a gate exceeds a predetermined threshold voltage.

(10) The solid-state imaging element according to any one of (5) to (9), further including an input-side short-circuit switch configured to short-circuit the drain and the source of the input transistor within the predetermined period.

(11) The solid-state imaging element according to any one of (5) to (10), further including:
a level-shift circuit configured to output an output signal of a pair of shift potentials having a potential difference greater than the predetermined potential and the input potential on the basis of a potential of the drain of the first output transistor; and
a logic gate configured to determine whether or not the output signal is higher than a predetermined threshold between the pair of shift potentials and output a determination result.

(12) The solid-state imaging element according to (11), in which one of the pair of shift potentials is a power supply potential higher than the input potential, and the other of the pair of shift potentials is a reference potential lower than the predetermined potential, and
the level-shift circuit includes:
an N-type transistor having a gate connected to a vertical signal line of the input potential and a source connected to the drain of the first output transistor;
a power-supply-side precharge transistor configured to initialize a potential of the drain of the N-type transistor to the power supply potential;
a P-type transistor having a gate connected to the drain of the N-type transistor and a drain connected to the logic gate; and
a reference-side precharge transistor configured to initialize a potential of the drain of the P-type transistor to the reference potential.

(13) The solid-state imaging element according to (1), further including:
a first output transistor configured to output, from a drain, a potential within a range from a predetermined potential lower than the input potential to the input potential on the basis of whether or not a difference between the input potential input to a source and a potential of the connection node input to a gate exceeds a predetermined threshold voltage;
a second current source configured to supply a constant
a second cutoff switch configured to disconnect the drain of the first output transistor from the second current source before a start timing of settling of the reference potential and connect the drain of the first output transistor with the second current source over a certain period from the start timing;
a clamp transistor having a drain connected to the second current source; and
a control switch configured to connect the source of the first output transistor with a source of the clamp transistor before the start timing and disconnect the source of the first output transistor from the source of the clamp transistor over a certain period from the start timing.

(14) The solid-state imaging element according to (13), further including a level-shift circuit configured to output an output signal of a pair of shift potentials having a potential difference greater than the predetermined potential and the input potential on the basis of a potential of a connection node between the control switch and the clamp transistor.

(15) The solid-state imaging element according to (13) or (14), further including an input capacitor switching circuit configured to switch the number of input capacitors connected in parallel to the gate of the input transistor.

(16) A solid-state imaging element including:
an input transistor configured to output, from a drain, a drain potential corresponding to an input potential in a case where the input potential input to a source and a predetermined reference potential input to a gate substantially coincide with each other;
a first output transistor configured to output, from a drain, a potential within a range from a predetermined potential to the input potential on the basis of whether or not a difference between the input potential input to a source and the drain potential input to a gate exceeds a predetermined threshold voltage; and
an output-side short-circuit switch configured to short-circuit the source and the drain of the first output transistor within a predetermined period for initializing the drain of the first output transistor to the input potential.

(17) A solid-state imaging element including:
an input transistor configured to output a predetermined clamp potential from a drain in a case where an input potential input to a source and a predetermined reference potential input to a gate substantially coincide with each other; and
an input-side short-circuit switch configured to short-circuit the source and the drain of the input transistor within a predetermined period for initializing the potential of the drain to the input potential.

(18) An imaging device including:
an input transistor configured to output, from a drain, a potential within a range from one side to the other side of a pair of output potentials on the basis of whether or not an input potential input to a source and a predetermined reference potential input to a gate substantially coincide with each other;
a current source configured to supply a predetermined constant current;
a capacitor that is inserted between the source of the input transistor and the current source;

a cutoff switch configured to disconnect the drain of the input transistor from a connection node within a predetermined period for initializing the connection node between the capacitor and the current source to a lower one of the pair of output potentials, and connect the connection node with the drain of the input transistor outside the predetermined period; and
a counter configured to count a count value over a period until a potential of the connection node is inverted.

(19) A solid-state imaging element including:
a vertical signal line that is connected to a pixel;
a transistor including a source connected to the vertical signal line and a gate receiving a signal based on a predetermined reference potential;
a current source configured to supply a constant current;
a capacitor that is inserted between the source of the transistor and the current source; and
a switch that is connected to a connection node between the capacitor and the current source and a drain of the transistor.

(20) A solid-state imaging element including:
a vertical signal line that is connected to a pixel;
a first transistor including a source connected to the vertical signal line and a gate receiving a signal based on a predetermined reference potential;
a current source configured to supply a constant current;
a second transistor including a source connected to the vertical signal line and a gate connected to the current source; and
a switch that is connected to the source and the drain of the second transistor.

REFERENCE SIGNS LIST

100 Imaging device
110 Optical unit
120 DSP circuit
130 Display unit
140 Operation unit
150 Bus
160 Frame memory
170 Storage unit
180 Power supply unit
200 Solid-state imaging element
201 Light-receiving chip
202 Circuit chip
210 Vertical scanning circuit
220 Timing control unit
230 DAC
240 Pixel array unit
250 Pixel circuit
251 Photoelectric conversion element
252 Transfer transistor
253 Reset transistor
254 Floating diffusion layer
255 Amplification transistor
256 Selection transistor
260 Column signal processing unit
261 Counter
262 Latch
270 Horizontal scanning circuit
300 Comparator
310 Comparison circuit
311, 471 to 474 Input capacitor
312 Input transistor
313 Auto-zero transistor
314, 318, 321 Current source 315 Band-limit capacitor
316, 319, 322, 430, 441, 442 Clamp transistor
317, 320 Output transistor
330, 410 Cutoff switch
331, 342, 352, 361, 371, 382, 411 nMOS transistor
332, 341, 351, 362, 372, 384, 412, 422 pMOS transistor
340, 350 Inverter
360 Output-side short-circuit switch
370 Input-side short-circuit switch
380 Level-shift circuit
381, 385 Precharge transistor
383, 386, 401, 402 Parasitic capacitor
420 Control switch
450 NAND gate
460 Buffer
470 Input capacitor switching circuit
475 to 478 Switch
12031 Imaging section

The invention claimed is:

1. A solid-state imaging element comprising:
an input transistor configured to output, from a drain, a potential within a range from one side to the other side of a pair of output potentials on a basis of whether or not an input potential input to a source and a predetermined reference potential input to a gate substantially coincide with each other;
a first current source configured to supply a constant current;
a capacitor that is inserted between the source of the input transistor and the first current source; and
a first cutoff switch configured to disconnect the drain of the input transistor from a connection node within a predetermined period for initializing the connection node between the capacitor and the first current source to a lower one of the pair of output potentials, and connect the connection node with the drain of the input transistor outside the predetermined period.

2. The solid-state imaging element according to claim 1, wherein the first cutoff switch includes an N-type transistor and a P-type transistor which are connected in parallel between the drain of the input transistor and the first current source.

3. The solid-state imaging element according to claim 1, wherein the first cutoff switch includes an N-type transistor.

4. The solid-state imaging element according to claim 1, wherein the first cutoff switch includes a P-type transistor.

5. The solid-state imaging element according to claim 1, further comprising:
a first output transistor configured to output, from a drain, a potential within a range from a predetermined potential lower than the input potential to the input potential on a basis of whether or not a difference between the input potential input to a source and a potential of the connection node input to a gate exceeds a predetermined threshold voltage; and
an output-side short-circuit switch configured to short-circuit the source and the drain of the first output transistor within the predetermined period.

6. The solid-state imaging element according to claim 5, further comprising an auto-zero transistor configured to connect the gate and the drain of the input transistor within an auto-zero period before the predetermined period,
wherein the output-side short-circuit switch short-circuits the source and the drain of the first output transistor within the auto-zero period and the predetermined period.

7. The solid-state imaging element according to claim 5, wherein the output-side short-circuit switch includes an N-type transistor and a P-type transistor which are connected in parallel between the source and the drain of the first output transistor.

8. The solid-state imaging element according to claim 5, wherein the output-side short-circuit switch includes an N-type transistor.

9. The solid-state imaging element according to claim 5, further comprising:
a second output transistor configured to output, from a drain, a voltage within a range from the predetermined potential to the input potential on a basis of whether or not a difference between the input potential input to a source and the drain of the first output transistor input to a gate exceeds a predetermined threshold voltage.

10. The solid-state imaging element according to claim 5, further comprising
an input-side short-circuit switch configured to short-circuit the drain and the source of the input transistor within the predetermined period.

11. The solid-state imaging element according to claim 5, further comprising:
a level-shift circuit configured to output an output signal of a pair of shift potentials having a potential difference greater than the predetermined potential and the input potential on a basis of a potential of the drain of the first output transistor; and
a logic gate configured to determine whether or not the output signal is higher than a predetermined threshold between the pair of shift potentials and output a determination result.

12. The solid-state imaging element according to claim 11, wherein one of the pair of shift potentials is a power supply potential higher than the input potential, and the other of the pair of shift potentials is a reference potential lower than the predetermined potential, and
the level-shift circuit includes:
an N-type transistor having a gate connected to a vertical signal line of the input potential and a source connected to the drain of the first output transistor;
a power-supply-side precharge transistor configured to initialize a potential of the drain of the N-type transistor to the power supply potential;
a P-type transistor having a gate connected to the drain of the N-type transistor and a drain connected to the logic gate; and
a reference-side precharge transistor configured to initialize a potential of the drain of the P-type transistor to the reference potential.

13. The solid-state imaging element according to claim 1, further comprising:
a first output transistor configured to output, from a drain, a potential within a range from a predetermined potential lower than the input potential to the input potential on a basis of whether or not a difference between the input potential input to a source and a potential of the connection node input to a gate exceeds a predetermined threshold voltage;
a second current source configured to supply a constant current;
a second cutoff switch configured to disconnect the drain of the first output transistor from the second current source before a start timing of settling of the predetermined reference potential and connect the drain of the first output transistor with the second current source over a certain period from the start timing;

a clamp transistor having a drain connected to the second current source; and a control switch configured to connect the source of the first output transistor with a source of the clamp transistor before the start timing and disconnect the source of the first output transistor from the source of the clamp transistor over a certain period from the start timing.

14. The solid-state imaging element according to claim 13, further comprising a level-shift circuit configured to output an output signal of a pair of shift potentials having a potential difference greater than the predetermined potential and the input potential on a basis of a potential of a connection node between the control switch and the clamp transistor.

15. The solid-state imaging element according to claim 13, further comprising an input capacitor switching circuit configured to switch a number of input capacitors connected in parallel to the gate of the input transistor.

16. An imaging device comprising:

an input transistor configured to output, from a drain, a potential within a range from one side to the other side of a pair of output potentials on a basis of whether or not an input potential input to a source and a predetermined reference potential input to a gate substantially coincide with each other;

a current source configured to supply a predetermined constant current;

a capacitor that is inserted between the source of the input transistor and the current source;

a cutoff switch configured to disconnect the drain of the input transistor from a connection node within a predetermined period for initializing the connection node between the capacitor and the current source to a lower one of the pair of output potentials, and connect the connection node with the drain of the input transistor outside the predetermined period; and a counter configured to count a count value over a period until a potential of the connection node is inverted.

* * * * *